US012701890B2

(12) United States Patent
Yamazaki et al.

(10) Patent No.: US 12,701,890 B2
(45) Date of Patent: Aug. 4, 2026

(54) DISPLAY DEVICE, DISPLAY MODULE, AND ELECTRONIC DEVICE

(71) Applicant: Semiconductor Energy Laboratory Co., Ltd., Atsugi (JP)

(72) Inventors: Shunpei Yamazaki, Setagaya (JP); Kenichi Okazaki, Atsugi (JP); Shingo Eguchi, Atsugi (JP); Ryota Hodo, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 417 days.

(21) Appl. No.: 18/276,074

(22) PCT Filed: Feb. 8, 2022

(86) PCT No.: PCT/IB2022/051089
§ 371 (c)(1),
(2) Date: Aug. 7, 2023

(87) PCT Pub. No.: WO2022/175781
PCT Pub. Date: Aug. 25, 2022

(65) Prior Publication Data
US 2024/0099068 A1 Mar. 21, 2024

(30) Foreign Application Priority Data

Feb. 19, 2021 (JP) ................................. 2021-025034

(51) Int. Cl.
*H10K 59/38* (2023.01)
*H10K 59/122* (2023.01)
*H10K 59/35* (2023.01)

(52) U.S. Cl.
CPC ........... *H10K 59/38* (2023.02); *H10K 59/122* (2023.02); *H10K 59/353* (2023.02)

(58) Field of Classification Search
CPC .... H10K 59/38; H10K 59/122; H10K 59/353; H10K 50/19
See application file for complete search history.

(56) References Cited

U.S. PATENT DOCUMENTS

| | | | |
|---|---|---|---|
| 5,953,985 A | 9/1999 | Kobayashi | |
| 6,120,338 A | 9/2000 | Hirano et al. | |

(Continued)

FOREIGN PATENT DOCUMENTS

| | | |
|---|---|---|
| CN | 001607876 A | 4/2005 |
| JP | 2000-036385 A | 2/2000 |

(Continued)

OTHER PUBLICATIONS

Kurauchi, JP,2007-103058, machine translation, 2007 (Year: 2007).*

(Continued)

*Primary Examiner* — Tracie Y Green
(74) *Attorney, Agent, or Firm* — Eric J. Robinson; Robinson Intellectual Property Law Office, P.C.

(57) ABSTRACT

A high-resolution display device is provided. The display device includes first and second light-emitting devices, first and second coloring layers, and first, second, and third insulators; the first coloring layer is positioned to overlap with the first light-emitting device; the second coloring layer is positioned to overlap with the second light-emitting device; the first light-emitting device and the second light-emitting device have a function of emitting white light; the first coloring layer and the second coloring layer have a function of transmitting visible light of different colors; the first light-emitting device includes a first conductive layer and a first light-emitting layer over the first conductive layer; the second light-emitting device includes a second conductive layer and a second light-emitting layer over the second conductive layer; the first insulator is in contact with at least part of a side surface of the first light-emitting device; the (Continued)

500 second insulator is in contact with at least part of a side surface of the second light-emitting device; the first insulator and the second insulator are positioned over the third insulator; and the third insulator is positioned to cover an end portion of the first conductive layer and an end portion of the second conductive layer.

11 Claims, 23 Drawing Sheets

(56)                    References Cited

U.S. PATENT DOCUMENTS

| | | | |
|---|---|---|---|
| 7,129,634 | B2 * | 10/2006 | Boroson .............. H10K 59/876 |
| | | | 313/506 |
| 7,173,373 | B2 | 2/2007 | Yamada et al. |
| 7,399,991 | B2 | 7/2008 | Seo et al. |
| 7,597,602 | B2 | 10/2009 | Yamada et al. |
| 7,663,149 | B2 | 2/2010 | Seo et al. |
| 8,633,475 | B2 | 1/2014 | Endo et al. |
| 8,791,881 | B2 | 7/2014 | Kanegae et al. |
| 9,337,244 | B2 | 5/2016 | Hatano et al. |
| 10,411,212 | B2 | 9/2019 | Kambe et al. |
| 2002/0072139 | A1 | 6/2002 | Kashiwabara |
| 2005/0077816 | A1 | 4/2005 | Yamada et al. |
| 2009/0236976 | A1 | 9/2009 | Lee |
| 2010/0309101 | A1 | 12/2010 | Kanegae et al. |
| 2011/0148290 | A1 | 6/2011 | Oota |
| 2012/0012820 | A1 | 1/2012 | Endo et al. |
| 2012/0193619 | A1 | 8/2012 | Taka et al. |
| 2012/0217516 | A1 | 8/2012 | Hatano et al. |
| 2012/0256204 | A1 | 10/2012 | Yoshizumi et al. |
| 2012/0273804 | A1 | 11/2012 | Hatano |
| 2012/0276484 | A1 | 11/2012 | Izumi et al. |
| 2013/0084531 | A1 | 4/2013 | Hamaguchi et al. |
| 2013/0084664 | A1 | 4/2013 | Yoshitoku et al. |
| 2013/0084666 | A1 | 4/2013 | Oshige |
| 2013/0280839 | A1 | 10/2013 | Sonoda et al. |
| 2013/0295705 | A1 | 11/2013 | Sonoda. et al. |
| 2014/0004640 | A1 | 1/2014 | Hamaguchi et al. |
| 2014/0004642 | A1 | 1/2014 | Otsuka et al. |
| 2014/0246663 | A1 | 9/2014 | Kambe et al. |
| 2015/0060826 | A1 | 3/2015 | Matsumoto. et al. |
| 2015/0069360 | A1 | 3/2015 | Sato |
| 2015/0076476 | A1 | 3/2015 | Odaka et al. |
| 2016/0172595 | A1 | 6/2016 | Malinowski et al. |
| 2016/0315133 | A1 | 10/2016 | Sato |
| 2017/0062528 | A1 * | 3/2017 | Aoyama ................ H10K 59/38 |
| 2017/0090246 | A1 * | 3/2017 | Seo ........................ H10K 50/17 |
| 2017/0141167 | A1 | 5/2017 | Naganuma |
| 2017/0213876 | A1 * | 7/2017 | Ohsawa ................. H10K 50/17 |
| 2017/0256754 | A1 | 9/2017 | Defranco et al. |
| 2018/0190908 | A1 | 7/2018 | Ke et al. |
| 2020/0203662 | A1 | 6/2020 | Mollard et al. |
| 2021/0202607 | A1 * | 7/2021 | Lee ........................ H10K 50/15 |

FOREIGN PATENT DOCUMENTS

| | | | |
|---|---|---|---|
| JP | 2002-324673 | A | 11/2002 |
| JP | 2003-059663 | A | 2/2003 |
| JP | 2005-093398 | A | 4/2005 |
| JP | 2007-103058 | A | 4/2007 |
| JP | 2008-098106 | A | 4/2008 |
| JP | 2008-147072 | A | 6/2008 |
| JP | 2008-251270 | A | 10/2008 |
| JP | 2010-033936 | A | 2/2010 |
| JP | 2012-049088 | A | 3/2012 |
| JP | 2012-190794 | A | 10/2012 |
| JP | 2014-120218 | A | 6/2014 |
| JP | 2014-135251 | A | 7/2014 |
| JP | 2014-232568 | A | 12/2014 |
| JP | 2015-115178 | A | 6/2015 |
| JP | 2016-197494 | A | 11/2016 |
| JP | 2019-179696 | A | 10/2019 |
| JP | 2020-160305 | A | 10/2020 |
| KR | 2005-0028803 | A | 3/2005 |
| KR | 2009-0100020 | A | 9/2009 |
| KR | 2014-0052969 | A | 5/2014 |
| KR | 2014-0085433 | A | 7/2014 |
| TW | 200524467 | | 7/2005 |
| TW | 201244204 | | 11/2012 |
| TW | 201330693 | | 7/2013 |
| WO | WO-2009/133680 | | 11/2009 |
| WO | WO-2011/046166 | | 4/2011 |
| WO | WO-2012/115016 | | 8/2012 |
| WO | WO-2013/051234 | | 4/2013 |

OTHER PUBLICATIONS

Zakhidov.A et al., "Orthogonal processing: A new strategy for organic electronics", Chem. Sci. (Chemical Science), Apr. 7, 2011, vol. 2, No. 6, pp. 1178-1182.

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterned by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

International Search Report (Application No. PCT/IB2022/051089), dated May 17, 2022.

Written Opinion (Application No. PCT/IB2022/051089), dated May 17, 2022.

* cited by examiner

500

500

FIG. 6A     FIG. 6B     FIG. 6C
110a 110b 110c 110d    110a 110b 110c 110d    110a 110b 110c 110d
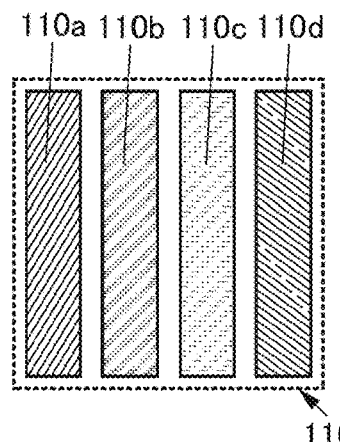 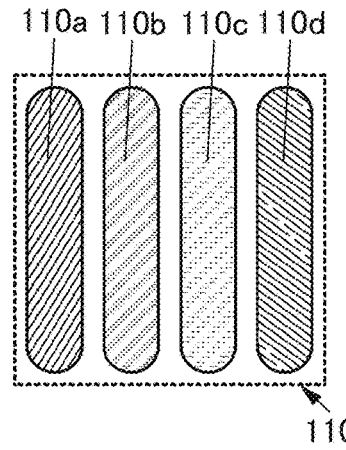 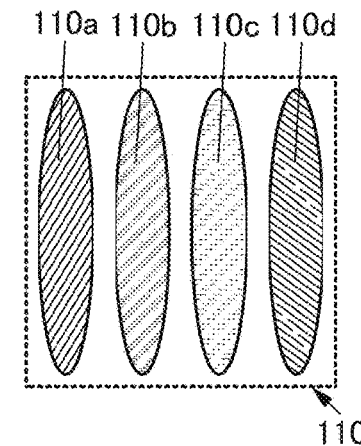
110       110       110
FIG. 6D     FIG. 6E     FIG. 6F
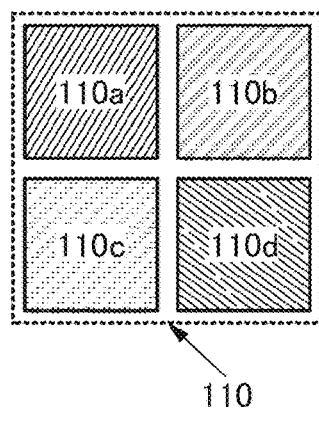 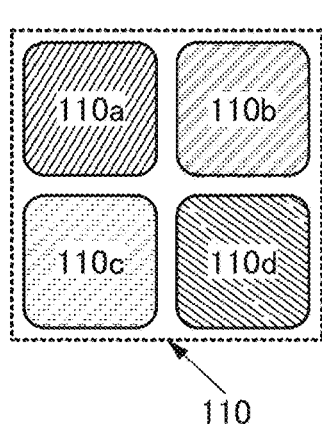 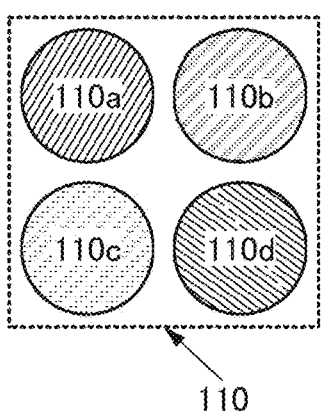
110       110       110
FIG. 6G
110a    110b    110c
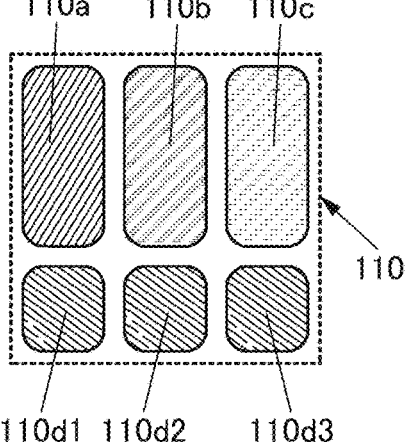
110
110d1   110d2   110d3

400B

FIG. 22A
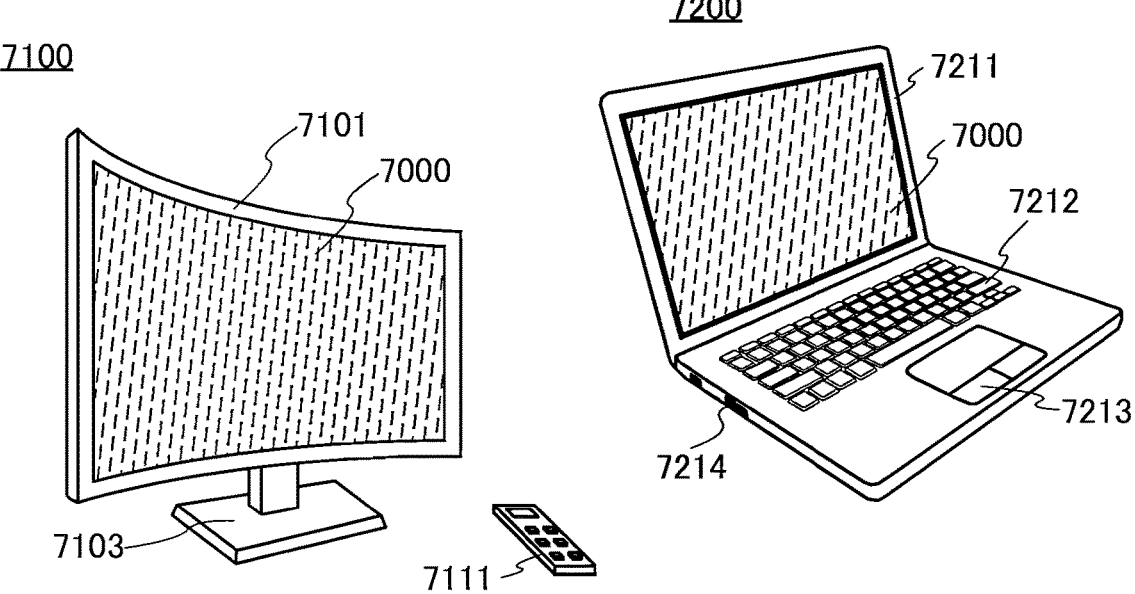
FIG. 22B
FIG. 22C
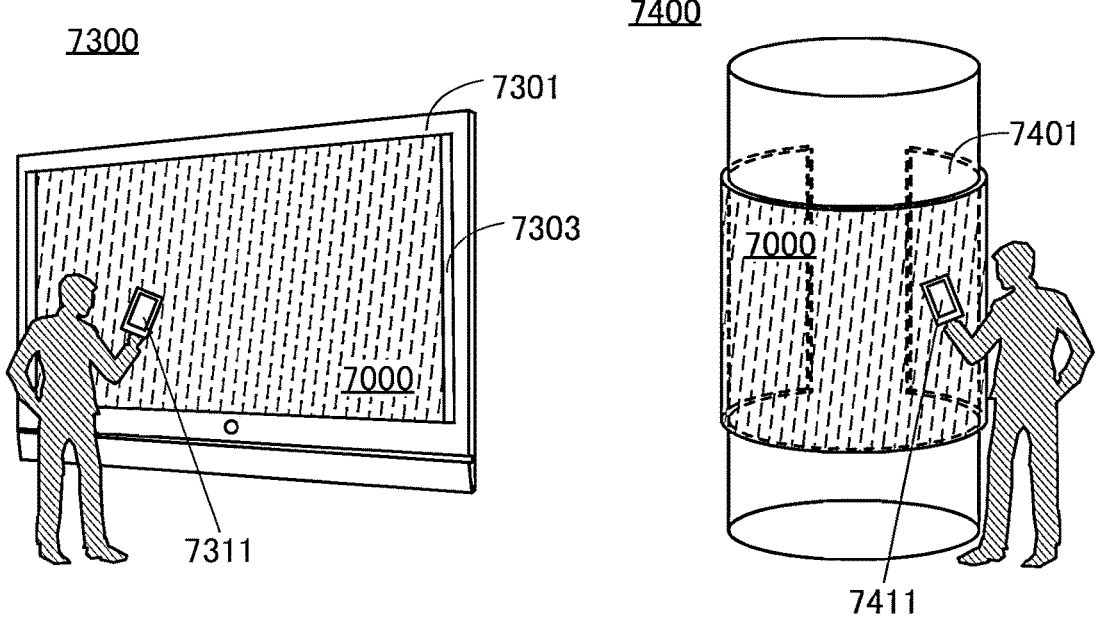
FIG. 22D

9101

9102

9200

9201

9201

9201

DISPLAY DEVICE, DISPLAY MODULE, AND ELECTRONIC DEVICE

TECHNICAL FIELD

One embodiment of the present invention relates to a display device, a display module, and an electronic device. One embodiment of the present invention relates to a method for manufacturing a display device.

Note that one embodiment of the present invention is not limited to the above technical field. Examples of the technical field of one embodiment of the present invention include a semiconductor device, a display device, a light-emitting apparatus, a power storage device, a memory device, an electronic device, a lighting device, an input device (e.g., a touch sensor), an input/output device (e.g., a touch panel), a driving method thereof, and a manufacturing method thereof.

BACKGROUND ART

In recent years, information terminal devices, for example, mobile phones such as smartphones, tablet information terminals, and laptop PCs (personal computers) have been widely used. As display panels provided in such devices, high-resolution display panels are required.

Examples of display devices that can be used for the display panels include, typically, a liquid crystal display device, a light-emitting apparatus including a light-emitting element such as an organic EL (Electro Luminescence) element or a light-emitting diode (LED), and electronic paper performing display by an electrophoretic method or the like.

For example, the basic structure of an organic EL element is a structure in which a layer containing a light-emitting organic compound is provided between a pair of electrodes. By applying voltage to this element, light emission can be obtained from the light-emitting organic compound. A display device using such an organic EL element does not need a backlight that is necessary for a liquid crystal display device and the like; thus, a thin, lightweight, high-contrast, and low-power display device can be achieved. Patent Document 1, for example, discloses an example of a display device using an organic EL element.

REFERENCE

Patent Document

[Patent Document 1] Japanese Published Patent Application No. 2002-324673

SUMMARY OF THE INVENTION

Problems to be Solved by the Invention

An object of one embodiment of the present invention is to provide a high-resolution display device. Another object of one embodiment of the present invention is to provide a high-definition display device. Another object of one embodiment of the present invention is to provide a display device with a high aperture ratio. Another object of one embodiment of the present invention is to provide a highly reliable display device. Another object of one embodiment of the present invention is to provide a method for manufacturing the above display device.

Note that the description of these objects does not preclude the existence of other objects. One embodiment of the present invention does not need to achieve all of these objects. Other objects can be derived from the description of the specification, the drawings, and the claims.

Means for Solving the Problems

One embodiment of the present invention is a display device including a first light-emitting device, a second light-emitting device, a first coloring layer, a second coloring layer, a first insulator, a second insulator, and a third insulator; the first coloring layer is positioned to overlap with the first light-emitting device; the second coloring layer is positioned to overlap with the second light-emitting device; the first light-emitting device and the second light-emitting device have a function of emitting white light; the first coloring layer and the second coloring layer have a function of transmitting visible light of different colors; the first light-emitting device includes a first conductive layer and a first light-emitting layer over the first conductive layer; the second light-emitting device includes a second conductive layer and a second light-emitting layer over the second conductive layer; the first insulator is in contact with at least part of a side surface of the first light-emitting device; the second insulator is in contact with at least part of a side surface of the second light-emitting device; the first insulator and the second insulator are positioned over the third insulator; and the third insulator is positioned to cover an end portion of the first conductive layer and an end portion of the second conductive layer.

In the above, the first light-emitting layer may contain the same material as the second light-emitting layer.

In the above, it is preferable that the first light-emitting device include a first light-emitting unit including the first light-emitting layer, a first charge-generation layer over the first light-emitting unit, and a second light-emitting unit over the first charge-generation layer; the second light-emitting unit include a third light-emitting layer; the second light-emitting device include a third light-emitting unit including the second light-emitting layer, a second charge-generation layer over the third light-emitting unit, and a fourth light-emitting unit over the second charge-generation layer; and the fourth light-emitting unit include a fourth light-emitting layer. Furthermore, in the above, the first light-emitting unit may contain the same material as the third light-emitting unit, the first charge-generation layer may contain the same material as the second charge-generation layer, and the second light-emitting unit may contain the same material as the fourth light-emitting unit.

In the above, it is preferable that the first light-emitting unit include a first hole-injection layer, a first hole-transport layer, and a first electron-transport layer; the second light-emitting unit include a second hole-transport layer and a second electron-transport layer; the third light-emitting unit include a second hole-injection layer, a third hole-transport layer, and a third electron-transport layer; the fourth light-emitting unit include a fourth hole-transport layer and a fourth electron-transport layer; the first insulator be in contact with a side surface of the first hole-injection layer, a side surface of the first hole-transport layer, a side surface of the first light-emitting layer, a side surface of the first electron-transport layer, a side surface of the first charge-generation layer, a side surface of the second hole-transport layer, a side surface of the third light-emitting layer, and a side surface of the second electron-transport layer; and the second insulator be in contact with a side surface of the second hole-injection layer, a side surface of the third hole-transport layer, a side surface of the second light-emitting layer, a side surface of the third electron-transport layer, a side surface of the second charge-generation layer, a side surface of the fourth hole-transport layer, the side surface of the second light-emitting layer, and a side surface of the fourth electron-transport layer.

In the above, it is preferable that the first insulator and the second insulator each include a first layer and a second layer over the first layer. In the first insulator, it is preferable that a side surface of the first layer be in contact with at least part of the side surface of the first light-emitting device, a bottom surface of the first layer be in contact with at least part of the third insulator, and a side surface and a bottom surface of the second layer be in contact with at least part of the first layer. In the second insulator, it is preferable that a side surface of the first layer be in contact with at least part of the side surface of the second light-emitting device, a bottom surface of the first layer be in contact with at least part of the third insulator, and a side surface and a bottom surface of the second layer be in contact with at least part of the first layer. Furthermore, in the above, it is preferable that the first layer contain aluminum oxide and the second layer contain silicon nitride.

In the above, it is preferable that the side surface of the first light-emitting layer and the side surface of the second light-emitting layer face each other, and a distance between the side surface of the first light-emitting layer and the side surface of the second light-emitting layer be less than or equal to 8 μm.

One embodiment of the present invention is a display module including the display device having any of the above-described structures and is, for example, a display module provided with a connector such as a flexible printed circuit (hereinafter referred to as an FPC) or a TCP (Tape Carrier Package), or a display module on which an integrated circuit (IC) is mounted by a COG (Chip On Glass) method, a COF (Chip On Film) method, or the like.

One embodiment of the present invention is an electronic device including the above-described display module and at least one of a housing, a battery, a camera, a speaker, and a microphone.

Effect of the Invention

With one embodiment of the present invention, a high-resolution display device can be provided. With one embodiment of the present invention, a high-definition display device can be provided. With one embodiment of the present invention, a display device with a high aperture ratio can be provided. With one embodiment of the present invention, a highly reliable display device can be provided. With one embodiment of the present invention, a method for manufacturing the above display device can be provided.

Note that the description of these effects does not preclude the existence of other effects. One embodiment of the present invention does not need to have all of these effects. Other effects can be derived from the description of the specification, the drawings, and the claims.

BRIEF DESCRIPTION OF THE DRAWINGS

FIG. 6A to FIG. 6G are top views illustrating examples of a pixel of a display device.

FIG. 22A to FIG. 22D are diagrams illustrating examples of electronic devices.

MODE FOR CARRYING OUT THE INVENTION

Figure 1A:
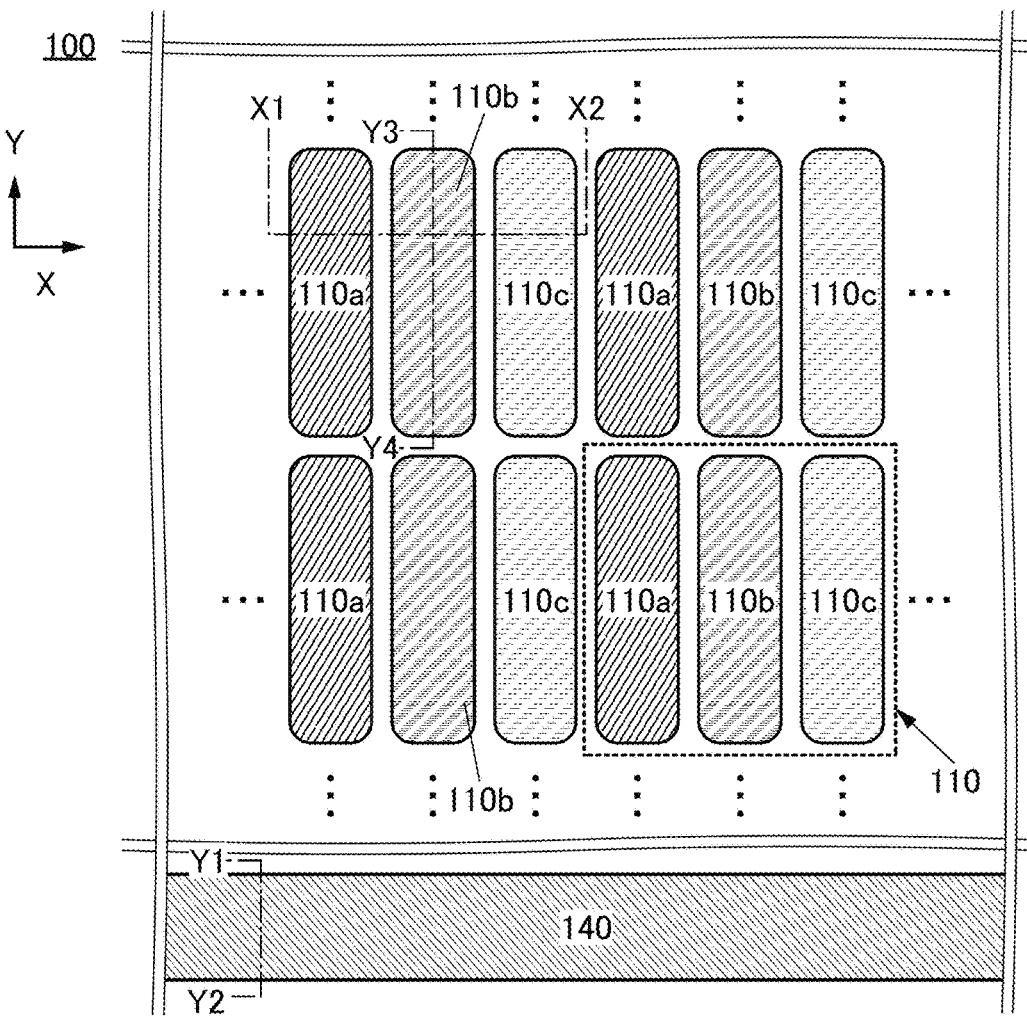
FIG. 1A is a top view illustrating an example of a display device.

Embodiments are described in detail with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

Note that in structures of the invention described below, the same portions or portions having similar functions are denoted by the same reference numerals in different drawings, and the description thereof is not repeated. Furthermore, the same hatch pattern is used for the portions having similar functions, and the portions are not especially denoted by reference numerals in some cases.

The position, size, range, or the like of each component illustrated in drawings does not represent the actual position, size, range, or the like in some cases for easy understanding.

Therefore, the disclosed invention is not necessarily limited to the position, size, range, or the like disclosed in the drawings.

Note that the term "film" and the term "layer" can be interchanged with each other depending on the case or circumstances. For example, the term "conductive layer" can be replaced with the term "conductive film". As another example, the term "insulating film" can be replaced with the term "insulating layer".

Embodiment 1

In this embodiment, a display device of one embodiment of the present invention and a manufacturing method thereof are described with reference to FIG. 1 to FIG. 13.

In the display device of one embodiment of the present invention, pixels are arranged in a matrix in a display portion, and an image can be displayed on the display portion. Each of the pixels includes light-emitting devices that emit white light and coloring layers that overlap with the light-emitting devices. Coloring layers that can transmit visible light of different colors are used for each pixel, whereby full-color display can be performed. Furthermore, light-emitting devices used in each pixel can be formed using the same materials; thus, the manufacturing process can be simplified and the manufacturing cost can be reduced.

As the light-emitting device, an EL device such as an OLED (Organic Light Emitting Diode) and a QLED (Quantum-dot Light Emitting Diode) is preferably used. Examples of a light-emitting substance contained in the EL device include a substance emitting fluorescence (a fluorescent material), a substance emitting phosphorescence (a phosphorescent material), an inorganic compound (e.g., a quantum dot material), and a substance exhibiting thermally activated delayed fluorescence (a thermally activated delayed fluorescence (TADF) material). In addition, an LED (Light Emitting Diode) such as a micro-LED can be used as the light-emitting device.

When each of the light-emitting devices of the pixels is formed using an organic EL device that emits white light, separate formation of light-emitting layers in the pixels is not necessary in each of the pixels. Thus, layers other than a pixel electrode included in the light-emitting device (e.g., a light-emitting layer) can be shared in each of the pixels. However, some layers included in the light-emitting device have relatively high conductivity; when a layer having high conductivity is shared in each of the pixels, leakage current might be generated between the pixels. Particularly when an increase in resolution or an aperture ratio of a display device reduces the distance between pixels, the leakage current might become too large to ignore and cause a decrease in display quality of the display device or the like. In view of the above, in the display device according to one embodiment of the present invention, at least part of the light-emitting device in each pixel is formed into an island shape to achieve higher resolution of the display device. Here, the island-shaped portion of the light-emitting device includes a light-emitting layer.

For example, an island-shaped light-emitting layer can be deposited by a vacuum evaporation method using a metal mask (also referred to as a shadow mask). However, this method causes a deviation from the designed shape and position of the island-shaped light-emitting layer due to various influences such as the low accuracy of the metal mask, the positional deviation between the metal mask and a substrate, a warp of the metal mask, and the vapor-scattering-induced expansion of outline of the deposited film; accordingly, it is difficult to achieve high resolution and a high aperture ratio of the display device.

In the manufacturing method of the display device of one embodiment of the present invention, an island-shaped pixel electrode (also referred to as a lower electrode) is formed, a layer including a light-emitting layer (also referred to as an EL layer or part of an EL layer) is formed over the entire surface, and then a sacrificial layer is formed over the EL layer. Next, a resist mask is formed over the sacrificial layer, and the EL layer and the sacrificial layer are processed using the resist mask, whereby an island-shaped EL layer is formed. Note that in this specification and the like, a sacrificial layer may be referred to as a mask layer.

As described above, in the manufacturing method of the display device of one embodiment of the present invention, the island-shaped EL layer is formed not by using a pattern of a metal mask but by processing an EL layer deposited over the entire surface. Accordingly, a high-resolution display device or a display device with a high aperture ratio, which has been difficult to achieve, can be achieved. Moreover, providing the sacrificial layer over the EL layer can reduce damage to the EL layer in the manufacturing process of the display device, resulting in an increase in the reliability of the light-emitting device.

It is difficult to set the distance between adjacent light-emitting devices to be less than 10 μm with a formation method using a metal mask, for example; however, with use of the above method, the distance can be decreased to be less than or equal to 8 μm, less than or equal to 6 μm, less than or equal to 4 μm, less than or equal to 3 μm, less than or equal to 2 μm, or less than or equal to 1 μm. Furthermore, with use of an exposure apparatus for LSI, for example, the distance can be decreased to be less than or equal to 500 nm, less than or equal to 200 nm, less than or equal to 100 nm, or less than or equal to 50 nm.

A pattern of the EL layer itself (also referred to as processing size) can be made much smaller than that in the case of using a metal mask. For example, in the case of using a metal mask for forming EL layers separately, a variation in the thickness occurs between the center and the edge of the EL layer. This causes a reduction in an effective area that can be used as a light-emitting region with respect to the area of the EL layer. By contrast, in the above manufacturing method, a pattern is formed by processing a film deposited to have a uniform thickness, which enables a uniform thickness in the pattern; thus, even with a fine pattern, almost the entire area can be used as a light-emitting region. Thus, a display device having both high resolution and a high aperture ratio can be manufactured.

Note that in the light-emitting device that emits white light, it is not necessary to form all layers included in the EL layer to have an island shape, and some of the layers can be deposited in the same step. In the manufacturing method of the display device of one embodiment of the present invention, some of the layers included in the EL layer are formed to have an island shape in each pixel, and then, the sacrificial layer is removed and the other layer(s) included in the EL layer (e.g., a carrier-injection layer) and a common electrode (also referred to as an upper electrode) can be formed to be shared.

Meanwhile, the carrier-injection layer is often a layer having relatively high conductivity in the light-emitting device. Thus, when the carrier-injection layer is in contact with a side surface of the island-shaped EL layer, the light-emitting device might be short-circuited. Note that also in the case where the carrier-injection layer is formed into an island shape and only the common electrode is formed to be shared by light-emitting devices, the light-emitting device might be short-circuited when the common electrode is in contact with the side surface of the island-shaped EL layer or a side surface of the pixel electrode.

In view of the above, the display device of one embodiment of the present invention has a structure in which a sidewall-shaped insulator is provided in contact with a side surface of an island-shaped EL layer and an embankment-shaped insulator is provided to cover an end portion of an island-shaped pixel electrode. Thus, the island-shaped EL layer can be inhibited from being in contact with the carrier-injection layer or the common electrode. Accordingly, a short circuit in the light-emitting device is inhibited, and the reliability of the light-emitting device can be enhanced.

[Structure Example of Light-Emitting Device]

Here, structure examples of light-emitting devices and coloring layers will be described with reference to FIG. 2 and FIG. 3.

Figure 2A:
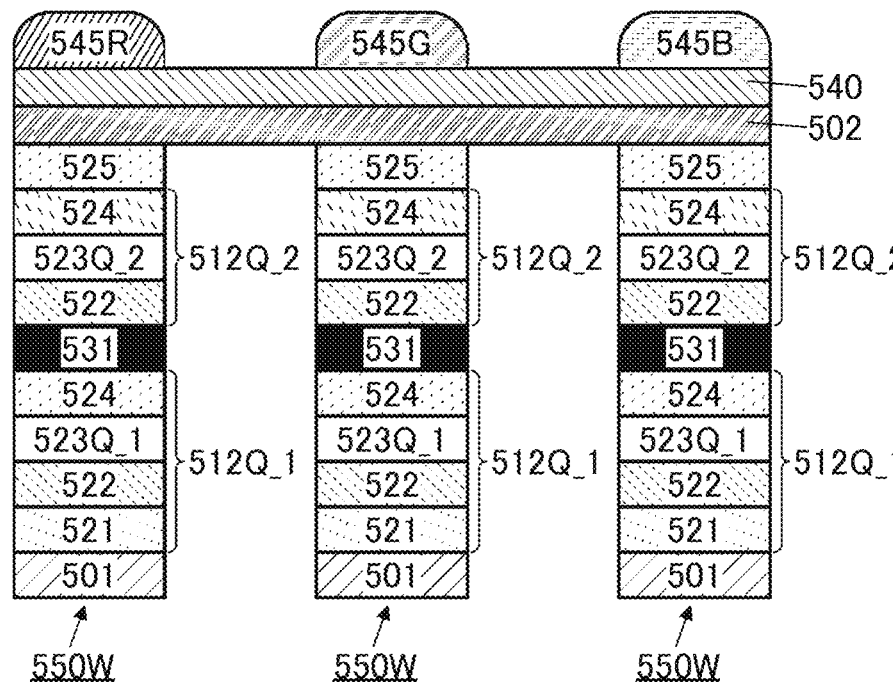
FIG. 2A and FIG. 2B are cross-sectional views illustrating examples of a display device.

FIG. 2A illustrates a schematic cross-sectional view of a display device 500. The display device 500 includes a plurality of light-emitting devices 550W that emit white light, and a coloring layer 545R that transmits red light, a coloring layer 545G that transmits green light, or a coloring layer 545B that transmits blue light is provided over each light-emitting device 550W. Here, the coloring layer 545R, the coloring layer 545G, and the coloring layer 545B are preferably provided over the light-emitting devices 550W with a protective layer 540 therebetween.

The light-emitting device 550W has a structure in which between a pair of electrodes (an electrode 501 and an electrode 502), two light-emitting units (a light-emitting unit 512Q_1 and a light-emitting unit 512Q_2) are stacked with an intermediate layer 531 therebetween.

The electrode 501 functions as a pixel electrode and is provided in every light-emitting device. The electrode 502 functions as a common electrode and is shared by a plurality of light-emitting devices.

The light-emitting unit 512Q_1 includes a layer 521, a layer 522, a light-emitting layer 523Q_1, a layer 524, and the like. The light-emitting unit 512Q_2 includes the layer 522, a light-emitting layer 523Q_2, the layer 524, and the like. The light-emitting device 550W includes a layer 525 or the like between the light-emitting unit 512Q_2 and the electrode 502. Note that the layer 525 can be regarded as part of the light-emitting unit 512Q_2.

The layer 521 includes, for example, a layer containing a substance with a high hole-injection property (a hole-injection layer). The layer 522 includes, for example, a layer containing a substance with a high hole-transport property (a hole-transport layer). The layer 524 includes, for example, a layer containing a substance with a high electron-transport property (an electron-transport layer). The layer 525 includes, for example, a layer containing a substance with a high electron-injection property (an electron-injection layer).

Alternatively, the layer 521 may include an electron-injection layer, the layer 522 may include an electron-transport layer, the layer 524 may include a hole-transport layer, and the layer 525 may include a hole-injection layer.

FIG. 2A clearly shows the layer 521 and the layer 522 separately; however, one embodiment of the present invention is not limited thereto. For example, the layer 522 may be omitted when the layer 521 has functions of both a hole-injection layer and a hole-transport layer or the layer 521 has functions of both an electron-injection layer and an electron-transport layer.

The intermediate layer 531 has a function of injecting electrons into one of the light-emitting unit 512Q_1 and the light-emitting unit 512Q_2 and injecting holes into the other when voltage is applied between the electrode 501 and electrode 502. The intermediate layer 531 can also be referred to as a charge-generation layer.

For example, a material that can be employed for the electron-injection layer, such as lithium fluoride, can be suitably used for the intermediate layer 531. As another example, a material that can be employed for the hole-injection layer can be suitably used for the intermediate layer. A layer containing a material with a high hole-transport property (a hole-transport material) and an acceptor material (an electron-accepting material) can be used for the intermediate layer. A layer containing a material with a high electron-transport property (an electron-transport material) and a donor material can be used for the intermediate layer. Forming an intermediate layer including such a layer can inhibit an increase in the driving voltage in the case of stacking light-emitting units.

When the emission color of the light-emitting layer 523Q_1 and the emission color of the light-emitting layer 523Q_2 included in the light-emitting device 550W have a relationship of complementary colors, the light-emitting device 550W can be a light-emitting device that emits white light. Each of the light-emitting layers 523Q_1 and 523Q_2 preferably contains a light-emitting substance that emits light of R (red), G (green), B (blue), Y (yellow), O (orange), or the like. Alternatively, the light-emitting layers 523Q_1 and 523Q_2 preferably contain a light-emitting substance that emits light containing two or more spectral components of R, G, and B.

Here, examples of a combination of emission colors of light-emitting layers included in the light-emitting units that can be used for the light-emitting device 550W are described.

For example, in the case where the light-emitting device 550W includes two light-emitting units, red light emission and green light emission are obtained from one of the light-emitting units and blue light emission is obtained from the other light-emitting unit, whereby the light device 550W that emits white light can be obtained. Alternatively, when yellow light emission or orange light emission is obtained from one of the light-emitting units and blue light emission is obtained from the other light-emitting unit, the light device 550W that emits white light can be obtained.

For another example, in the case where the light-emitting device 550W includes three light-emitting units, red light emission is obtained from any one of the light-emitting units, green light emission is obtained from another light-emitting unit, and blue light emission is obtained from the remaining one light-emitting unit, whereby the light device 550W that emits white light can be obtained. Alternatively, a light-emitting layer that emits blue light can be used for the first light-emitting unit, a light-emitting layer that emits yellow light, yellowish green light, or green light can be used for the second light-emitting unit, and a light-emitting layer that emits blue light can be used for the third light-emitting unit. Further alternatively, a light-emitting layer that emits blue light can be used for the first light-emitting unit, a stacked-layer structure of a light-emitting layer that emits red light and a light-emitting layer that emits yellow light, yellowish green light, or green light can be used for the second light-emitting unit, and a light-emitting layer that emits blue light can be used for the third light-emitting unit.

For another example, in the case where the light-emitting device 550W includes four light-emitting units, a light-emitting layer that emits blue light can be used for the first light-emitting unit, a light-emitting layer that emits red light can be used for one of the second light-emitting unit and the third light-emitting unit, a light-emitting layer that emits yellow light, yellowish green light, or green light can be used for the other of the second light-emitting unit and the third light-emitting unit, and a light-emitting layer that emits blue light can be used for the fourth light-emitting unit.

The coloring layer 545R, the coloring layer 545G, or the coloring layer 545B are provided over the light-emitting device 550W capable of emitting white light, whereby the respective pixels emit red light, green light, and blue light so that full-color display can be performed. Note that although examples of providing the coloring layer 545R transmitting red light, the coloring layer 545G transmitting green light, and the coloring layer 545B transmitting blue light are described in FIG. 2 and the like, the present invention is not limited thereto. Visible light of colors transmitted by the coloring layers is visible light of at least two or more colors that are different from each another and appropriately selected from red, green, blue, cyan, magenta, or yellow, for example.

Thus, full-color display can be performed by providing coloring layers as appropriate even when the layer 521, the layer 522, the layer 524, the layer 525, the light-emitting layer 523Q_1 and the light-emitting layer 523Q_2 are formed to have the same structure (material, thickness, and the like) in the pixels of respective colors. Consequently, in the display device of one embodiment of the present invention, the light-emitting device does not need to be formed separately in each pixel; hence, the manufacturing process can be simplified, and the manufacturing cost can be reduced. However, the present invention is not limited thereto, and any one or more of the 521, the layer 522, the layer 524, the layer 525, the light-emitting layer 523Q_1 and the light-emitting layer 523Q_2, may have a structure that differs among pixels.

A structure in which a plurality of light-emitting units are connected in series through the intermediate layer 531 as in the light-emitting device 550W is referred to as a tandem structure in this specification. Meanwhile, a structure in which one light-emitting unit is provided between a pair of electrodes is referred to as a single structure. Note that the term "tandem structure" is used in this specification and the like; however, without being limited to this, a tandem structure may be referred to as a stack structure, for example. Note that a tandem structure enables a light-emitting device capable of high-luminance light emission. Furthermore, a tandem structure, as compared to a single structure, allows the amount of current needed for obtaining the same luminance to be reduced; thus, the display device can have lower power consumption and higher reliability.

In FIG. 2A, the light-emitting unit 512Q_1, the intermediate layer 531, the light-emitting unit 512Q_2, and the layer 525 can each be formed as an island-shaped layer.

Figure 2B:
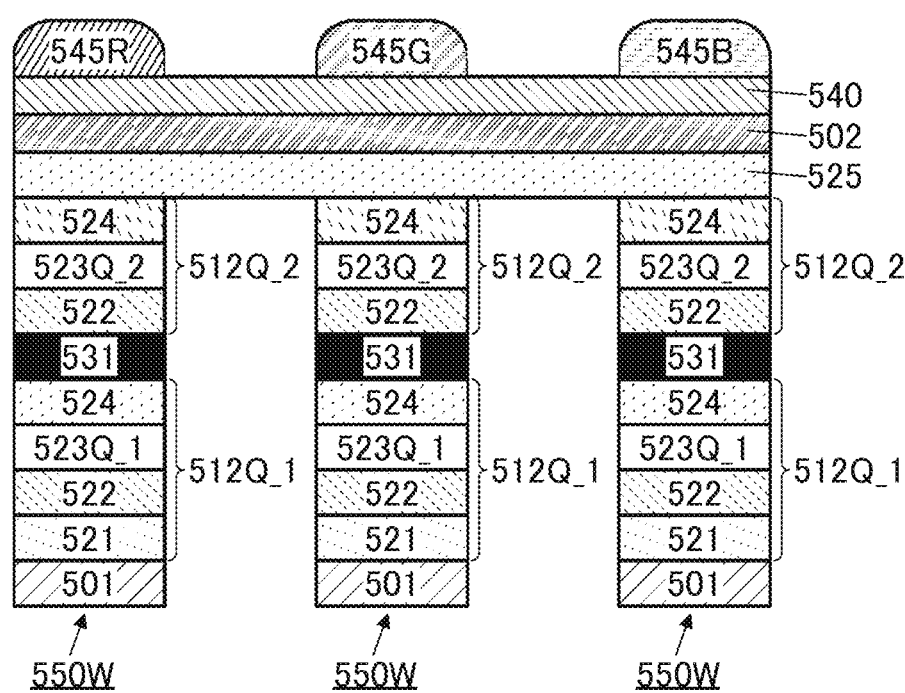

FIG. 2B is a modification example of the display device 500 illustrated in FIG. 2A. The display device 500 illustrated in FIG. 2B is an example of a case where the layer 525, like the electrode 502, is provided to be shared between light-emitting devices. In this case, the layer 525 can be referred to as a common layer. By providing one or more common layers for a plurality of light-emitting devices in this manner, the manufacturing process can be simplified, resulting in a reduction in the manufacturing cost. Note that there is no particular limitation on the common layer. For example, one or more kinds of layers of a hole-injection layer, a hole-transport layer, a light-emitting layer, an electron-transport layer, and an electron-injection layer can be the common layer. For example, a hole-injection layer and a hole-transport layer may be provided to be shared between the light-emitting devices.

Figure 3A:
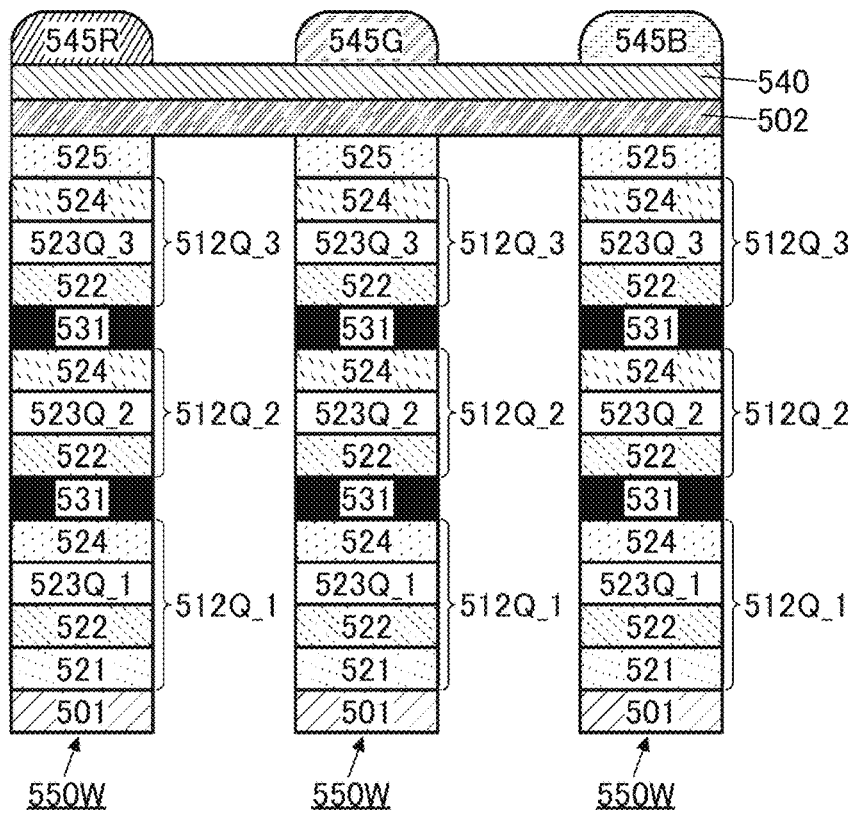
FIG. 3A and FIG. 3B are cross-sectional views illustrating examples of a display device.

The display device 500 illustrated in FIG. 3A is an example of a case where the light-emitting device 550W has a structure in which three light-emitting units are stacked. In the light-emitting device 550W in FIG. 3A, a light-emitting unit 512Q_3 is further stacked over the light-emitting unit 512Q_2 with another intermediate layer 531 therebetween. The light-emitting unit 512Q_3 includes the layer 522, a light-emitting layer 523Q_3, the layer 524, and the like.

When the light-emitting device has a tandem structure, the number of light-emitting units is not particularly limited and can be two or more.

Figure 3B:
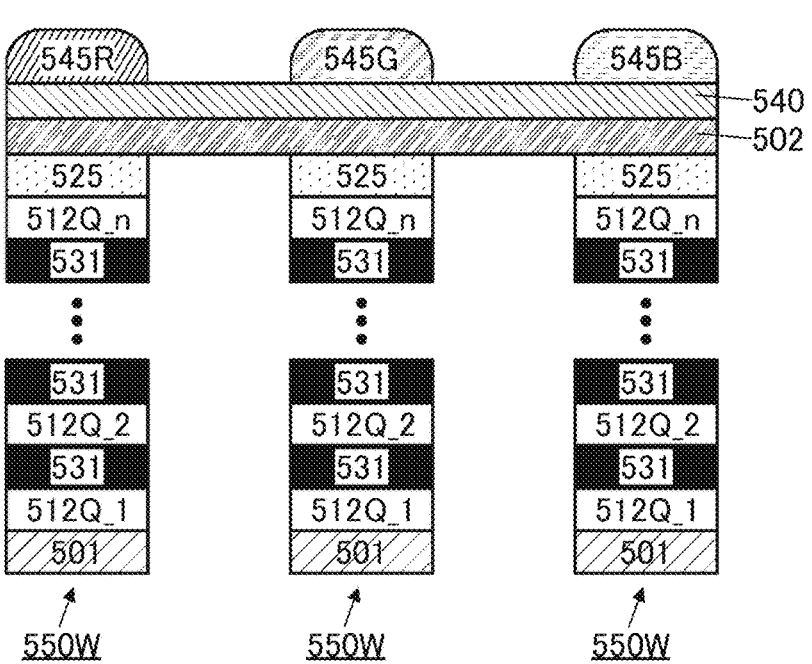

FIG. 3B illustrates an example of a case where n light-emitting units (n is an integer greater than or equal to 2) are stacked.

When the number of stacked light-emitting units is increased in this manner, luminance obtained from the light-emitting device with the same amount of current can be increased in accordance with the number of stacked layers. Moreover, increasing the number of stacked light-emitting units allows the amount of current needed for obtaining the same luminance to be reduced; thus, power consumption of the light-emitting device can be reduced in accordance with the number of stacked layers.

Note that there is no particular limitation on the light-emitting material of the light-emitting layer in the display device 500. For example, in the display device 500 illustrated in FIG. 2A, the light-emitting layer 523Q_1 included in the light-emitting unit 512Q_1 can contain a phosphorescent material, and the light-emitting layer 523Q_2 included in the light-emitting unit 512Q_2 can contain a fluorescent material. Alternatively, the light-emitting layer 523Q_1 included in the light-emitting unit 512Q_1 can contain a fluorescent material, and the light-emitting layer 523Q_2 included in the light-emitting unit 512Q_2 can contain a phosphorescent material.

Note that the structure of the light-emitting unit is not limited to the above. For example, in the display device 500 illustrated in FIG. 2A, the light-emitting layer 523Q_1 included in the light-emitting unit 512Q_1 may contain a TADF material, and the light-emitting layer 523Q_2 included in the light-emitting unit 512Q_2 may contain either a fluorescent material or a phosphorescent material. Using different light-emitting materials in this manner, e.g., using a combination of a highly reliable light-emitting material and a light-emitting material with high emission efficiency can compensate for their disadvantages and enables the display device to have both higher reliability and higher emission efficiency.

Note that in the display device of one embodiment of the present invention, all the light-emitting layers may contain a fluorescent material or all the light-emitting layers may contain a phosphorescent material.

[Structure Example of Display Device]

Next, the display device of one embodiment of the present invention will be described with reference to FIG. 1A and FIG. 1B.

The display device of one embodiment of the present invention can have any of the following structures: a top-emission structure in which light is emitted in a direction opposite to the substrate where the light-emitting device is formed, a bottom-emission structure in which light is emitted toward the substrate where the light-emitting device is formed, and a dual-emission structure in which light is emitted toward both surfaces.

FIG. 1A illustrates a top view (also referred to as a plan view) of a display device 100. The display device 100 includes a display portion in which a plurality of pixels 110 are arranged in a matrix, and a connection portion 140 outside the display portion. One pixel 110 is composed of three subpixels 110*a*, 110*b*, and 110*c*.

Note that there is no particular limitation on the arrangement of the subpixels, and a variety of methods can be employed. The arrangement of the subpixels may be a stripe arrangement, an S-stripe arrangement, a matrix arrangement, a delta arrangement, a Bayer arrangement, or a PenTile arrangement, for example. The pixel 110 illustrated in FIG. 1A employs a stripe arrangement.

Top surface shapes of the subpixels may be, for example, polygons such as triangles, quadrangles (including rectangles and squares), and pentagons; such polygons with rounded corners; ellipses; or circles. Here, the top surface shapes of the subpixels correspond to top surface shapes of light-emitting regions of the light-emitting devices.

Described in this embodiment is an example in which the subpixels 110*a*, 110*b*, and 110*c* each include a light-emitting device that emits white light and the subpixels emit light of different colors owing to coloring layers 125*a*, 125*b* and 125*c* (hereinafter, collectively referred to as a coloring layer 125 in some cases) provided over the respective subpixels 110*a*, 110*b*, and 110*c*. For example, the subpixels 110*a*, 110*b*, and 110*c* respectively correspond to the subpixel including the coloring layer 545R, the subpixel including the coloring layer 545G, and the subpixel including the coloring layer 545B illustrated in FIG. 2A and the like.

Although the top view (can also referred to as the plan view) of FIG. 1A illustrates an example in which the connection portion 140 is positioned on the lower side of the display portion, one embodiment of the present invention is not limited thereto. The connection portion 140 is provided in at least one of the upper side, the right side, the left side, and the lower side of the display portion in the top view, or may be provided so as to surround the four sides of the display portion. The number of the connection portions 140 can be one or more.

Figure 1B:
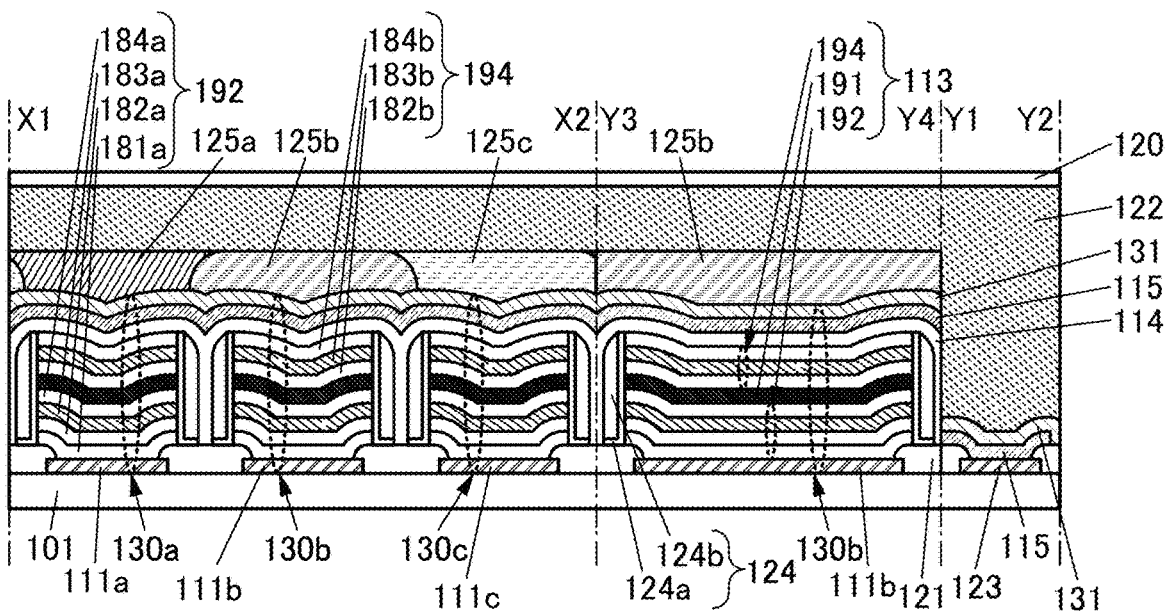
FIG. 1B is a cross-sectional view illustrating an example of the display device.

FIG. 1B illustrates a cross-sectional view taken along dashed-dotted lines X1-X2, Y1-Y2, and Y3-Y4 in FIG. 1A.

As illustrated in FIG. 1B, in the display device 100, light-emitting devices 130*a*, 130*b*, and 130*c* (hereinafter, collectively referred to as a light-receiving device 130 in some cases) are provided over a layer 101 including transistors, and a protective layer 131 is provided to cover the light-emitting devices. Here, an insulator 124 is provided on side surfaces of the light-emitting devices 130*a*, 130*b*, and 130*c*. The coloring layers 125*a*, 125*b*, and 125*c* are provided over the protective layer 131. A substrate 120 is bonded onto the protective layer 131 with a resin layer 122.

The layer 101 including transistors can employ a stacked-layer structure in which a plurality of transistors are provided over a substrate and an insulating layer is provided to cover these transistors, for example. Structure examples of the layer 101 including transistors will be described in Embodiment 2.

The light-emitting devices 130*a*, 130*b*, and 130*c* preferably emit white (W) light. When the coloring layers 125*a*, 125*b*, and 125*c* transmitting light of different colors are provided over the light-emitting devices 130*a*, 130*b*, and 130*c*, the subpixels 110*a*, 110*b*, and 110*c* that emit light of different colors can be formed.

The light-emitting device includes an EL layer between a pair of electrodes. In this specification and the like, one of the pair of electrodes may be referred to as a pixel electrode and the other may be referred to as a common electrode.

One of the pair of electrodes of the light-emitting device functions as an anode, and the other electrode functions as a cathode. The case where the pixel electrode functions as an anode and the common electrode functions as a cathode is described below as an example.

The light-emitting device 130*a* includes a pixel electrode 111*a* over the layer 101 including transistors, a first layer 113 over the pixel electrode 111*a*, a second layer 114 over the first layer 113, and a common electrode 115 over the second layer 114. Note that the first layer 113 and the second layer 114 can be collectively referred to as an EL layer. The light-emitting device 130*b* is different from the light-emitting device 130*a* in that a pixel electrode 111*b* is provided instead of the pixel electrode 111*a*. The light-emitting device 130*c* is different from the light-emitting device 130*a* in that a pixel electrode 111*c* is provided instead of the pixel electrode 111*a*. Hereinafter, the pixel electrodes 111*a*, 111*b*, and 111*c* are collectively referred to as a pixel electrode 111 in some cases.

The first layer 113 includes a first light-emitting unit 192 over the pixel electrode 111*a*, an intermediate layer 191 over the first light-emitting unit 192, and a second light-emitting unit 194 over the intermediate layer 191. For example, the first light-emitting unit 192 includes a first hole-injection layer 181*a* over the pixel electrode 111*a*, a first hole-transport layer 182*a* over the first hole-injection layer 181*a*, a first light-emitting layer 183*a* over the first hole-transport layer 182*a*, and a first electron-transport layer 184*a* over the first light-emitting layer 183*a*. Furthermore, for example, the second light-emitting unit 194 includes a second hole-transport layer 182*b* over the intermediate layer 191, a second light-emitting layer 183*b* over the second hole-transport layer 182*b*, and a second electron-transport layer 184*b* over the second light-emitting layer 183*b*.

The first light-emitting unit 192, the intermediate layer 191, and the second light-emitting unit 194 can have, for example, a structure similar to that of the light-emitting unit 512Q_1, a structure similar to that of the intermediate layer 531, and a structure similar to that of the light-emitting unit 512Q_2, respectively, as illustrated in FIG. 2A. That is, the first light-emitting unit 192 can include the layer 521, the layer 522, the light-emitting layer 523Q_1, the layer 524, and the like. Thus, the first hole-injection layer 181*a*, the first hole-transport layer 182*a*, the first light-emitting layer 183*a*, and the first electron-transport layer 184*a* correspond to the layer 521, the layer 522, the light-emitting layer 523Q_1, and the layer 524, respectively. The second light-emitting unit 194 can include the layer 522, the light-emitting layer 523Q_2, the layer 524, and the like. Thus, the second hole-transport layer 182*b*, the second light-emitting layer 183*b*, and the second electron-transport layer 184*b* correspond to the layer 522, the light-emitting layer 523Q_2, and the layer 524, respectively.

The second layer 114 is a layer shared by the light-emitting devices 130*a* to 130*c*. The second layer 114 includes an electron-injection layer, for example. Alternatively, the second layer 114 may include a stack of an electron-transport layer and an electron-injection layer.

The common electrode 115 is electrically connected to a conductive layer 123 provided in the connection portion 140. Thus, the same potential is supplied to the common electrode 115 included in the light-emitting devices of respective colors.

A conductive film that transmits visible light and infrared light is used as the electrode through which light is extracted, which is either the pixel electrode or the common electrode. A conductive film that reflects visible light and infrared light is preferably used as the electrode through which no light is extracted.

As a material that forms the pair of electrodes (the pixel electrode and the common electrode) of the light-emitting device, a metal, an alloy, an electrically conductive compound, a mixture thereof, and the like can be used as appropriate. Specific examples include indium tin oxide (In—Sn oxide, also referred to as ITO); In—Si—Sn oxide (also referred to as ITSO); indium zinc oxide (In—Zn oxide); In—W—Zn oxide; an alloy containing aluminum (an aluminum alloy) such as an alloy of aluminum, magnesium, nickel, and lanthanum (Al—Ni—La); and an alloy containing silver, such as an alloy of silver and magnesium and an alloy of silver, palladium, and copper (Ag—Pd—Cu, also referred to as APC). In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) and an alloy containing an appropriate combination of any of these metals. It is also possible to use an element belonging to Group 1 or Group 2 of the periodic table, which is not described above (e.g., lithium (Li), cesium (Cs), calcium (Ca), or strontium (Sr)), a rare earth metal such as europium (Eu) or ytterbium (Yb), an alloy containing an appropriate combination of any of these, graphene, or the like. The metal, the alloy, the electrically conductive compound, the mixture thereof, and the like described above may be stacked as appropriate to form the pair of electrodes (the pixel electrode and the common electrode) of the light-emitting device.

The light-emitting devices preferably employ a microcavity structure. Therefore, one of the pair of electrodes of the light-emitting devices is preferably an electrode having properties of transmitting and reflecting visible light (a semi-transmissive and semi-reflective electrode), and the other is preferably an electrode having a property of reflecting visible light (a reflective electrode). When the light-emitting devices have a microcavity structure, light obtained from the light-emitting layers can be resonated between the electrodes, whereby light emitted from the light-emitting devices can be intensified.

Note that the semi-transmissive and semi-reflective electrode can have a stacked-layer structure of a reflective electrode and an electrode having a property of transmitting visible light (also referred to as a transparent electrode).

The transparent electrode has a light transmittance higher than or equal to 40%. For example, an electrode having a visible light (light with a wavelength greater than or equal to 400 nm and less than 750 nm) transmittance higher than or equal to 40% is preferably used in the light-emitting devices. The semi-transmissive and semi-reflective electrode has a visible light reflectance of higher than or equal to 10% and lower than or equal to 95%, preferably higher than or equal to 30% and lower than or equal to 80%. The reflective electrode has a visible light reflectance of higher than or equal to 40% and lower than or equal to 100%, preferably higher than or equal to 70% and lower than or equal to 100%. These electrodes preferably have a resistivity lower than or equal to $1 \times 10^{-2}$ Ωcm. The near-infrared light (light with a wavelength greater than or equal to 750 nm and less than or equal to 1300 nm) transmittance and reflectance of these electrodes preferably satisfy the above-described numerical ranges of the visible light transmittance and reflectance.

In the first layer 113, the first light-emitting unit 192 and the second light-emitting unit 194 each include a light-emitting layer. It is preferable that a structure be employed in which light from the light-emitting layers of the plurality of light-emitting units can be combined to obtain white light emission. Each of the first light-emitting unit 192 and the second light-emitting unit 194 can include one or more of light-emitting layers.

The light-emitting layer is a layer containing a light-emitting substance. The light-emitting layer can contain one or more kinds of light-emitting substances. As the light-emitting substance, a substance that exhibits an emission color of blue, purple, bluish purple, green, yellowish green, yellow, orange, red, or the like is appropriately used. As the light-emitting substance, a substance that emits near-infrared light can also be used.

Examples of the light-emitting substance include a fluorescent material, a phosphorescent material, a thermally activated delayed fluorescent material, and a quantum dot material.

Examples of the fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material and an assist material) in addition to the light-emitting substance (a guest material). As one or more kinds of organic compounds, one or both of the hole-transport material and the electron-transport material can be used. Alternatively, as one or more kinds of organic compounds, a bipolar material or a TADF material may be used.

The light-emitting layer preferably includes, for example, a phosphorescent material and a combination of a hole-transport material and an electron-transport material that easily forms an exciplex. With such a structure, light emission can be efficiently obtained by ExTET (Exciplex-Triplet Energy Transfer), which is energy transfer from an exciplex to a light-emitting substance (a phosphorescent material). When a combination of materials is selected so as to form an exciplex that exhibits light emission whose wavelength overlaps with the wavelength of a lowest-energy-side absorption band of the light-emitting substance, energy can be smoothly transferred and light emission can be efficiently obtained. With this structure, high efficiency, low-voltage driving, and a long lifetime of the light-emitting device can be achieved at the same time.

The first layer 113 may further include, as a layer other than the light-emitting layer, a layer containing a substance with a high hole-injection property, a substance with a high hole-transport property, a hole-blocking material, a substance with a high electron-transport property, a substance with a high electron-injection property, an electron-blocking material, a substance with a bipolar property (a substance with a high electron-transport property and a high hole-transport property), or the like.

Either a low molecular compound or a high molecular compound can be used for the light-emitting device, and an inorganic compound may also be included. Each of the layers included in the light-emitting device can be formed by an evaporation method (including a vacuum evaporation method), a transfer method, a printing method, an inkjet method, a coating method, or the like.

For example, the first layer 113 may include one or more of a hole-injection layer, a hole-transport layer, a hole-blocking layer, an electron-blocking layer, an electron-transport layer, and an electron-injection layer.

The second layer 114 can include one or more of a hole-injection layer, a hole-transport layer, a hole-blocking layer, an electron-blocking layer, an electron-transport layer, and an electron-injection layer. For example, in the case where the pixel electrodes 111a, 111b, and 111c each function as an anode and the common electrode 115 functions as a cathode, the second layer 114 preferably includes an electron-injection layer.

The hole-injection layer is a layer injecting holes from an anode to a hole-transport layer, and a layer containing a material with a high hole-injection property. Examples of the material with a high hole-injection property include an aromatic amine compound and a composite material containing a hole-transport material and an acceptor material (electron-accepting material).

In the light-emitting device, the hole-transport layer transports holes that are injected from the anode by the hole-injection layer, to the light-emitting layer. The hole-transport layer is a layer containing a hole-transport material. As the hole-transport material, a substance having a hole mobility greater than or equal to $1\times10^{-6}$ cm$^2$/Vs is preferable. Note that other substances can also be used as long as they have a property of transporting more holes than electrons. As the hole-transport material, materials with a high hole-transport property, such as a n-electron rich heteroaromatic compound (e.g., a carbazole derivative, a thiophene derivative, and a furan derivative) and an aromatic amine (a compound having an aromatic amine skeleton), are preferable.

In the light-emitting device, the electron-transport layer transports electrons that are injected from the cathode by the electron-injection layer, to the light-emitting layer. The electron-transport layer is a layer containing an electron-transport material. As the electron-transport material, a substance having an electron mobility greater than or equal to $1\times10^{-6}$ cm$^2$/Vs is preferable. Note that other substances can also be used as long as they have a property of transporting more electrons than holes. As the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound.

The electron-injection layer is a layer injecting electrons from a cathode to the electron-transport layer, and a layer containing a material with a high electron-injection property.

As the material with a high electron-injection property, an alkali metal, an alkaline earth metal, or a compound thereof can be used. As the material with a high electron-injection property, a composite material containing an electron-transport material and a donor material (electron-donating material) can also be used.

For the electron-injection layer, for example, an alkali metal, an alkaline earth metal, or a compound thereof, such as lithium, cesium, lithium fluoride (LiF), cesium fluoride (CsF), calcium fluoride (CaF$_2$), 8-(quinolinolato)lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), lithium oxide (LiO$_x$), or cesium carbonate can be used.

Alternatively, an electron-transport material may be used for the electron-injection layer. For example, a compound having an unshared electron pair and having an electron deficient heteroaromatic ring can be used as the electron-transport material. Specifically, a compound with at least one of a pyridine ring, a diazine ring (a pyrimidine ring, a pyrazine ring, and a pyridazine ring), and a triazine ring can be used.

Note that the lowest unoccupied molecular orbital (LUMO) of the organic compound having an unshared electron pair is preferably higher than or equal to $-3.6$ eV and lower than or equal to $-2.3$ eV. In general, the highest occupied molecular orbital (HOMO) level and the LUMO level of an organic compound can be estimated by CV (cyclic voltammetry), photoelectron spectroscopy, optical absorption spectroscopy, inverse photoelectron spectroscopy, or the like.

For example, 4,7-diphenyl-1,10-phenanthroline (abbreviation: BPhen), 2,9-bis(naphthalen-2-yl)-4,7-diphenyl-1,10-phenanthroline (abbreviation: NBPhen), diquinoxalino [2,3-a:2',3'-c]phenazine (abbreviation: HATNA), or 2,4,6-tris[3'-(pyridin-3-yl)biphenyl-3-yl]-1,3,5-triazine (abbreviation: TmPPPyTz) can be used as the organic compound having an unshared electron pair. Note that NBPhen has a higher glass transition temperature (Tg) than BPhen and thus has high heat resistance.

A material in which a plurality of kinds of substances are mixed (also referred to as a composite material) can be used for the first layer 113. Specifically, a composite material which includes an alkali metal, an alkali metal compound, or an alkali metal complex and an electron-transport material can be used for the first layer 113. Note that the electron-transport material preferably has a HOMO level that is higher than or equal to $-6.0$ eV.

Alternatively, a composite material of an acceptor material and a hole-transport material can be used for the first layer 113. Specifically, a composite material of an acceptor material and a substance having a relatively deep HOMO level, which is higher than or equal to $-5.7$ eV and lower than or equal to $-5.4$ eV, can be used for the first layer 113. The use of the composite material for the first layer 113 can improve the reliability of the light-emitting device.

Note that in this specification and the like, the light-emitting device in which the above-described composite material is used for the first layer 113 is referred to as a Recombination-Site Tailoring Injection structure (ReSTI structure) in some cases.

The protective layer 131 is preferably included over the light-emitting devices 130a, 130b, and 130c. Providing the protective layer 131 can enhance the reliability of the light-emitting device.

There is no limitation on the conductivity of the protective layer 131. As the protective layer 131, at least one type of an insulating film, a semiconductor film, and a conductive film can be used.

The protective layer 131 including an inorganic film or an inorganic insulating film can prevent oxidation of the common electrode 115 and inhibit entry of impurities (e.g., moisture and oxygen) into the light-emitting devices 130*a*, 130*b*, and 130*c*. Thus, deterioration of the light-emitting device can be inhibited and the reliability of the display device can be enhanced.

As the protective layer 131, an inorganic insulating film such as an oxide insulating film, a nitride insulating film, an oxynitride insulating film, or a nitride oxide insulating film can be used, for example. Examples of the oxide insulating film include a silicon oxide film, an aluminum oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film.

Note that in this specification and the like, oxynitride refers to a material that contains more oxygen than nitrogen, and nitride oxide refers to a material that contains more nitrogen than oxygen. For example, when silicon oxynitride is described, it refers to a material that contains more oxygen than nitrogen in its composition; when silicon nitride oxide is described, it refers to a material that contains more nitrogen than oxygen in its composition.

The protective layer 131 preferably includes a nitride insulating film or a nitride oxide insulating film, and further preferably includes a nitride insulating film.

As the protective layer 131, an inorganic film containing In—Sn oxide (also referred to as ITO), In—Zn oxide, Ga—Zn oxide, Al—Zn oxide, indium gallium zinc oxide (In—Ga—Zn oxide, also referred to as IGZO), or the like can also be used. The inorganic film preferably has high resistance, specifically, higher resistance than the common electrode 115. The inorganic film may further contain nitrogen. For example, when a metal that is easily deteriorated by impurities (e.g., moisture and oxygen) such as an alloy of silver and magnesium is used for the common electrode 115, In—Ga—Zn oxide or the like can be used for the protective layer 131.

When light emitted from the light-emitting device is extracted through the protective layer 131, the protective layer 131 preferably has a high visible-light-transmitting property. For example, ITO, IGZO, and aluminum oxide are preferable because they are inorganic materials having high transmittance with respect to visible light.

The protective layer 131 can have, for example, a stacked-layer structure of an aluminum oxide film and a silicon nitride film over the aluminum oxide film, or a stacked-layer structure of an aluminum oxide film and an IGZO film over the aluminum oxide film. Such a stacked-layer structure can inhibit entry of impurities (e.g., water and oxygen) into the EL layers.

Furthermore, the protective layer 131 may include an organic film. For example, the protective layer 131 may include both an organic film and an inorganic film.

The coloring layer 125 (the coloring layer 125*a*, the coloring layer 125*b*, and the coloring layer 125*c*) is provided over the protective layer 131. The coloring layer 125*a* includes a region overlapping with the light-emitting device 130*a*, the coloring layer 125*b* includes a region overlapping with the light-emitting device 130*b*, and the coloring layer 125*c* includes a region overlapping with the light-emitting device 130*c*. The coloring layers 125*a*, 125*b*, and 125*c* each include a region overlapping with at least the light-emitting layer included in the corresponding light-emitting device 130.

The coloring layer 125*a*, the coloring layer 125*b*, and the coloring layer 125*c* have functions of transmitting light of different colors from one another. For example, the coloring layer 125*a* has a function of transmitting red light, the coloring layer 125*b* has a function of transmitting green light, and the coloring layer 125*c* has a function of transmitting blue light. Thus, the display device 100 can perform full-color display. Note that the coloring layer 125*a*, the coloring layer 125*b*, and the coloring layer 125*c* may each have a function of transmitting light of any of cyan, magenta, and yellow.

Here, the adjacent coloring layers 125 preferably include an overlapping region. Specifically, a region not overlapping with the light-emitting device 130 preferably includes the region where the adjacent coloring layers 125 overlap with each other. When the coloring layers 125 that transmit light of different colors overlap with each other, the coloring layers 125 in the region where the coloring layers 125 overlap with each other can function as light-blocking layers. Thus, light emitted from the light-emitting device 130 can be inhibited from leaking to an adjacent subpixel. For example, light emitted from the light-emitting device 130*a*, which is overlapped by the coloring layer 125*a*, can be inhibited from entering the coloring layer 125*b*. Consequently, the contrast of images displayed on the display device can be increased to achieve a display device with high display quality.

Note that the adjacent coloring layers 125 may include no overlapping region. In that case, a light-blocking layer is preferably provided in a region not overlapping with the light-emitting device 130. The light-blocking layer can be provided on a surface of the substrate 120 on the resin layer 122 side, for example. The coloring layer 125 may be provided on the surface of the substrate 120 on the resin layer 122 side.

Forming the coloring layers 125 over the protective layer 131 makes it easy to align the light-emitting devices 130 with the respective coloring layers 125 as compared with the case where the coloring layers 125 are formed over the substrate 120, so that a display device with extremely high resolution can be achieved.

End portions of the pixel electrodes 111*a*, 111*b*, and 111*c* are covered with an insulator 121. The insulator 121 can also be referred to as a bank, a partition, a barrier, an embankment, or the like. Providing such an insulator 121 can prevent the second layer 114, the common electrode 115, or the like from being in contact with the pixel electrodes 111*a*, 111*b*, and 111*c*, so that a short circuit in the light-emitting device 130 can be inhibited.

The insulator 121 includes an opening over each of the pixel electrodes 111*a*, 111*b*, and 111*c*, and in the openings, the pixel electrodes 111*a*, 111*b*, and 111*c* are in contact with the lower portion (e.g., the first hole-injection layer 181*a*) of their respective first light-emitting units 192. That is, in the end portions or in the vicinity of the end portions of the pixel electrodes 111*a*, 111*b*, and 111*c*, part of the insulator 121 is provided between the pixel electrode 111*a*, 111*b*, or 111*c* and the first hole-injection layer 181*a*.

The insulator 121 can have a single-layer structure or a stacked-layer structure including one or both of an inorganic insulating film and an organic insulating film.

Examples of an organic insulating material that can be used for the insulator 121 include an acrylic resin, an epoxy resin, a polyimide resin, a polyamide resin, a polyimide-amide resin, a polysiloxane resin, a benzocyclobutene-based resin, and a phenol resin. As an inorganic insulating film that can be used as the insulator 121, an inorganic insulating film that can be used as the protective layer 131 can be used.

When an inorganic insulating film is used as the insulator 121 that covers the end portions of the pixel electrodes, impurities are less likely to enter the light-emitting device as compared with the case where an organic insulating film is used; therefore, the reliability of the light-emitting device can be enhanced. When an organic insulating film is used as the insulator 121 that covers the end portions of the pixel electrodes, high step coverage can be obtained as compared with the case where an inorganic insulating film is used; therefore, an influence of the shape of the pixel electrodes can be small. Therefore, a short circuit in the light-emitting device can be prevented. Specifically, when an organic insulating film is used as the insulator 121, the insulator 121 can be processed into a tapered shape or the like. In this specification and the like, a tapered shape indicates a shape in which at least part of a side surface of a structure is inclined to a substrate surface. For example, a tapered shape preferably includes a region where the angle between the inclined side surface and the substrate surface (also referred to as a taper angle) is less than 90°.

The insulator 124 is provided over the insulator 121 in contact with at least part of the side surface of the light-emitting device 130. At this time, the insulator 124 is preferably in contact with at least parts of a side surface of the first light-emitting unit 192, a side surface of the intermediate layer 191, and a side surface of the second light-emitting unit 194. For example, a structure can be employed where the insulator 124 is in contact with a side surface of the first hole-injection layer 181a, a side surface of the first hole-transport layer 182a, a side surface of the first light-emitting layer 183a, a side surface of the first electron-transport layer 184a, the side surface of the intermediate layer 191, a side surface of the second hole-transport layer 182b, a side surface of the second light-emitting layer 183b, and a side surface of the second electron-transport layer 184b as illustrated in FIG. 1B. In this manner, at least part of the side surface of the light-emitting device is covered with the insulator 124, whereby the second layer 114 can be inhibited from being in contact with any of the side surfaces of the first light-emitting unit 192, the intermediate layer 191, and the second light-emitting unit 194. In the above manner, a short circuit in the light-emitting device 130 can be inhibited. Note that the insulator 124 can also be referred to as a sidewall, a sidewall protective layer, a sidewall insulating film, or the like.

FIG. 1B illustrates an example in which the insulator 124 has a two-layer structure of an insulator 124a and an insulator 124b over the insulator 124a. It is preferable that a side surface of the insulator 124a be in contact with at least part of the side surface of the light-emitting device 130 and a bottom surface of the insulator 124a be in contact with at least part of the insulator 121. In addition, side and bottom surfaces of the insulator 124b are preferably in contact with at least part of the insulator 124a.

The thickness of the insulator 124b in a direction perpendicular to a substrate surface of the substrate 120 can be larger than the thickness of the insulator 124b in a direction parallel to the substrate surface of the substrate 120. Furthermore, the shape of an upper end portion of the insulator 124b can be rounded. The shape of the upper end portion of the insulator 124b is preferably rounded, so that coverage with the second layer 114, the common electrode 115, and the protective layer 131 is increased.

As the insulator 124a and the insulator 124b, an inorganic insulating film such as an oxide insulating film, a nitride insulating film, an oxynitride insulating film, or a nitride oxide insulating film can be used, for example. Examples of the oxide insulating film include a silicon oxide film, an aluminum oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film.

The insulator 124a and the insulator 124b can be formed by any of a variety of deposition methods such as a sputtering method, an evaporation method (including a vacuum evaporation method), a CVD method, and an ALD method. An ALD method gives less deposition damage to a layer where a film is to be formed; for this reason, depositing the insulator 124a, which is in direct contact with the first light-emitting unit 192, the intermediate layer 191, and the second light-emitting unit 194, by an ALD method is particularly preferable. In that case, the insulator 124b is preferably deposited by a sputtering method or the like because productivity can be increased.

For example, an aluminum oxide film deposited by an ALD method can be used for the insulator 124a and a silicon nitride film deposited by a sputtering method can be used as the insulator 124b.

One or both of the insulator 124a and the insulator 124b preferably have a function of a barrier insulating film against at least one of water and oxygen. Alternatively, one or both of the insulator 124a and the insulator 124b preferably have a function of inhibiting diffusion of at least one of water and oxygen. Further alternatively, one or both of the insulator 124a and the insulator 124b preferably have a function of capturing or fixing (also referred to as gettering) at least one of water and oxygen.

Note that in this specification and the like, a barrier insulating film refers to an insulating film having a barrier property. In this specification and the like, a barrier property means a function of inhibiting diffusion of a targeted substance (also referred to as having low permeability). Alternatively, in this specification and the like, a barrier property means a function of capturing or fixing (also referred to as gettering) a targeted substance.

When one or both of the insulator 124a and the insulator 124b have the above-described function of a barrier insulating film or a gettering function, entry of impurities (typically, water or oxygen) that would diffuse into each of the light-emitting elements from the outside can be inhibited. With such a structure, a highly reliable display device can be provided.

In this specification and the like, a device formed using a metal mask or an FMM (a fine metal mask, a high-resolution metal mask) may be referred to as a device having an MM (metal mask) structure. In this specification and the like, a device formed without using a metal mask or an FMM may be referred to as a device having an MML (metal maskless) structure.

Note that in this specification and the like, a light-emitting device capable of emitting white light is sometimes referred to as a white-light-emitting device. Note that a combination of white-light-emitting devices with coloring layers (e.g., color filters) enables a full-color display device. A structure in which light-emitting layers in light-emitting devices of different colors (here, blue (B), green (G), and red (R)) are separately formed or separately patterned is sometimes referred to as an SBS (Side By Side) structure.

Structures of light-emitting devices can be classified roughly into a single structure and a tandem structure. A device having a single structure includes one light-emitting unit between a pair of electrodes, and the light-emitting unit preferably includes one or more light-emitting layers. To obtain white light emission, two or more light-emitting layers are selected such that emission colors of the light-emitting layers are complementary colors. For example, when emission colors of a first light-emitting layer and a second light-emitting layer are complementary colors, the light-emitting device can be configured to emit white light as a whole. The same applies to a light-emitting device including three or more light-emitting layers.

A device having a tandem structure includes two or more light-emitting units between a pair of electrodes, and each light-emitting unit preferably includes one or more light-emitting layers. To obtain white light emission, the structure is made so that light from light-emitting layers of the light-emitting units can be combined to be white light. Note that a structure for obtaining white light emission is similar to a structure in the case of a single structure. In the device having a tandem structure, it is suitable that an intermediate layer such as a charge-generation layer is provided between a plurality of light-emitting units.

Furthermore, in the case where the above-described white-light-emitting device (a single structure or a tandem structure) and a light-emitting device with an SBS structure are compared, the white-light-emitting device is suitable in terms of lower manufacturing costs or higher manufacturing yield because the manufacturing process of the white-light-emitting device is simpler than that of a light-emitting device having an SBS structure.

In the display device of this embodiment, the distance between the light-emitting devices can be narrowed. Here, the distance between the light-emitting devices can be, for example, the distance between the side surfaces of the adjacent pixel electrodes 111 that face each other. Specifically, the distance between the light-emitting devices can be decreased to be less than or equal to 8 μm, less than or equal to 6 μm, less than or equal to 4 μm, less than or equal to 3 μm, less than or equal to 2 μm, or less than or equal to 1 μm. Furthermore, with use of an exposure apparatus for LSI, for example, the distance can be decreased to be less than or equal to 500 nm, less than or equal to 200 nm, less than or equal to 100 nm, less than or equal to 90 nm, less than or equal to 70 nm, less than or equal to 50 nm, less than or equal to 30 nm, less than or equal to 20 nm, less than or equal to 15 nm, or 10 nm.

Although an example of a stripe arrangement of the subpixels 110a, 110b, and 110c is described in FIG. 1A, the present invention is not limited thereto. Examples of pixel arrangements which are different from that illustrated in FIG. 1A will be described below with reference to FIG. 4 to FIG. 6.

Figures 4A, 4B, 4C, 4D, 4E:
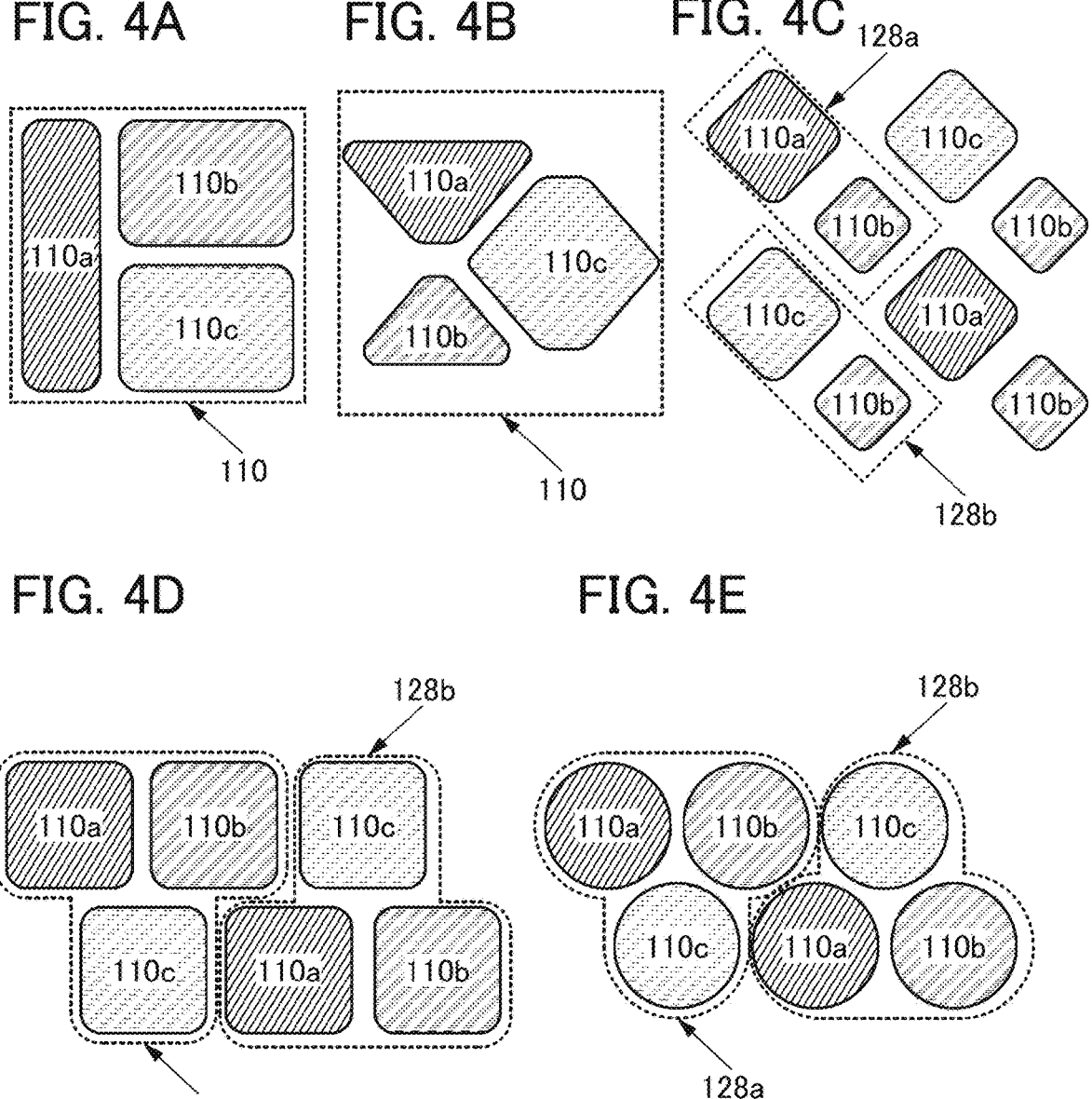
FIG. 4A to FIG. 4E are top views illustrating examples of pixels of a display device.

The pixel 110 illustrated in FIG. 4A employs an S-stripe arrangement. The pixel 110 illustrated in FIG. 4A is composed of three subpixels 110a, 110b, and 110c. In the arrangement of the subpixels in two rows and two columns here, the subpixel 110b and the subpixel 110c in the second column are arranged in the first row and the second row, respectively, and the subpixel 110a in the first column is arranged across the first row and the second row. For example, the subpixel 110a may be a blue subpixel, the subpixel 110b may be a red subpixel, and the subpixel 110c may be a green subpixel.

The pixel 110 illustrated in FIG. 4B includes the subpixel 110a that has a rough trapezoidal top surface shape with rounded corners, the subpixel 110b that has a rough triangular top surface shape with rounded corners, and the subpixel 110c that has a rough quadrangular or rough hexagonal top surface shape with rounded corners. The subpixel 110a has a larger light-emitting area than the subpixel 110b. In this manner, the shapes and sizes of the subpixels can be determined independently. For example, the size of a subpixel including a light-emitting device with higher reliability can be smaller. For example, the subpixel 110a may be a green subpixel, the subpixel 110b may be a red subpixel, and the subpixel 110c may be a blue subpixel.

Pixels 128a and 128b illustrated in FIG. 4C employ a PenTile arrangement. FIG. 4C illustrates an example where the pixels 128a including the subpixels 110a and the subpixels 110b and the pixels 128b including the subpixels 110b and the subpixels 110c are alternately arranged. For example, the subpixel 110a may be a blue subpixel, the subpixel 110b may be a green subpixel, and the subpixel 110c may be a red subpixel.

The pixels 128a and 128b illustrated in FIG. 4D and FIG. 4E employ a delta arrangement. The pixel 128a includes two subpixels (the subpixels 110a and 110b) in the upper row (first row) and one subpixel (the subpixel 110c) in the lower row (second row). The pixel 128b includes one subpixel (the subpixel 110c) in the upper row (first row) and two subpixels (the subpixels 110a and 110b) in the lower row (second row).

FIG. 4D is an example where each subpixel has a rough quadrangular top surface shape with rounded corners, and FIG. 4E is an example where each subpixel has a circular top surface shape.

In a photolithography method, as a pattern to be formed by processing becomes finer, the influence of light diffraction becomes more difficult to ignore; therefore, the fidelity in transferring a photomask pattern by exposure is degraded, and it becomes difficult to process a resist mask into a desired shape. Thus, a pattern with rounded corners is likely to be formed even with a rectangular photomask pattern. Consequently, the top surface shapes of the subpixels may be polygons with rounded corners, ellipses, circles, or the like.

Furthermore, in the manufacturing method of the display device of one embodiment of the present invention, the EL layer is processed into an island shape with the use of a resist mask. A resist film formed over the EL layer needs to be cured at a temperature lower than the upper temperature limit of the EL layer. Thus, the resist film is insufficiently cured in some cases depending on the upper temperature limit of the material of the EL layer and the curing temperature of the resist material. An insufficiently cured resist film may have a shape different from a desired shape by processing. As a result, a top surface shape of the EL layer may be a polygon with rounded corners, an ellipse, a circle, or the like. For example, when a resist mask with a square top surface shape is intended to be formed, a resist mask with a circular top surface shape may be formed, and the top surface shape of the EL layer may be a circle.

Note that in order to obtain a desired top surface shape of the EL layer, a technique of correcting a mask pattern in advance so that a transferred pattern agrees with a design pattern (an OPC (Optical Proximity Correction) technique) may be used. Specifically, with the OPC technique, a pattern for correction is added to a corner portion or the like of a figure on a mask pattern.

Figures 5A, 5B:
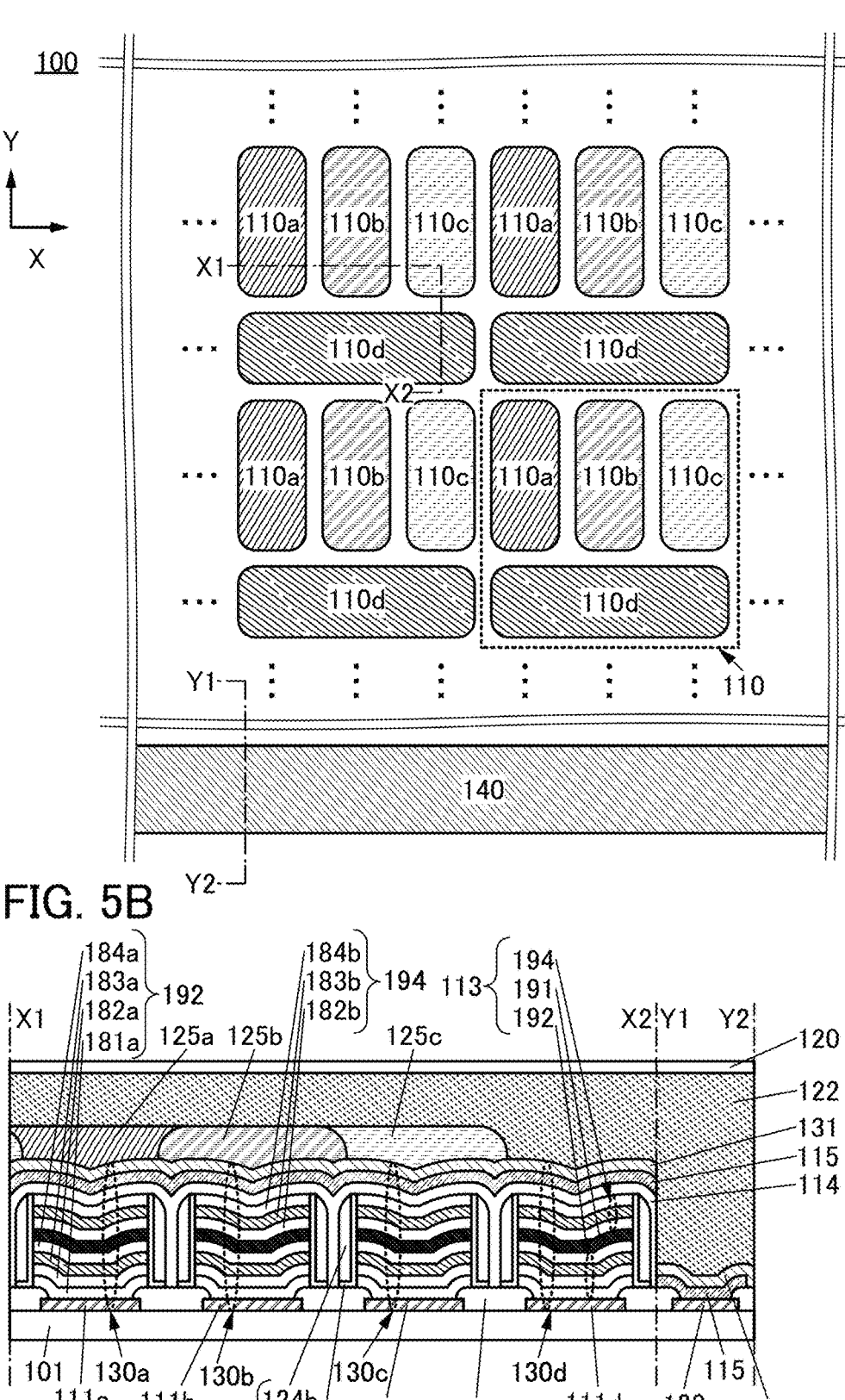
FIG. 5A is a top view illustrating an example of a display device.
FIG. 5B is a cross-sectional view illustrating an example of the display device.

Although a structure in which three subpixels are provided is illustrated in FIG. 1A, the present invention is not limited thereto. A structure in which four or more subpixels are provided may be employed. The pixel 110 illustrated in FIG. 5A is composed of four subpixels 110a, 110b, 110c, and 110d. Like the subpixels 110a, 110b, and 110c, the subpixel 110d includes a light-emitting device 130d that emits white light. As illustrated in FIG. 5B, the light-emitting device 130d includes a pixel electrode 111d, the first layer 113, the second layer 114, and the common electrode 115. However, unlike the subpixels 110a, 110b, and 110c, the subpixel 110d does not include a coloring layer. With this structure, for example, the subpixels 110a, 110b, and 110c can be red, green, and blue subpixels, respectively, and the subpixel 110d can be a white subpixel.

FIG. 5A illustrates an example in which one pixel 110 is arranged in two rows and three columns. The pixel 110 includes three subpixels (the subpixels 110a, 110b, and 110c) in the upper row (first row) and one subpixel (the subpixel 110d) in the lower row (second row). In other words, the pixel 110 includes the subpixel 110a in the left column (first column), the subpixel 110b in the center column (second column), the subpixel 110c in the right column (third column), and the subpixel 110d across these three columns.

The pixel 110 illustrated in FIG. 6A to FIG. 6C employs a stripe arrangement. The pixel 110 illustrated in FIG. 6A to FIG. 6C is composed of four subpixels 110a, 110b, 110c, and 110d. The subpixels 110a, 110b, 110c, and 110d include light-emitting devices that emit light of different colors from each other. For example, the subpixels 110a, 110b, 110c, and 110d can be red, green, blue, and white subpixels, respectively.

FIG. 6A is an example where each subpixel has a rectangular top surface shape; FIG. 6B is an example where each subpixel has a top surface shape formed by combining two half circles and a rectangle; and FIG. 6C is an example where each subpixel has an elliptical top surface shape.

The pixel 110 illustrated in FIG. 6D to FIG. 6F employs a matrix arrangement. The pixel 110 illustrated in FIG. 6D to FIG. 6F is composed of four subpixels 110a, 110b, 110c, and 110d. The subpixels 110a, 110b, 110c, and 110d each include light-emitting devices that emit light of different colors from each other. For example, the subpixels 110a, 110b, 110c, and 110d can be red, green, blue, and white subpixels, respectively.

FIG. 6D is an example where each subpixel has a square top surface shape; FIG. 6E is an example where each subpixel has a rough square top surface shape with rounded corners; and FIG. 6F is an example where each subpixel has a circular top surface shape.

The pixel 110 illustrated in FIG. 6G is composed of six subpixels of the subpixel 110a, the subpixel 110b, the subpixel 110c, a subpixel 110d1, a subpixel 110d2, and a subpixel 110d3. The subpixels 110d1, 110d2, and 110d3 in FIG. 6G are obtained by dividing the subpixel 110d illustrated in FIG. 5A that is parallel to the subpixels 110a, 110b, and 110c. Here, the subpixels 110d1, 110d2, and 110d3 may be electrically connected to the same transistor in the layer 101 including transistors.

With the structure illustrated in FIG. 6G, narrow paths formed between the subpixels 110a, 110b, 110c, 110d1, 110d2, and 110d3 are formed so as to cross the display device 100 in the X direction and the Y direction. Accordingly, in the cleaning step at the time of manufacturing the display device 100, dust or the like can easily flow through the narrow paths, so that dust generated in the manufacturing process can be prevented from entering the display device.

Next, modification examples of a cross-sectional shape of the display device 100 will be described with reference to FIG. 7 to FIG. 9.

Figure 7A:
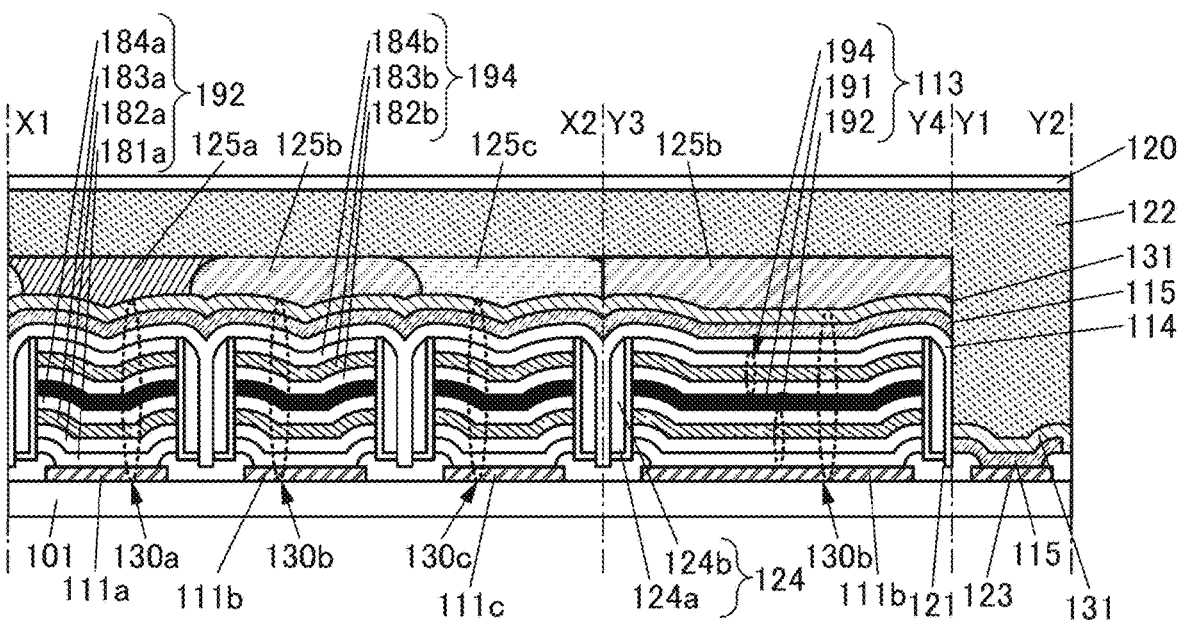
FIG. 7A and FIG. 7B are cross-sectional views illustrating examples of a display device.

As illustrated in FIG. 7A, a depression is sometimes formed in an upper portion of the insulator 121 between adjacent light-emitting devices 130. For example, a first depression is formed in a region of the insulator 121 that does not overlap with the first layer 113 in some cases. At this time, a bottom surface of the insulator 124 is in contact with a bottom surface of the first depression in some cases. For another example, a second depression is formed in a region that does not overlap with the insulator 124 inside the first depression in some cases. At this time, part of the second layer 114 is in contact with a bottom surface of the second depression in some cases.

Figure 7B:
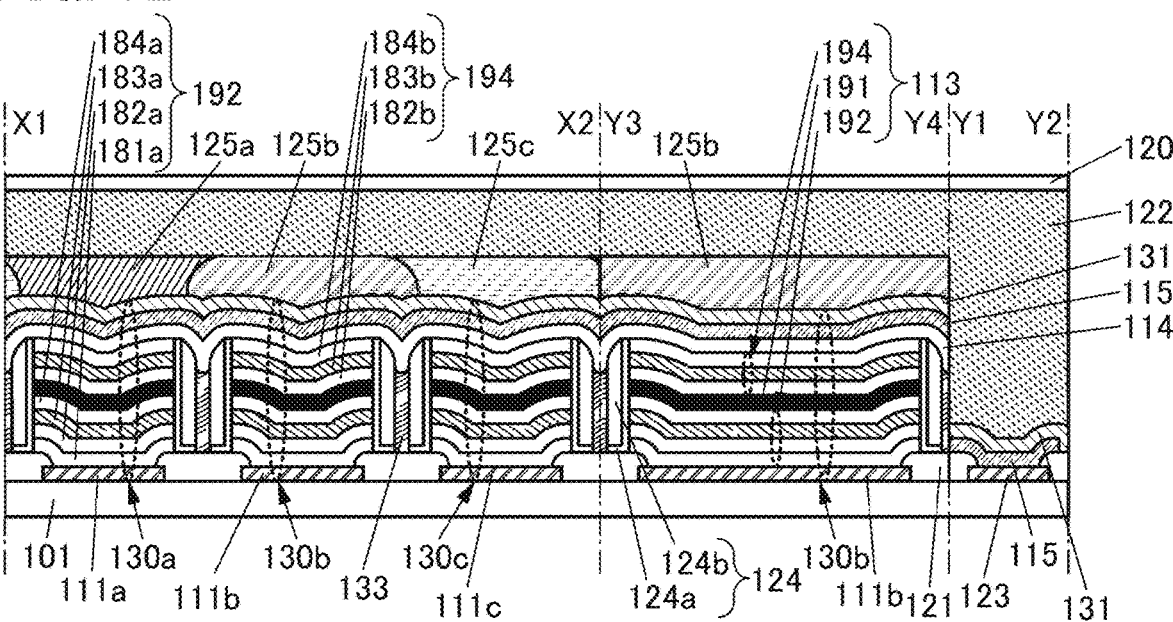

Although FIG. 1B illustrates an example in which the second layer 114 is formed in a region between the adjacent insulators 124, for example, a space 133 may be formed in the region as illustrated in FIG. 7B.

The space 133 includes, for example, any one or more selected from air, nitrogen, oxygen, carbon dioxide, and Group 18 elements (typically, helium, neon, argon, xenon, and krypton).

In the case where the refractive index of the space 133 is lower than the refractive index of the second layer 114, light emitted from the light-emitting device is reflected at the interface between the second layer 114 and the space 133. Thus, light emitted from the light-emitting device can be inhibited from entering an adjacent pixel (or subpixel). Accordingly, color mixture of light from different pixels can be inhibited, so that display quality of the display device can be improved.

Figure 8A:
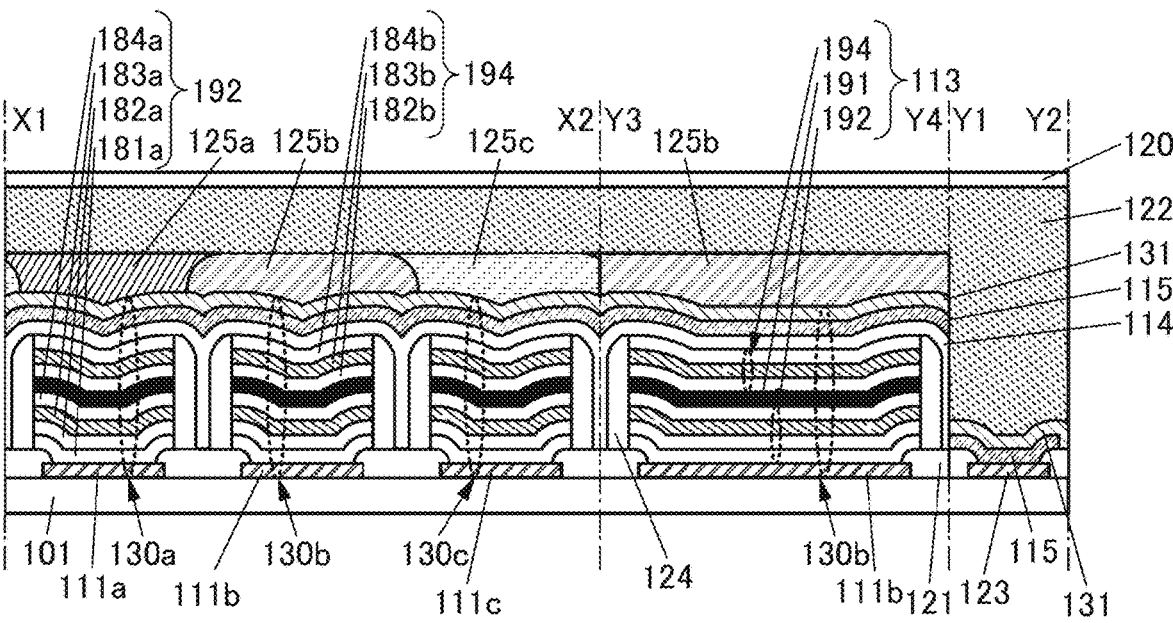
FIG. 8A and FIG. 8B are cross-sectional views illustrating examples of a display device.

Although FIG. 1B illustrates an example in which the insulator 124 includes the insulator 124a and the insulator 124b over the insulator 124a, the insulator 124 may have a single-layer structure as illustrated in FIG. 8A. The insulator 124 can be formed using a material that can be used for the insulator 124a or the insulator 124b.

Figure 8B:
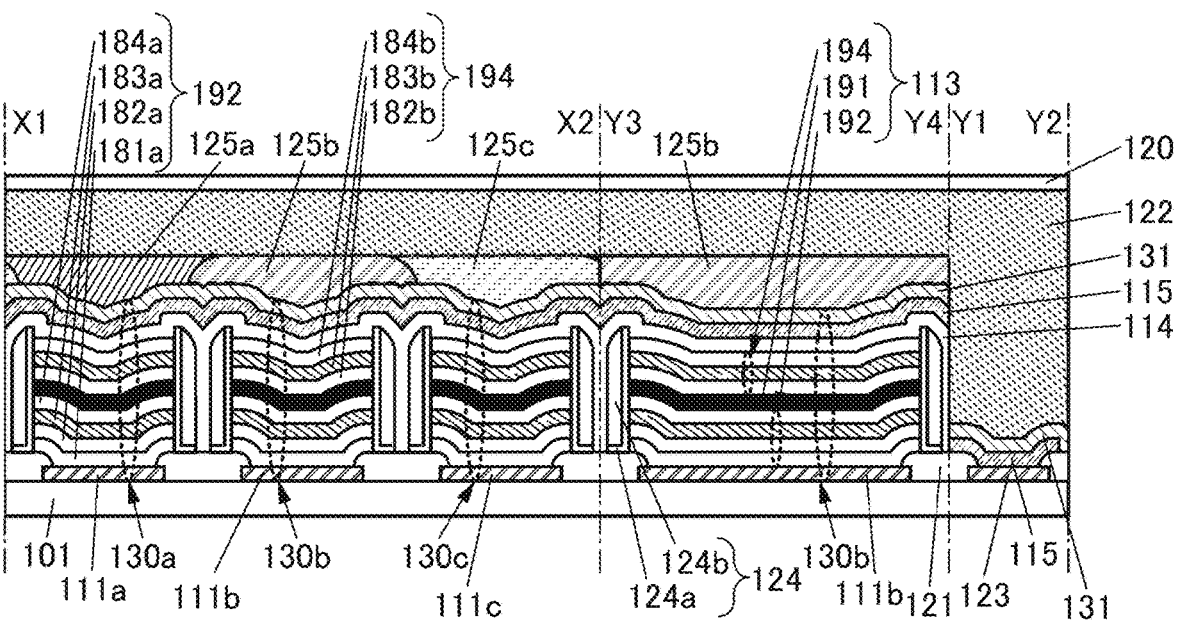

Although FIG. 1B illustrates an example in which an upper end of the insulator 124 is substantially aligned with a top surface of the second electron-transport layer 184b, the present invention is not limited thereto. For example, as illustrated in FIG. 8B, either one or both of the upper ends of the insulator 124a and the insulator 124b may protrude beyond the top surface of the second electron-transport layer 184b. With such a structure, the insulator 124 can cover a side surface of the first layer 113 up to the upper end thereof, so that a short circuit in the light-emitting device 130 can be further inhibited.

Figure 9A:
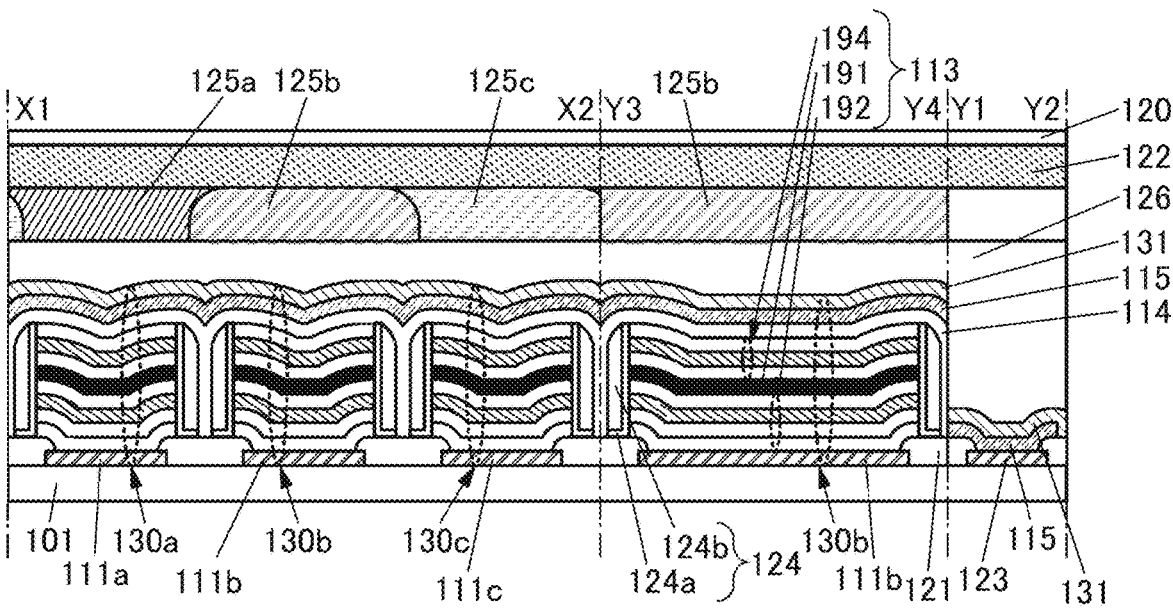
FIG. 9A and FIG. 9B are cross-sectional views illustrating examples of a display device.

Although FIG. 1B illustrates an example in which the coloring layers 125a, 125b, and 125c are in contact with a top surface of the protective layer 131, the present invention is not limited thereto. For example, as illustrated in FIG. 9A, a structure may be employed in which an insulating layer 126 with high planarity is provided to cover the protective layer 131 and the coloring layers 125a, 125b, and 125c are provided over the insulating layer 126. Here, an organic insulating material or an inorganic insulating material that can be used for the insulator 121 can be used for the insulating layer 126, for example. Furthermore, the substrate 120 can be bonded to the resin layer 122 that is provided over the coloring layers 125a, 125b, and 125c.

Figure 9B:
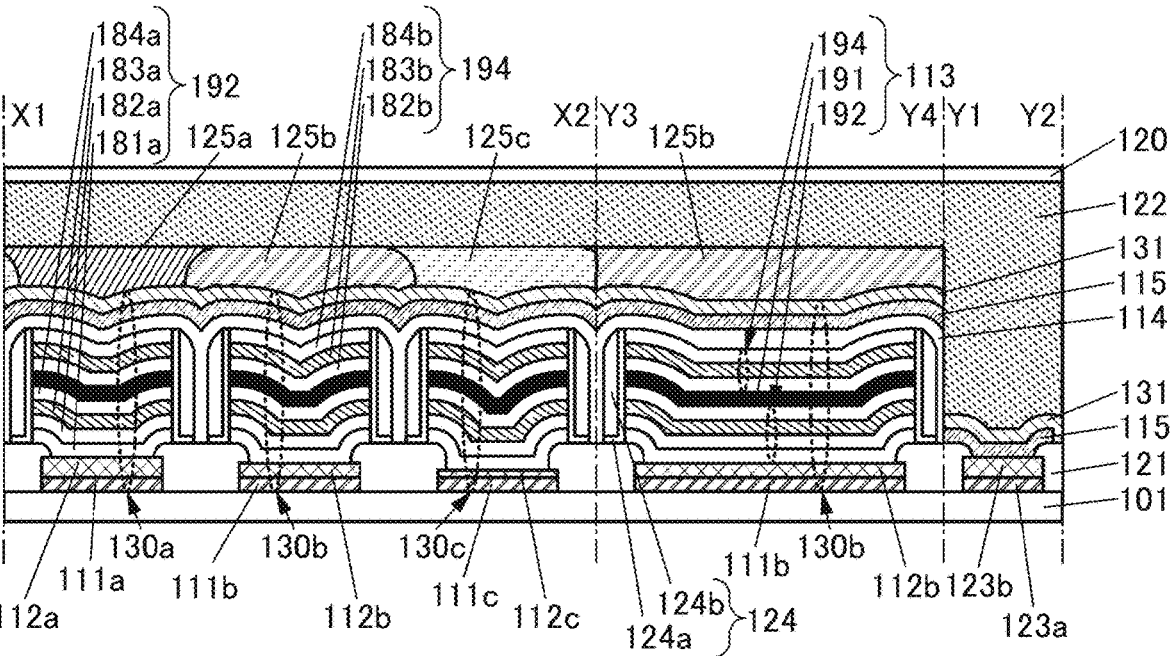

As illustrated in FIG. 9B, a structure may be employed in which a conductive layer 112a, a conductive layer 112b, and a conductive layer 112c (hereinafter, collectively referred to as a conductive layer 112 in some cases) having a function of transmitting visible light are provided over the pixel electrode 111a, the pixel electrode 111b, and the pixel electrode 111c, respectively. At this time, the conductive layer 123 also has a stacked-layer structure of a conductive layer 123a and a conductive layer 123b.

As the conductive layer 112, a conductive film having a property of transmitting visible light described above can be used. As the conductive layer 112, a film which is thin enough to transmit visible light formed using a conductive film which reflects visible light described above can be used. In addition, with the stacked-layer structure of the conductive film and the conductive film transmitting visible light described above, the conductivity and the mechanical strength can be increased.

As illustrated in FIG. 9B, the conductive layer 112 is positioned between the pixel electrode 111 and the first hole-injection layer 181a. The conductive layer 112 is positioned over the pixel electrode 111.

In addition, as illustrated in FIG. 9B, the conductive layers 112 provided in the light-emitting devices 130 preferably have different thicknesses. For example, in the case where the coloring layer 125a transmits red light, the coloring layer 125b transmits green light, and the coloring layer 125c transmits blue light, among the three conductive layers 112, the conductive layer 112a may have the largest thickness and the conductive layer 112c may have the smallest thickness. Here, the distance between a top surface of the pixel electrode 111 and a bottom surface of the common electrode 115 in each of the light-emitting devices is the largest in the light-emitting device 130 overlapping with the coloring layer 125a and the smallest in the light-emitting device 130 overlapping with the coloring layer 125c. In each of the light-emitting devices, the distance between the top surface of the pixel electrode 111 and the bottom surface of the common electrode 115 is changed, whereby the optical distance (optical path length) in each of the light-emitting elements can be changed.

Among the three light-emitting devices, the light-emitting device 130 overlapping with the coloring layer 125a has the largest optical path length and thus emits light in which light with the longest wavelength (e.g., red light) is intensified. Meanwhile, the light-emitting device 130 overlapping with the coloring layer 125b has the smallest optical path length and thus emits light in which light with the shortest wavelength (e.g., blue light) is intensified. The light-emitting device 130 overlapping with the coloring layer 125b emits light in which light with an intermediate wavelength (e.g., green light) is intensified.

With such a structure, the light-emitting layer included in the light-emitting device 130 need not be formed separately for different colors of the subpixels; thus, color display with high color reproducibility can be performed using light-emitting devices with the same structure.

[Manufacturing Method Example of Display Device]

Next, a manufacturing method example of the display device is described with reference to FIG. 10 to FIG. 13. FIG. 10A to FIG. 10D each illustrate a cross-sectional view taken along dashed-dotted line X1-X2, a cross-sectional view taken along Y1-Y2, and a cross-sectional view taken along Y3-Y4 in FIG. 1A side by side. FIG. 11 to FIG. 13 are similar to FIG. 10.

Note that thin films included in the display device (insulating films, semiconductor films, conductive films, and the like) can be formed by a sputtering method, a chemical vapor deposition (CVD) method, a vacuum evaporation method, a pulsed laser deposition (PLD) method, an ALD method, or the like. Examples of the CVD method include a plasma-enhanced chemical vapor deposition (PECVD: Plasma Enhanced CVD) method and a thermal CVD method. As an example of the thermal CVD method, a metal organic chemical vapor deposition (MOCVD: Metal Organic CVD) method can be given.

The thin films that form the display device (insulating films, semiconductor films, conductive films, and the like) can be formed by a method such as spin coating, dipping, spray coating, ink-jetting, dispensing, screen printing, offset printing, a doctor knife, slit coating, roll coating, curtain coating, or knife coating.

For manufacture of the light-emitting device, a vacuum process such as an evaporation method or a solution process such as a spin coating method or an ink-jet method can be especially used. As the evaporation method, a physical vapor deposition method (PVD method) such as a sputtering method, an ion plating method, an ion beam evaporation method, a molecular beam evaporation method, or a vacuum evaporation method, a chemical vapor deposition method (CVD method), and the like can be given. In particular, the functional layers (e.g., the hole-injection layer, the hole-transport layer, the light-emitting layer, the electron-transport layer, and the electron-injection layer) included in the EL layers can be formed by an evaporation method (e.g., a vacuum evaporation method), a coating method (e.g., a dip coating method, a die coating method, a bar coating method, a spin coating method, or a spray coating method), a printing method (e.g., an ink-jet method, a screen printing (stencil) method, an offset printing (planography) method, a flexography (relief printing) method, a gravure printing method, or a micro-contact printing method), or the like.

When the thin films that form the display device are processed, a photolithography method or the like can be used. Alternatively, a nanoimprinting method, a sandblasting method, a lift-off method, or the like may be used for the processing of the thin films. Island-shaped thin films may be directly formed by a deposition method using a shielding mask such as a metal mask.

There are two typical examples of a photolithography method. In one of the methods, a resist mask is formed over a thin film that is to be processed, the thin film is processed by etching or the like, and the resist mask is removed. In the other method, after a photosensitive thin film is deposited, exposure and development are performed, so that the thin film is processed into a desired shape.

As the light used for exposure in the photolithography method, for example, an i-line (with a wavelength of 365 nm), a g-line (with a wavelength of 436 nm), an h-line (with a wavelength of 405 nm), or combined light of any of them can be used. Besides, ultraviolet light, KrF laser light, ArF laser light, or the like can be used. Exposure may be performed by a liquid immersion exposure technique. Furthermore, as the light used for the exposure, extreme ultraviolet (EUV) light or X-rays may be used. Furthermore, instead of the light used for the exposure, an electron beam can also be used. It is preferable to use extreme ultraviolet light, X-rays, or an electron beam because extremely minute processing can be performed. Note that in the case of performing exposure by scanning of a beam such as an electron beam, a photomask need not be used.

For etching of the thin film, a dry etching method, a wet etching method, a sandblasting method, or the like can be used.

Figure 10A:
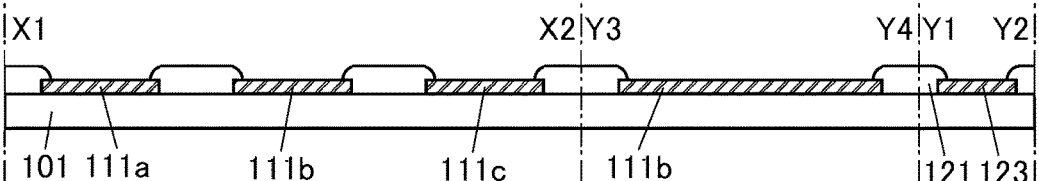
FIG. 10A to FIG. 10D are diagrams illustrating a manufacturing method example of a display device.

As illustrated in FIG. 10A, the pixel electrodes 111a, 111b, and 111c and the conductive layer 123 are formed over the layer 101 including transistors. Each of the pixel electrodes is provided in the display portion, and the conductive layer 123 is provided in the connection portion 140.

Next, the insulator 121 that covers the end portions of the pixel electrodes 111a, 111b, and 111c and an end portion of the conductive layer 123 is formed.

Figure 10B:
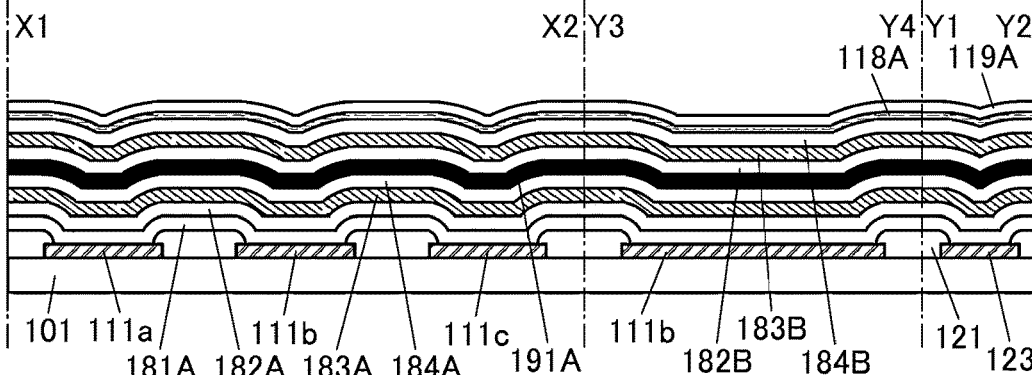

As illustrated in FIG. 10B, a first hole-injection layer 181A, a first hole-transport layer 182A, a first light-emitting layer 183A, a first electron-transport layer 184A, an intermediate layer 191A, a second hole-transport layer 182B, a second light-emitting layer 183B, and a second electron-transport layer 184B are formed in this order over each of the pixel electrodes and over the insulator 121; a first sacrificial layer 118A is formed over the second electron-transport layer 184B; and a second sacrificial layer 119A is formed over the first sacrificial layer 118A.

Although an example in which each of the first hole-injection layer 181A, the first hole-transport layer 182A, the first light-emitting layer 183A, the first electron-transport layer 184A, the intermediate layer 191A, the second hole-transport layer 182B, the second light-emitting layer 183B, the second electron-transport layer 184B, the first sacrificial layer 118A, and the second sacrificial layer 119A is provided over the conductive layer 123 is illustrated in the cross-sectional view taken along Y1-Y2 in FIG. 10B, the present invention is not limited thereto.

For example, the first hole-injection layer 181A, the first hole-transport layer 182A, the first light-emitting layer 183A, the first electron-transport layer 184A, the intermediate layer 191A, the second hole-transport layer 182B, the second light-emitting layer 183B, the second electron-transport layer 184B, and the first sacrificial layer 118A need not overlap with the conductive layer 123. Furthermore, end portions of the first hole-injection layer 181A, the first hole-transport layer 182A, the first light-emitting layer 183A, the first electron-transport layer 184A, the intermediate layer 191A, the second hole-transport layer 182B, the second light-emitting layer 183B, and second electron-transport layer 184B on the connection portion 140 side may be positioned inward from end portions of the first sacrificial layer 118A and the second sacrificial layer 119A. For example, by using a mask for specifying a deposition area (also referred to as an area mask, a rough metal mask, or the like), the region in which the first hole-injection layer 181A, the first hole-transport layer 182A, the first light-emitting layer 183A, the first electron-transport layer 184A, the intermediate layer 191A, the second hole-transport layer 182B, the second light-emitting layer 183B, and the second electron-transport layer 184B are deposited can be different from the region in which the first sacrificial layer 118A and the second sacrificial layer 119A are deposited. In one embodiment of the present invention, the light-emitting device is formed using a resist mask; by using a combination of a resist mask and an area mask as described above, the light-emitting device can be formed in a relatively simple process.

Materials that can be used for the pixel electrodes are as described above. For formation of the pixel electrodes, a sputtering method or a vacuum evaporation method can be used, for example.

As described above, the insulator 121 can have a single-layer structure or a stacked-layer structure including one or both of an inorganic insulating film and an organic insulating film.

The first hole-injection layer 181A, the first hole-transport layer 182A, the first light-emitting layer 183A, the first electron-transport layer 184A, the intermediate layer 191A, the second hole-transport layer 182B, the second light-emitting layer 183B, and the second electron-transport layer 184B are layers to be the first hole-injection layer 181a, the first hole-transport layer 182a, the first light-emitting layer 183a, the first electron-transport layer 184a, the intermediate layer 191, the second hole-transport layer 182b, the second light-emitting layer 183b, and the second electron-transport layer 184b, respectively. For this reason, structures applicable to the first hole-injection layer 181a, the first hole-transport layer 182a, the first light-emitting layer 183a, the first electron-transport layer 184a, the intermediate layer 191, the second hole-transport layer 182b, the second light-emitting layer 183b, and the second electron-transport layer 184b can be employed.

The first hole-injection layer 181A, the first hole-transport layer 182A, the first light-emitting layer 183A, the first electron-transport layer 184A, the intermediate layer 191A, the second hole-transport layer 182B, the second light-emitting layer 183B, and the second electron-transport layer 184B can be formed by an evaporation method (including a vacuum evaporation method), a transfer method, a printing method, an inkjet method, a coating method, or the like. Furthermore, the first hole-injection layer 181A, the first hole-transport layer 182A, the first light-emitting layer 183A, the first electron-transport layer 184A, the intermediate layer 191A, the second hole-transport layer 182B, the second light-emitting layer 183B, and the second electron-transport layer 184B may be formed using a premix material. Note that in this specification and the like, a premix material is a composite material in which a plurality of materials are combined or mixed in advance.

Although this embodiment illustrates an example in which the sacrificial layer is formed with a two-layer structure of the first sacrificial layer and the second sacrificial layer, the sacrificial layer may have a single-layer structure or a stacked-layer structure of three or more layers. As the sacrificial layer, a film that is highly resistant to the processing conditions of the first hole-injection layer 181A, the first hole-transport layer 182A, the first light-emitting layer 183A, the first electron-transport layer 184A, the intermediate layer 191A, the second hole-transport layer 182B, the second light-emitting layer 183B, and the second electron-transport layer 184B, specifically, a film having high etching selectivity, is used.

The sacrificial layer can be formed by a sputtering method, an ALD method (a thermal ALD method or a PEALD method), or a vacuum evaporation method, for example. Note that a formation method that gives less damage to an EL layer is preferred, and an ALD method or a vacuum evaporation method is more suitable for the formation of the sacrificial layer than a sputtering method.

As the sacrificial layer, a film that can be removed by a wet etching method is preferably used. The use of a wet etching method can reduce damage to the first hole-injection layer 181A, the first hole-transport layer 182A, the first light-emitting layer 183A, the first electron-transport layer 184A, the intermediate layer 191A, the second hole-transport layer 182B, the second light-emitting layer 183B, and the second electron-transport layer 184B in the processing of the sacrificial layer, as compared with the case of using a dry etching method.

In the manufacturing method of the display device of this embodiment, it is preferred that the functional layers (the hole-injection layer, the hole-transport layer, the light-emitting layer, the active layer, the electron-transport layer, and the like) included in the light-emitting device not be easily processed in the step of processing the sacrificial layers, and that the sacrificial layers not be easily processed in the step of processing the functional layers. The materials and the processing method for the sacrificial layers and the processing method for the functional layers are preferably selected in consideration of the above.

The sacrificial layer can be formed using an inorganic film such as a metal film, an alloy film, a metal oxide film, a semiconductor film, or an inorganic insulating film, for example.

For the sacrificial layer, a metal material such as gold, silver, platinum, magnesium, nickel, tungsten, chromium, molybdenum, iron, cobalt, copper, palladium, titanium, aluminum, yttrium, zirconium, or tantalum or an alloy material containing the metal material can be used.

For the sacrificial layer, a metal oxide such as In—Ga—Zn oxide can be used. As the sacrificial layer, an In—Ga—Zn oxide film can be formed by a sputtering method, for example. It is also possible to use indium oxide, In—Zn oxide, In—Sn oxide, indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like. Alternatively, indium tin oxide containing silicon or the like can also be used.

Note that an element M (M is one or more selected from aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) may be used instead of gallium described above.

As the sacrificial layer, a variety of inorganic insulating films that can be used as the protective layer 131 can be used. In particular, an oxide insulating film is preferable because its adhesion to the EL layer is higher than that of a nitride insulating film. For example, an inorganic insulating material such as aluminum oxide, hafnium oxide, or silicon oxide can be used for the sacrificial layer. As the sacrificial layer, an aluminum oxide film can be formed by an ALD method, for example. The ALD method is preferably used because damage to a base layer (particularly the EL layer or the like) can be reduced.

For example, the sacrificial layer can employ a stacked-layer structure of an In—Ga—Zn oxide film formed by a sputtering method and an aluminum oxide film formed over the In—Ga—Zn oxide film by an ALD method. Alternatively, the sacrificial layer can employ a stacked-layer structure of an aluminum oxide film formed by an ALD method and an In—Ga—Zn oxide film formed over the aluminum oxide film by a sputtering method. Alternatively, the sacrificial layer can employ a single-layer structure of an aluminum oxide film formed by an ALD method.

Figure 10C:
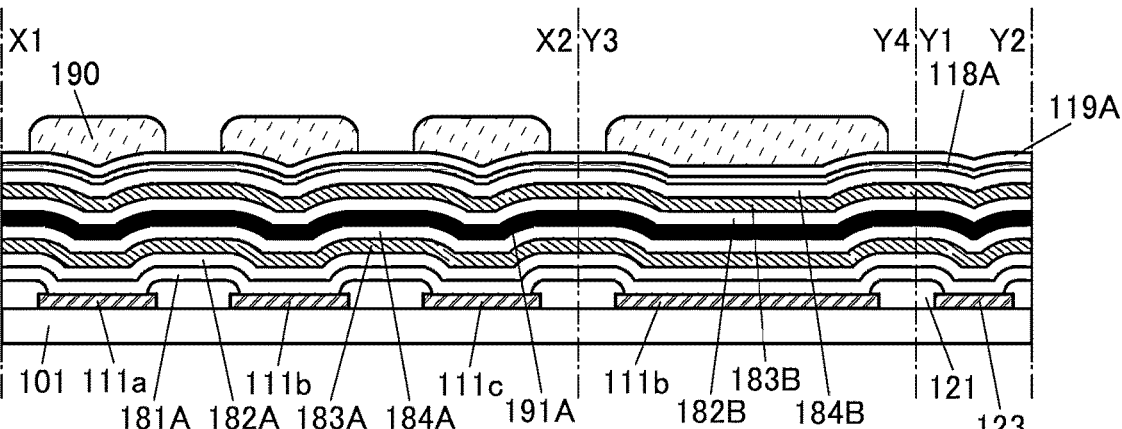

Next, a resist mask 190 is formed over the second sacrificial layer 119A as illustrated in FIG. 10C. The resist mask can be formed by application of a photosensitive resin (photoresist), exposure, and development. The resist mask 190 is provided at a position overlapping with the pixel electrodes 111a, 111b, and 111c. The resist mask 190 preferably does not overlap with the conductive layer 123.

Figure 10D:
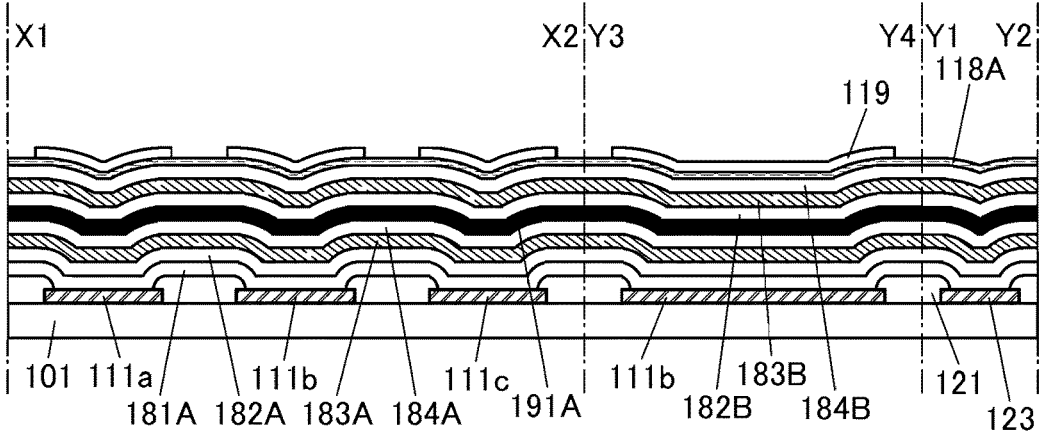

Then, part of the second sacrificial layer 119A is removed using the resist mask 190 as illustrated in FIG. 10D. Accordingly, a region of the second sacrificial layer 119A that does not overlap with the resist mask 190 can be removed. Thus, a second sacrificial layer 119 remains in positions overlapping with the pixel electrodes 111a, 111b, and 111c. After that, the resist mask 190 is removed.

Figure 11A:
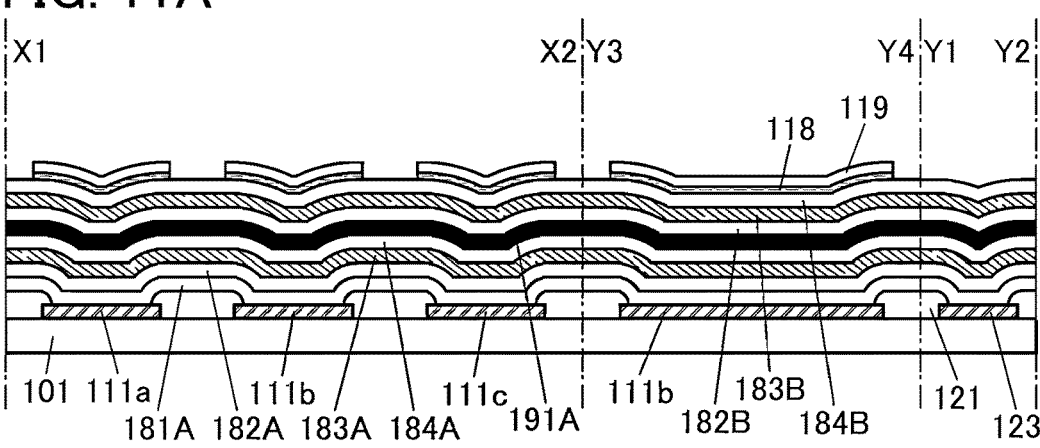
FIG. 11A to FIG. 11C are diagrams illustrating a manufacturing method example of a display device.

Next, part of the first sacrificial layer 118A is removed using the second sacrificial layer 119 as illustrated in FIG. 11A. Accordingly, a region of the first sacrificial layer 118A that does not overlap with the second sacrificial layer 119 can be removed. Thus, a stacked-layer structure of a first sacrificial layer 118 and the second sacrificial layer 119 remains in positions overlapping with the pixel electrodes 111a, 111b, and 111c.

Figure 11B:
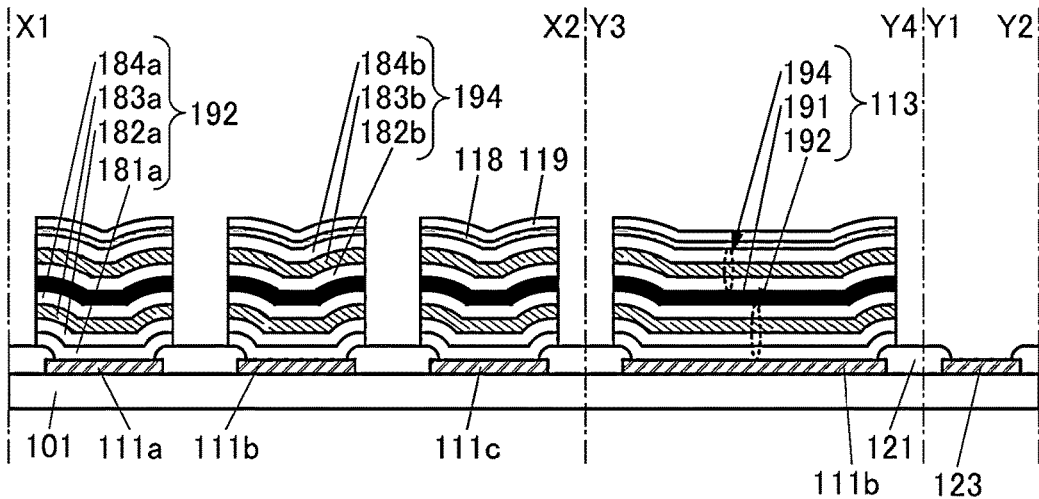

Next, part of the first hole-injection layer 181A, part of the first hole-transport layer 182A, part of the first light-emitting layer 183A, part of the first electron-transport layer 184A, part of the intermediate layer 191A, part of the second hole-transport layer 182B, part of the second light-emitting layer 183B, and part of the second electron-transport layer 184B are removed using the first sacrificial layer 118 and the second sacrificial layer 119 as illustrated in FIG. 11B. Accordingly, the regions of the first hole-injection layer 181A, the first hole-transport layer 182A, the first light-emitting layer 183A, the first electron-transport layer 184A, the intermediate layer 191A, the second hole-transport layer 182B, the second light-emitting layer 183B, and the second electron-transport layer 184B that overlap with neither the first sacrificial layer 118 nor the second sacrificial layer 119 can be removed. Thus, the conductive layer 123 is exposed. Furthermore, a stacked-layer structure of the first hole-injection layer 181a, the first hole-transport layer 182a, the first light-emitting layer 183a, the first electron-transport layer 184a, the intermediate layer 191, the second hole-transport layer 182b, the second light-emitting layer 183b, the second electron-transport layer 184b, the first sacrificial layer 118, and the second sacrificial layer 119 remains over the pixel electrodes 111a, 111b, and 111c.

Note that a stacked-layer structure of the first hole-injection layer 181a, the first hole-transport layer 182a, the first light-emitting layer 183a, and the first electron-transport layer 184a is referred to as the first light-emitting unit 192 in some cases. A stacked-layer structure of the second hole-transport layer 182b, the second light-emitting layer 183b, and the second electron-transport layer 184b is referred to as the second light-emitting unit 194 in some cases. A stacked-layer structure of the first light-emitting unit 192, the intermediate layer 191, and the second light-emitting unit 194 is referred to as the first layer 113 in some cases.

The first sacrificial layer 118A and the second sacrificial layer 119A can be processed by a wet etching method or a dry etching method. The first sacrificial layer 118A and the second sacrificial layer 119A are preferably processed by anisotropic etching.

The use of a wet etching method can reduce damage to the first hole-injection layer 181A, the first hole-transport layer 182A, the first light-emitting layer 183A, the first electron-transport layer 184A, the intermediate layer 191A, the second hole-transport layer 182B, the second light-emitting layer 183B, and the second electron-transport layer 184B in the processing of the sacrificial layer, as compared with the case of using a dry etching method. In the case of using a wet etching method, it is preferable to use a developer, an aqueous solution of tetramethylammonium hydroxide (TMAH), dilute hydrofluoric acid, oxalic acid, phosphoric acid, acetic acid, nitric acid, a chemical solution containing a mixed solution thereof, or the like.

In the case of using a dry etching method, deterioration of the first hole-injection layer 181A, the first hole-transport layer 182A, the first light-emitting layer 183A, the first electron-transport layer 184A, the intermediate layer 191A, the second hole-transport layer 182B, the second light-emitting layer 183B, and the second electron-transport layer 184B can be inhibited by not using a gas containing oxygen as the etching gas. In the case of using a dry etching method, it is preferable to use a gas containing $CF_4$, $C_4F_8$, $SF_6$, $CHF_3$, $Cl_2$, $H_2O$, $BCl_3$, and a noble gas (also referred to as a rare gas) such as He as the etching gas, for example.

When the sacrificial layer has a stacked-layer structure, some of the layers are processed using the resist mask 190, the resist mask 190 is removed, and then the processed layers using the resist mask 190 can be used as a hard mask to process the remaining layers.

For example, the second sacrificial layer 119A is processed using the resist mask 190, and then the resist mask 190 is removed by ashing using oxygen plasma. At this time, the first sacrificial layer 118A is positioned on the outermost surface and the first hole-injection layer 181A, the first hole-transport layer 182A, the first light-emitting layer 183A, the first electron-transport layer 184A, the intermediate layer 191A, the second hole-transport layer 182B, the second light-emitting layer 183B, and the second electron-transport layer 184B are not exposed. Thus, in the step of removing the resist mask 190, damage to the first hole-injection layer 181A, the first hole-transport layer 182A, the first light-emitting layer 183A, the first electron-transport layer 184A, the intermediate layer 191A, the second hole-transport layer 182B, the second light-emitting layer 183B, and the second electron-transport layer 184B can be inhibited. Then, the first sacrificial layer 118A can be processed using the second sacrificial layer 119 as a hard mask and the first hole-injection layer 181A, the first hole-transport layer 182A, the first light-emitting layer 183A, the first electron-transport layer 184A, the intermediate layer 191A, the second hole-transport layer 182B, the second light-emitting layer 183B, and the second electron-transport layer 184B can be processed using the first sacrificial layer 118 and the second sacrificial layer 119 as a hard mask.

The first hole-injection layer 181A, the first hole-transport layer 182A, the first light-emitting layer 183A, the first electron-transport layer 184A, the intermediate layer 191A, the second hole-transport layer 182B, the second light-emitting layer 183B, and the second electron-transport layer 184B are preferably processed by anisotropic etching. Anisotropic dry etching is particularly preferable. As an etching gas, a gas containing nitrogen, a gas containing hydrogen, a gas containing a noble gas, a gas containing nitrogen and argon, a gas containing nitrogen and hydrogen, or the like is preferably used. By not using a gas containing oxygen as the etching gas, the first hole-injection layer 181A, the first hole-transport layer 182A, the first light-emitting layer 183A, the first electron-transport layer 184A, the intermediate layer 191A, the second hole-transport layer 182B, the second light-emitting layer 183B, and the second electron-transport layer 184B can be inhibited from deteriorating.

Here, part of the upper portion of the insulator 121 that does not overlap with the resist mask 190 is removed in some cases by the above etching treatment. In that case, the first depression is formed in the upper portion of the insulator 121 as illustrated in FIG. 7A. The first depression is formed in a region that does not overlap with the first layer 113.

Figure 11C:
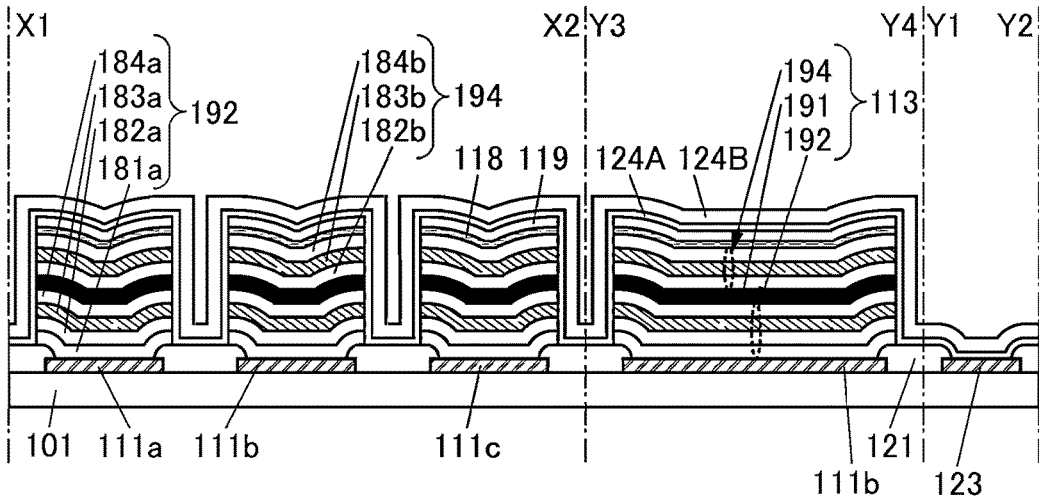

Next, an insulating film 124A is deposited to cover the first layer 113, the first sacrificial layer 118, and the second sacrificial layer 119 as illustrated in FIG. 11C. In addition, an insulating film 124B is deposited over the insulating film 124A. A material that can be used for the insulator 124a and the insulator 124 may be used for the insulating film 124A and the insulating film 124B.

Examples of methods for depositing the insulating film 124A and the insulating film 124B include a vacuum evaporation method, a sputtering method, a CVD method, and an ALD method. The insulating film 124A is preferably deposited by a method by which the first layer 113 is less damaged. The insulating film 124A and the insulating film 124B are each formed at a temperature lower than the upper temperature limit of the first layer 113. As the insulating film 124A, for example, an aluminum oxide film can be formed by an ALD method. The use of an ALD method is preferable because a film having high coverage can be deposited. For another example, as the insulating film 124B, a silicon oxynitride film or a silicon nitride film can be formed by a PECVD method or a sputtering method.

Figure 12A:
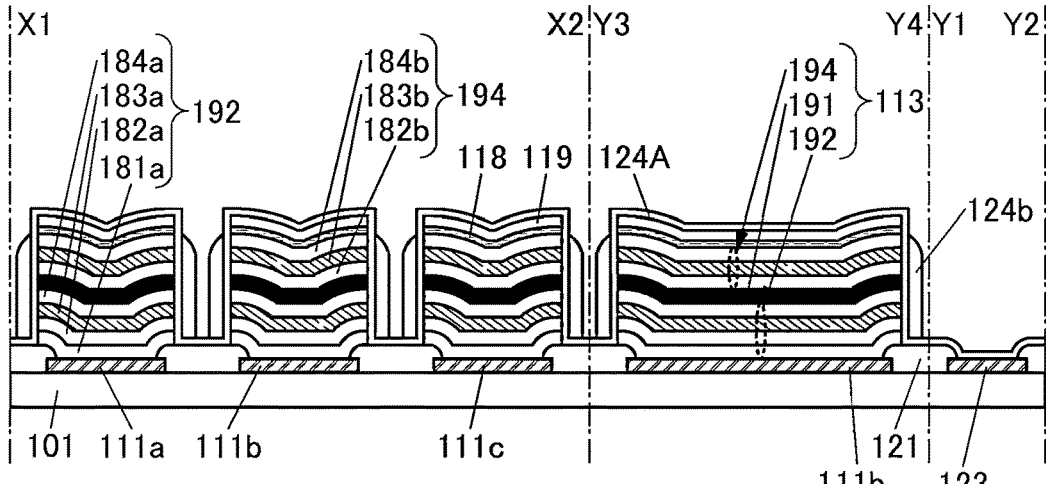
FIG. 12A to FIG. 12C are diagrams illustrating a manufacturing method example of a display device.

Next, the insulating film 124B is etched, whereby the insulator 124b is formed as illustrated in FIG. 12A. The insulating film 124B is preferably processed by anisotropic etching. Anisotropic dry etching is particularly preferable. For example, a gas containing $CF_4$, $C_4F_8$, $SF_6$, $CHF_3$, $Cl_2$, $H_2O$, $BCl_3$, and a noble gas such as He can be used as the etching gas.

Figure 12B:
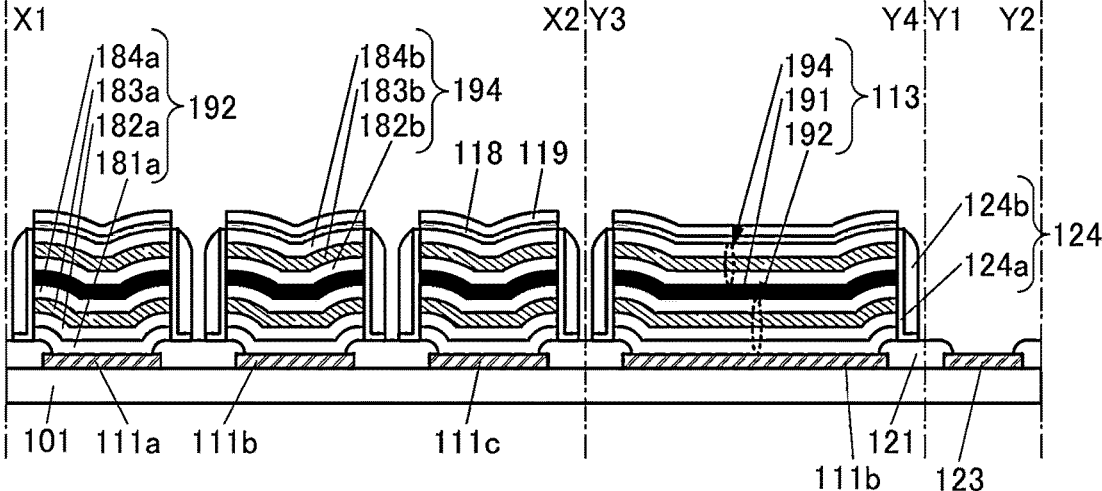

Next, the insulator 124a is formed by etching the insulating film 124A with the use of the insulator 124b as a hard mask as illustrated in FIG. 12B. The insulating film 124A is preferably processed by a wet etching method. The use of a wet etching method can reduce damage to the second sacrificial layer 119 and the like in the processing of the insulator 124a, as compared with the case of using a dry etching method. In the case of using a wet etching method, it is preferable to use a developer, an aqueous solution of tetramethylammonium hydroxide (TMAH), dilute hydrofluoric acid, oxalic acid, phosphoric acid, acetic acid, nitric acid, a chemical solution containing a mixed solution thereof, for example.

In this manner, the insulator 124 in which the insulator 124b is stacked over the insulator 124a can be formed. A side surface of the insulator 124 is in contact with the first layer 113 and the bottom surface of the insulator 124 is in contact with the insulator 121. Thus, a short circuit in the light-emitting device 130 due to contact between the second layer 114 or the common electrode 115 that is to be formed later and a side surface of the pixel electrode 111 or the side surface of the first layer 113 can be inhibited. In addition, damage to the first layer 113 in a later step can be inhibited.

Here, part of the upper portion of the insulator 121 that does not overlap with the insulator 124 is removed in some cases by the above etching treatment. In that case, the second depression is formed in the upper portion of the insulator 121 as illustrated in FIG. 7A. The second depression is formed in a region that does not overlap with the insulator 124 inside the first depression.

Figure 12C:
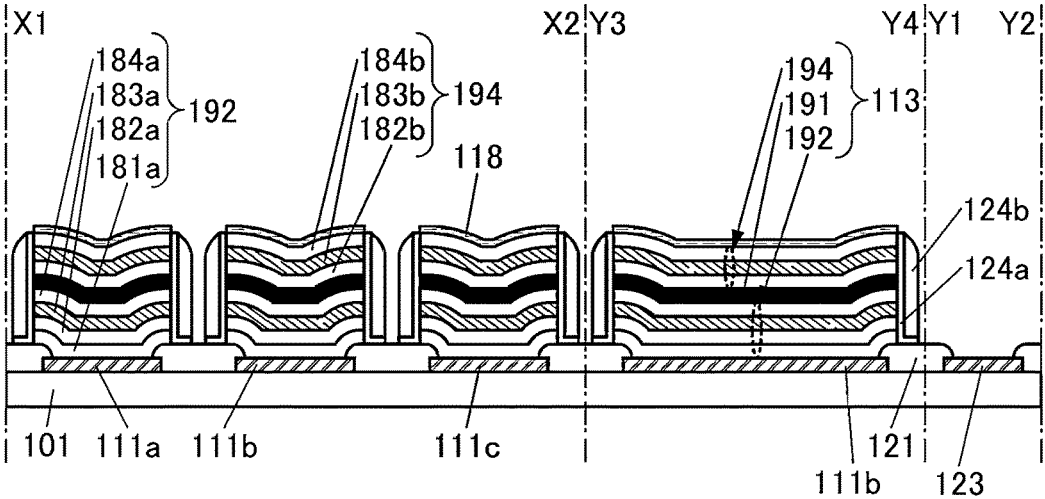
Figure 13A:
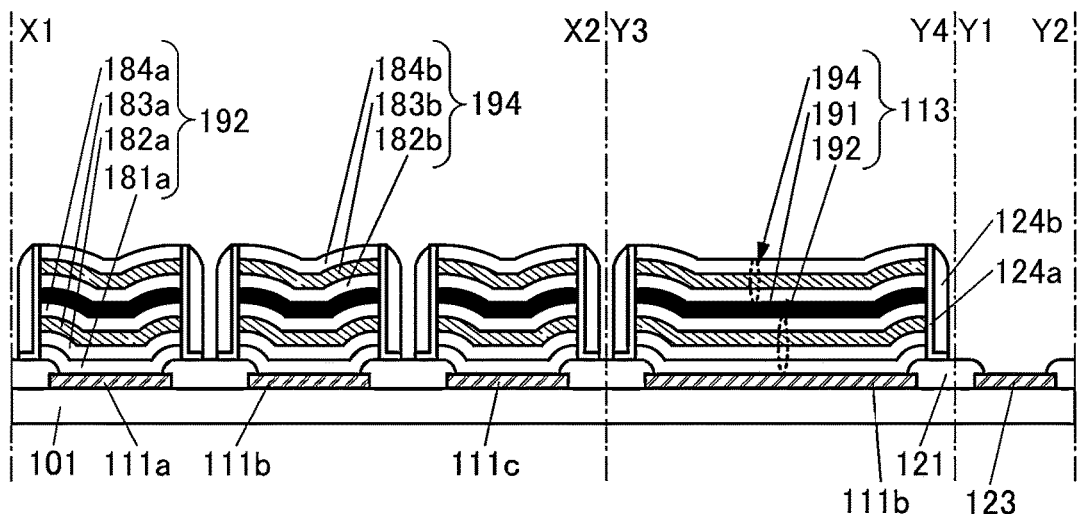
FIG. 13A and FIG. 13B are diagrams illustrating a manufacturing method example of a display device.

Next, the second sacrificial layer 119 is removed as illustrated in FIG. 12C. Furthermore, the first sacrificial layer 118 is removed as illustrated in FIG. 13A. Accordingly, the second electron-transport layer 184b is exposed over the pixel electrode 111 and the conductive layer 123 is exposed in the connection portion 140.

The step of removing the sacrificial layers can be performed by a method similar to that for the step of processing the sacrificial layers. In particular, the use of a wet etching method can reduce damage to the first layer 113, the conductive layer 123, and the insulator 124 at the time of removing the sacrificial layers, as compared with the case of using a dry etching method.

Figure 13B:
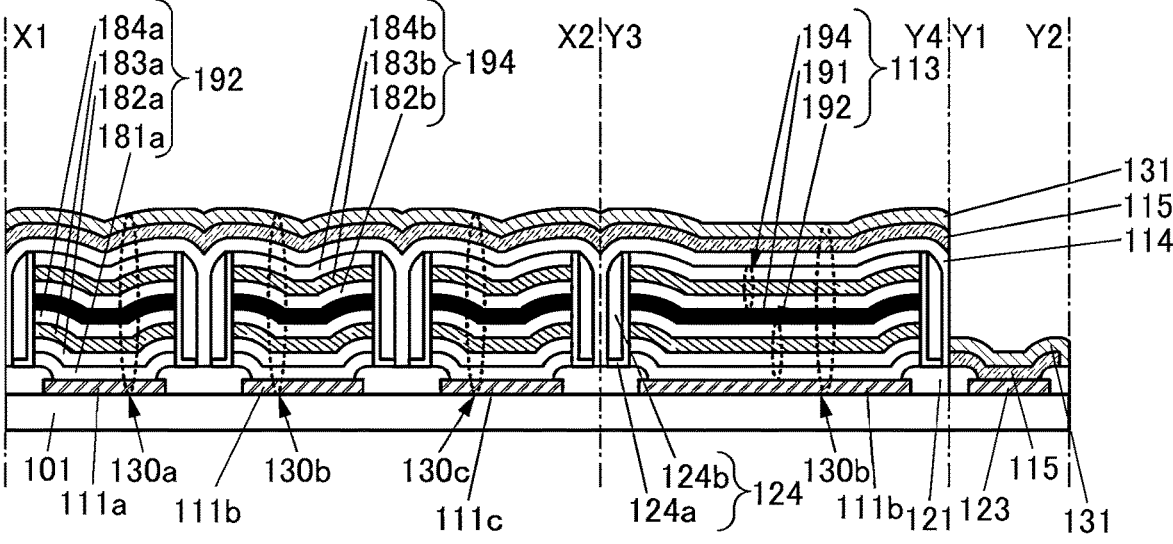

Next, the second layer 114 is formed to cover the first layer 113, the conductive layer 123, the insulator 124, and the insulator 121, and the common electrode 115 is formed over the second layer 114, the insulator 121, and the conductive layer 123 as illustrated in FIG. 13B.

Materials that can be used for the second layer 114 are as described above. Layers included in the second layer 114 can each be formed by a method such as an evaporation method (including a vacuum evaporation method), a transfer method, a printing method, an inkjet method, a coating method, or the like. The layers that form the second layer 114 may be formed using a premix material. Note that the second layer 114 is not necessarily provided when not needed.

Materials that can be used for the common electrode 115 are as described above. For formation of the common electrode 115, a sputtering method or a vacuum evaporation method can be used, for example.

Next, the protective layer 131 is formed over the common electrode 115 as illustrated in FIG. 13B.

Materials that can be used for the protective layer 131 are as described above. Examples of methods for depositing the protective layer 131 include a vacuum evaporation method, a sputtering method, a CVD method, and an ALD method. The protective layer 131 may have a single-layer structure or a stacked-layer structure. For example, the protective layer 131 may have a stacked-layer structure of two layers which are formed by using different deposition methods from each another.

Next, the coloring layers 125a, 125b, and 125c are formed over the protective layer 131 so as to have a region overlapping with the pixel electrodes 111a, 111b, and 111c, respectively. The coloring layer 125a, the coloring layer 125b, and the coloring layer 125c can each be formed in a desired position by an inkjet method, an etching method using a photolithography method, or the like. Specifically, the coloring layer 125 (the coloring layer 125a, the coloring layer 125b, or the coloring layer 125c) can be formed in the corresponding pixel.

Then, the substrate 120 is bonded onto the protective layer 131 with the use of the resin layer 122, whereby the display device 100 illustrated in FIG. 1B can be manufactured.

As described above, in the manufacturing method of the display device of this embodiment, the island-shaped EL layer is formed not by using a pattern of a metal mask but by processing an EL layer deposited over the entire surface; thus, the island-shaped EL layer can be formed to have a uniform thickness. In addition, a high-resolution display device or a display device having a high aperture ratio, which had been difficult to achieve, can be achieved.

The display device of one embodiment of the present invention includes a light-emitting device with a tandem structure. The side surfaces of the pixel electrode, the light-emitting layer, the carrier-transport layer, the carrier-injection layer, and the intermediate layer included in the light-emitting device are covered with the sidewall-shaped insulator and the embankment-shaped insulator. With such a structure, a short circuit in the light-emitting device can be inhibited because contact between the common electrode or the like and the side surfaces of the pixel electrode, the light-emitting layer, the carrier-transport layer, the carrier-injection layer, and the intermediate layer is inhibited.

This embodiment can be combined with the other embodiments as appropriate. In the case where a plurality of structure examples are described in one embodiment in this specification, the structure examples can be combined as appropriate.

Embodiment 2

In this embodiment, a display device of one embodiment of the present invention is described with reference to FIG. 14 to FIG. 16.

The display device in this embodiment can be a high-definition display device or large-sized display device. Accordingly, the display device of this embodiment can be used for display portions of a digital camera, a digital video camera, a digital photo frame, a mobile phone, a portable game console, a portable information terminal, and an audio reproducing device, in addition to display portions of electronic devices with a relatively large screen, such as a television device, a desktop or laptop personal computer, a monitor of a computer or the like, digital signage, and a large game machine such as a pachinko machine.

[Display Device 100A]

Figure 14:
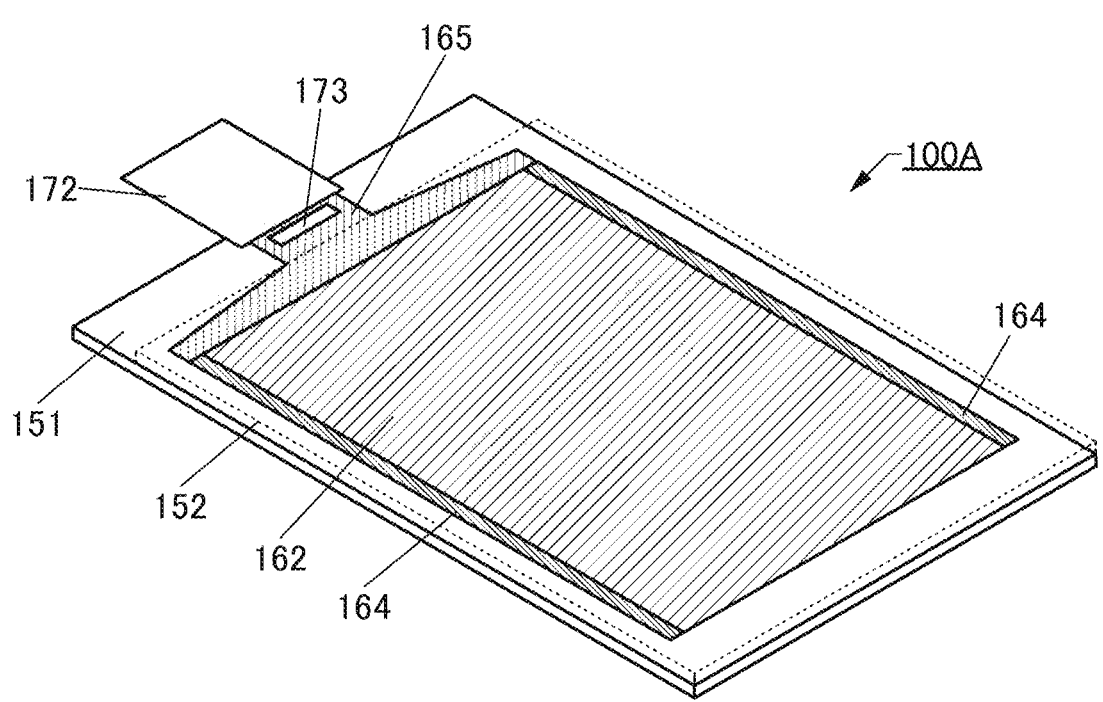
FIG. 14 is a perspective view illustrating an example of a display device.
Figures 15A, 15B, 15C:
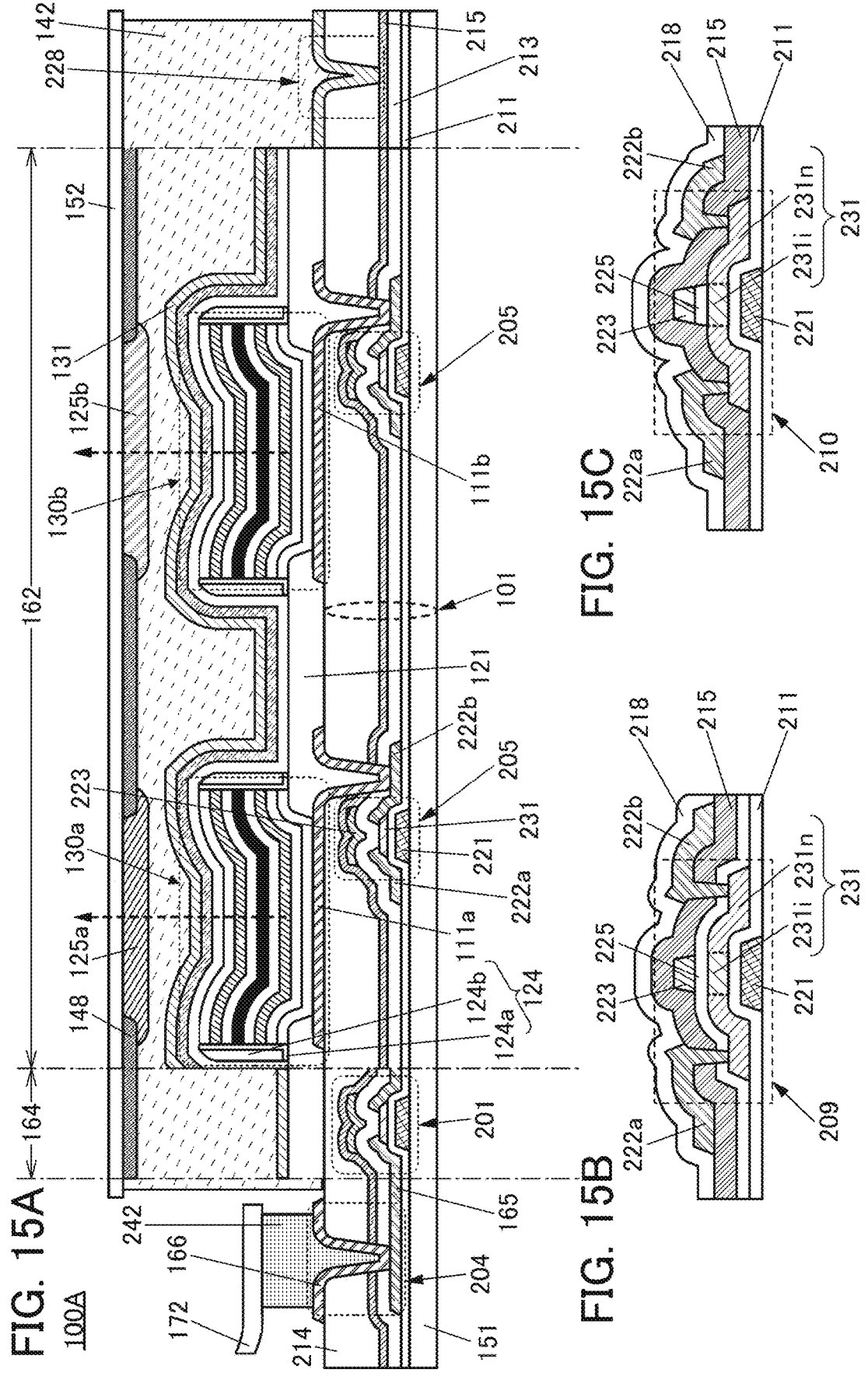
FIG. 15A is a cross-sectional view illustrating an example of a display device.
FIG. 15B and FIG. 15C are cross-sectional views illustrating examples of transistors.
Figure 16:
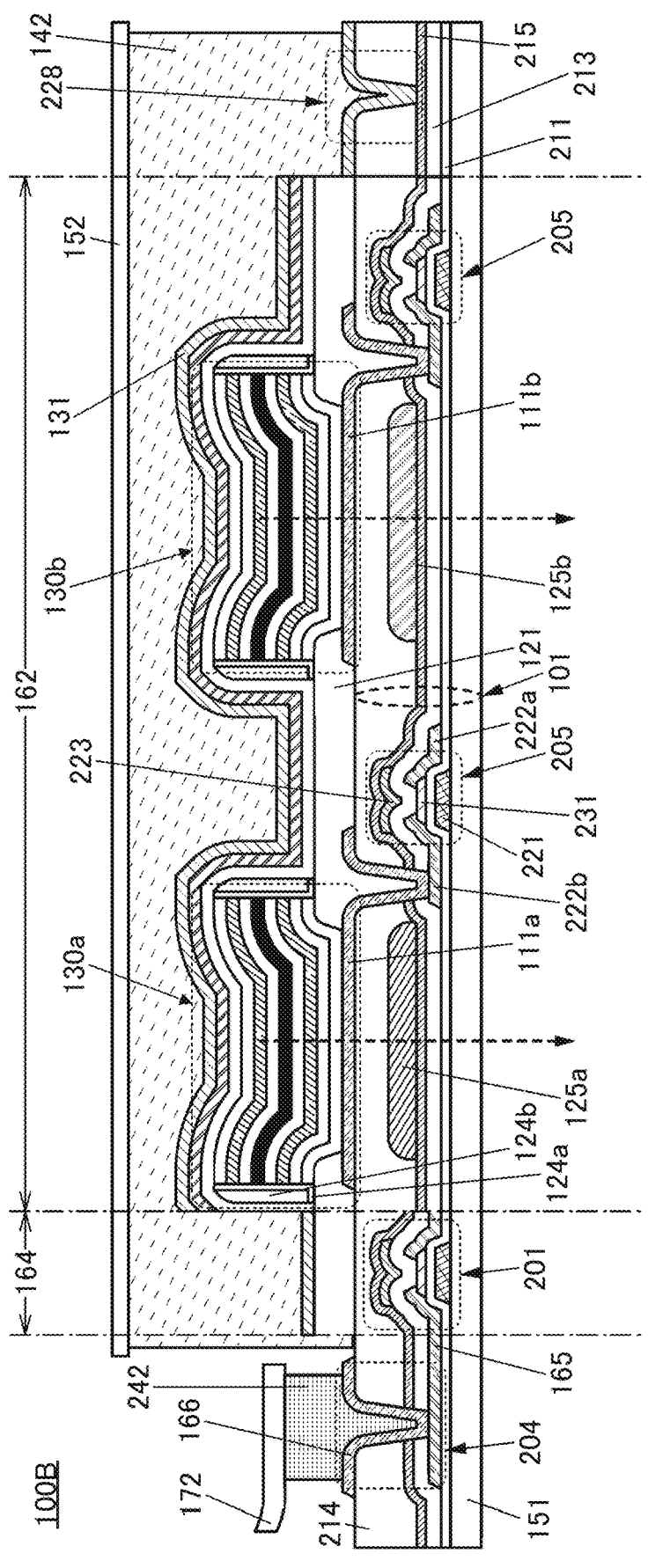
FIG. 16 is a cross-sectional view illustrating an example of a display device.

FIG. 14 is a perspective view of a display device 100A, and FIG. 15A is a cross-sectional view of the display device 100A.

The display device 100A has a structure where a substrate 152 and a substrate 151 are bonded to each other. In FIG. 14, the substrate 152 is denoted by a dashed line.

The display device 100A includes a display portion 162, a circuit 164, a wiring 165, and the like. FIG. 14 illustrates an example in which an IC 173 and an FPC 172 are mounted on the display device 100A. Thus, the structure illustrated in FIG. 14 can be regarded as a display module including the display device 100A, the IC (integrated circuit), and the FPC.

As the circuit 164, a scan line driver circuit can be used, for example.

The wiring 165 has a function of supplying a signal and power to the display portion 162 and the circuit 164. The signal and power are input to the wiring 165 from the outside through the FPC 172 or input to the wiring 165 from the IC 173.

FIG. 14 illustrates an example in which the IC 173 is provided over the substrate 151 by a COG (Chip On Glass) method, a COF (Chip On Film) method, or the like. An IC including a scan line driver circuit, a signal line driver circuit, or the like can be used as the IC 173, for example. Note that the display device 100A and the display module are not necessarily provided with an IC. The IC may be mounted on the FPC by a COF method or the like.

FIG. 15A illustrates an example of cross sections of part of a region including the FPC 172, part of the circuit 164, part of the display portion 162, and part of a region including an end portion of the display device 100A.

The display device 100A illustrated in FIG. 15A includes a transistor 201, a transistor 205, the light-emitting device 130a, the light-emitting device 130b, the coloring layer 125a, the coloring layer 125b, and the like between the substrate 151 and the substrate 152. The light-emitting device 130a and the light-emitting device 130b emit white light. The coloring layer 125a and the coloring layer 125b have a function of transmitting light of different colors from each another. Although two kinds of coloring layers are illustrated in FIG. 15A, more kinds of coloring layers can be provided in the display device 100A.

In the case where a pixel of the display device includes three kinds of subpixels including the coloring layers 125 transmitting light of different colors from one another, the three subpixels can be of three colors of R, G, and B or of three colors of yellow (Y), cyan (C), and magenta (M). In the case where four subpixels are included, the four subpixels can be of four colors of R, G, B, and white (W) or of four colors of R, G, B, and Y.

The protective layer 131 and the substrate 152 are bonded to each other with an adhesive layer 142. A solid sealing structure, a hollow sealing structure, or the like can be employed to seal the light-emitting devices. In FIG. 15A, a hollow sealing structure is employed in which a space between the substrate 152 and the substrate 151 is filled with the adhesive layer 142. Alternatively, a hollow sealing structure in which the space is filled with an inert gas (e.g., nitrogen or argon) may be employed. The adhesive layer 142 may be provided not to overlap with the light-emitting device. The space may be filled with a resin different from that of the frame-like adhesive layer 142.

The light-emitting device 130a has a stacked-layer structure similar to that of the light-emitting device 130a illustrated in FIG. 1B, and the light-emitting device 130b has a stacked-layer structure similar to that of the light-emitting device 130b illustrated in FIG. 1B. Embodiment 1 can be referred to for the details of the light-emitting device. The insulator 124 is formed in contact with the side surface of the light-emitting device 130a and the side surface of the light-emitting device 130b. The protective layer 131 is formed to cover the light-emitting devices 130a and 130b, the insulator 124, and the insulator 121.

The pixel electrode 111a is connected to a conductive layer 222b included in the transistor 205 through an opening provided in an insulating layer 214. Similarly, the pixel electrode 111b is also electrically connected to one of a source electrode and a drain electrode of the transistor 205 through an opening provided in the insulating layer 214.

A region that includes the end portions of the pixel electrodes 111a and 111b is covered with the insulator 121. The pixel electrodes 111a and 111b contain a material that reflects visible light, and the common electrode 115 contains a material that transmits visible light.

Light from the light-emitting device is emitted toward the substrate 152. Thus, for the substrate 152, a material having a high visible-light-transmitting property is preferably used.

A stacked-layer structure including the substrate 151 and the components thereover up to the insulating layer 214 corresponds to the layer 101 including transistors in Embodiment 1.

The transistor 201 and the transistor 205 are formed over the substrate 151. These transistors can be fabricated using the same material in the same step.

An insulating layer 211, an insulating layer 213, an insulating layer 215, and the insulating layer 214 are provided in this order over the substrate 151. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or two or more.

A material through which impurities such as water and hydrogen do not easily diffuse is preferably used for at least one of the insulating layers covering the transistors. This enables the insulating layer to function as a barrier insulating film. Such a structure can effectively inhibit diffusion of impurities into the transistors from the outside and enhance the reliability of a display device.

An inorganic insulating film is preferably used as each of the insulating layer 211, the insulating layer 213, and the insulating layer 215. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

Here, an organic insulating film often has a lower barrier property than an inorganic insulating film. Therefore, the organic insulating film preferably has an opening in the vicinity of an end portion of the display device 100A. This can inhibit entry of impurities from the end portion of the display device 100A through the organic insulating film. Alternatively, the organic insulating film may be formed so that its end portion is positioned on the inner side compared to the end portion of the display device 100A, to prevent the organic insulating film from being exposed at the end portion of the display device 100A.

In a region 228 illustrated in FIG. 15A, an opening is formed in the insulating layer 214. This can inhibit entry of impurities into the display portion 162 from the outside through the insulating layer 214 even when an organic insulating film is used as the insulating layer 214. Consequently, the reliability of the display device 100A can be enhanced.

Each of the transistor 201 and the transistor 205 includes a conductive layer 221 functioning as a gate, the insulating layer 211 functioning as a gate insulating layer, a conductive layer 222a and the conductive layer 222b functioning as a source and a drain, a semiconductor layer 231, the insulating layer 213 functioning as a gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display device of this embodiment. For example, a planar transistor, a staggered transistor, or an inverted staggered transistor can be used. Either of a top-gate transistor structure and a bottom-gate transistor structure can be used. Alternatively, gates may be provided above and below a semiconductor layer where a channel is formed.

The structure in which the semiconductor layer where a channel is formed is provided between two gates is used for the transistor 201 and the transistor 205. The two gates may be connected to each other and supplied with the same signal to operate the transistor. Alternatively, the threshold voltage of the transistor may be controlled by applying a potential for controlling the threshold voltage to one of the two gates and a potential for driving to the other of the two gates.

There is no particular limitation on the crystallinity of a semiconductor material used for the transistor, and an amorphous semiconductor or a semiconductor having crystallinity (a microcrystalline semiconductor, a polycrystalline semiconductor, a single crystal semiconductor, or a semiconductor partly including crystal regions) can be used. A semiconductor having crystallinity is preferably used because deterioration of the transistor characteristics can be inhibited.

It is preferable that a semiconductor layer of a transistor contain a metal oxide (also referred to as an oxide semiconductor). That is, a transistor including a metal oxide in its channel formation region (hereinafter, also referred to as an OS transistor) is preferably used for the display device of this embodiment. Alternatively, a semiconductor layer of a transistor may contain silicon. Examples of silicon include amorphous silicon and crystalline silicon (e.g., low-temperature poly silicon or single crystal silicon).

The semiconductor layer preferably contains indium, M (M is one or more selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more selected from aluminum, gallium, yttrium, and tin.

It is particularly preferable that an oxide containing indium (In), gallium (Ga), and zinc (Zn) (also referred to as IGZO) be used as the semiconductor layer.

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio.

For example, when the atomic ratio is described as In:Ga:Zn=4:2:3 or a composition in the neighborhood thereof, the case is included where the atomic ratio of Ga is greater than or equal to 1 and less than or equal to 3 and the atomic ratio of Zn is greater than or equal to 2 and less than or equal to 4 with the atomic ratio of In being 4. When the atomic ratio is described as In:Ga:Zn=5:1:6 or a composition in the neighborhood thereof, the case is included where the atomic ratio of Ga is greater than 0.1 and less than or equal to 2 and the atomic ratio of Zn is greater than or equal to 5 and less than or equal to 7 with the atomic ratio of In being 5. When the atomic ratio is described as In:Ga:Zn=1:1:1 or a composition in the neighborhood thereof, the case is included where the atomic ratio of Ga is greater than 0.1 and less than or equal to 2 and the atomic ratio of Zn is greater than 0.1 and less than or equal to 2 with the atomic ratio of In being 1.

The transistor included in the circuit 164 and the transistor included in the display portion 162 may have the same structure or different structures. One structure or two or more kinds of structures may be employed for a plurality of transistors included in the circuit 164. Similarly, one structure or two or more kinds of structures may be employed for a plurality of transistors included in the display portion 162.

FIG. 15B and FIG. 15C illustrate other structure examples of transistors.

A transistor 209 and a transistor 210 each include the conductive layer 221 functioning as a gate, the insulating layer 211 functioning as a gate insulating layer, the semiconductor layer 231 including a channel formation region 231*i* and a pair of low-resistance regions 231*n*, the conductive layer 222*a* connected to one of the low-resistance regions 231*n*, the conductive layer 222*b* connected to the other low-resistance region 231*n*, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231*i*. The insulating layer 225 is positioned at least between the conductive layer 223 and the channel formation region 231*i*. Furthermore, an insulating layer 218 covering the transistor may be provided.

FIG. 15B illustrates an example of the transistor 209 in which the insulating layer 225 covers a top surface and a side surface of the semiconductor layer 231. The conductive layer 222*a* and the conductive layer 222*b* are connected to the corresponding low-resistance regions 231*n* through openings provided in the insulating layer 225 and the insulating layer 215. One of the conductive layer 222*a* and the conductive layer 222*b* functions as a source, and the other functions as a drain.

In the transistor 210 illustrated in FIG. 15C, the insulating layer 225 overlaps with the channel formation region 231*i* of the semiconductor layer 231 and does not overlap with the low-resistance regions 231*n*. The structure illustrated in FIG. 15C is obtained by processing the insulating layer 225 with the conductive layer 223 as a mask, for example. In FIG. 15C, the insulating layer 215 is provided to cover the insulating layer 225 and the conductive layer 223, and the conductive layer 222*a* and the conductive layer 222*b* are connected to the low-resistance regions 231*n* through the openings in the insulating layer 215.

A connection portion 204 is provided in a region of the substrate 151 where the substrate 152 does not overlap. In the connection portion 204, the wiring 165 is electrically connected to the FPC 172 through a conductive layer 166 and a connection layer 242. The conductive layer 166 is a conductive film obtained by processing the same conductive film as the pixel electrode. On a top surface of the connection portion 204, the conductive layer 166 is exposed. Thus, the connection portion 204 and the FPC 172 can be electrically connected to each other through the connection layer 242.

A light-blocking layer 148 is preferably provided on a surface of the substrate 152 on the substrate 151 side. In addition, the coloring layers 125*a* and 125*b* may be provided on the surface of the substrate 152 on the substrate 151 side. In FIG. 15A, when the substrate 152 is considered as a reference, the coloring layers 125a and 125b are provided to cover part of the light-blocking layer 148.

A variety of optical members can be arranged on the outer surface of the substrate 152. Examples of the optical members include a polarizing plate, a retardation plate, a light diffusion layer (e.g., a diffusion film), an anti-reflective layer, and a light-condensing film. Furthermore, an antistatic film preventing the attachment of dust, a water repellent film suppressing the attachment of stain, a hard coat film suppressing generation of a scratch caused by the use, an impact-absorbing layer, or the like may be arranged on the outer surface of the substrate 152.

The protective layer 131 provided to cover the light-emitting device prevents an impurity such as water from entering the light-emitting device. As a result, the reliability of the light-emitting device can be enhanced.

In the region 228 in the vicinity of the end portion of the display device 100A, the insulating layer 215 and the protective layer 131 are preferably in contact with each other through an opening in the insulating layer 214. In particular, the inorganic insulating films are preferably in contact with each other. This can inhibit entry of impurities into the display portion 162 from the outside through the organic insulating film. Consequently, the reliability of the display device 100A can be enhanced.

For each of the substrate 151 and the substrate 152, glass, quartz, ceramics, sapphire, a resin, a metal, an alloy, a semiconductor, or the like can be used. The substrate on the side from which light from the light-emitting device is extracted is formed using a material that transmits the light. When the substrate 151 and the substrate 152 are formed using a flexible material, the flexibility of the display device can be increased and a flexible display can be achieved. Furthermore, a polarizing plate may be used as the substrate 151 or the substrate 152.

For the substrate 151 and the substrate 152, any of the following can be used, for example: polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass that is thin enough to have flexibility may be used for one or both of the substrate 151 and the substrate 152.

In the case where a circularly polarizing plate overlaps with the display device, a highly optically isotropic substrate is preferably used as the substrate included in the display device. A highly optically isotropic substrate has a low birefringence (in other words, a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of the film having high optical isotropy include a triacetyl cellulose (TAC, also referred to as cellulose triacetate) film, a cycloolefin polymer (COP) film, a cycloolefin copolymer (COC) film, and an acrylic film.

When a film is used for the substrate and the film absorbs water, the shape of the display panel might be changed, e.g., creases are generated. Thus, for the substrate, a film with a low water absorption rate is preferably used. For example, the water absorption rate of the film is preferably 1% or lower, further preferably 0.1% or lower, still further preferably 0.01% or lower.

As the adhesive layer 142, any of a variety of curable adhesives such as a reactive curable adhesive, a thermosetting curable adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. A two-component-mixture-type resin may be used. An adhesive sheet or the like may be used.

As the connection layer 242, an anisotropic conductive film (ACF), an anisotropic conductive paste (ACP), or the like can be used.

As materials for the gates, the source, and the drain of a transistor and conductive layers such as a variety of wirings and electrodes included in the display device, any of metals such as aluminum, titanium, chromium, nickel, copper, yttrium, zirconium, molybdenum, silver, tantalum, and tungsten, or an alloy containing any of these metals as its main component can be used, for example. A single-layer structure or a stacked-layer structure including a film containing any of these materials can be used.

As a light-transmitting conductive material, a conductive oxide such as indium oxide, indium tin oxide, indium zinc oxide, zinc oxide, or zinc oxide containing gallium, or graphene can be used. It is also possible to use a metal material such as gold, silver, platinum, magnesium, nickel, tungsten, chromium, molybdenum, iron, cobalt, copper, palladium, or titanium; or an alloy material containing any of these metal materials. Alternatively, a nitride of the metal material (e.g., titanium nitride) or the like may be used. Note that in the case of using the metal material or the alloy material (or the nitride thereof), the thickness is preferably set small enough to transmit light. Alternatively, a stacked film of any of the above materials can be used for the conductive layers. For example, a stacked film of indium tin oxide and an alloy of silver and magnesium is preferably used because conductivity can be increased. They can also be used for conductive layers such as wirings and electrodes included in the display device, and conductive layers (e.g., a conductive layer functioning as a pixel electrode or a common electrode) included in a light-emitting device.

Examples of insulating materials that can be used for the insulating layers include a resin such as an acrylic resin or an epoxy resin, and an inorganic insulating material such as silicon oxide, silicon oxynitride, silicon nitride oxide, silicon nitride, or aluminum oxide.

Although an example in which the display device 100A has a top-emission structure in which light is emitted toward the substrate 152 side is illustrated in FIG. 15A, the present invention is not limited thereto. For example, as in a display device 100B illustrated in FIG. 16, the display device may have a bottom-emission structure in which light is emitted toward the substrate 151 side.

The display device 100B is different from the display device 100A in that the coloring layers 125a and 125b are provided between the insulating layer 213 and the insulating layer 214. The coloring layers 125a and 125b are provided to overlap with the light-emitting devices 130a and 130b, respectively.

In addition, the display device 100B is different from the display device 100A in that the pixel electrodes 111a and 111*b* contain a material that transmits visible light and the common electrode 115 contains a material that reflects visible light. Here, the conductive layer 166 that is obtained by processing the same conductive film as the pixel electrodes 111*a* and 111*b* also contains a material that transmits visible light.

In the display device 100B, a material having a high visible-light-transmitting property is used for the substrate 151.

With the above structure, light emitted from the light-emitting layers of the light-emitting devices 130*a* and 130*b* passes through the respective pixel electrodes 111*a* and 111*b* and the respective coloring layers 125*a* and 125*b* and is emitted from the substrate 151 side.

At least part of this embodiment can be appropriately implemented in combination with the other embodiments described in this specification.

Embodiment 3

In this embodiment, a structure example of a display module including the display device of one embodiment of the present invention will be described.

Figure 17A:
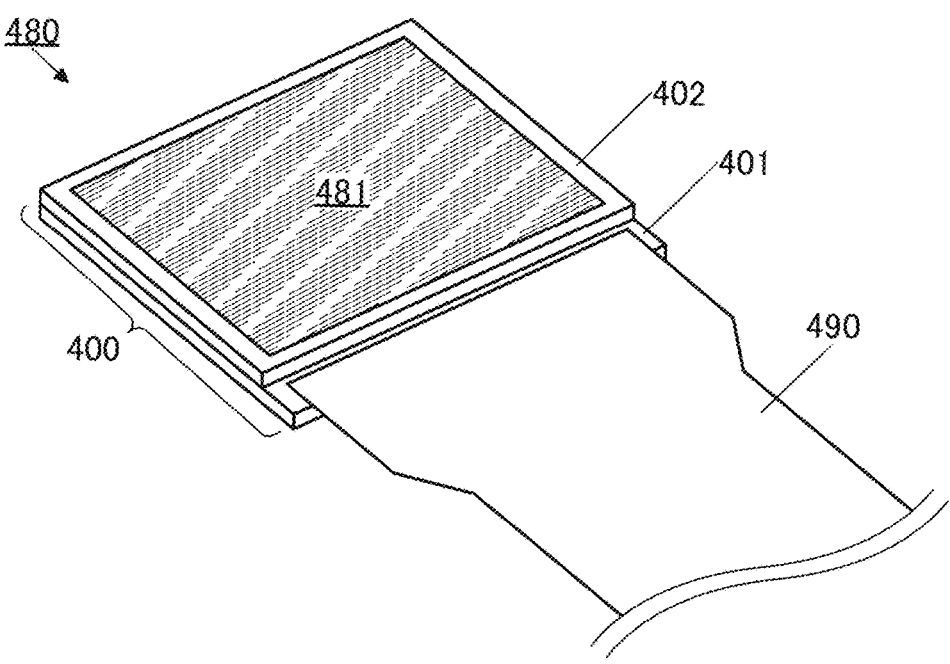
FIG. 17A and FIG. 17B are diagrams illustrating a structure example of a display module.

FIG. 17A is a schematic perspective view of a display module 480. The display module 480 includes a display device 400 and an FPC 490.

The display module 480 includes a substrate 401 and a substrate 402. A display portion 481 is also included on the substrate 402 side. The display portion 481 is a region of the display module 480 where an image is displayed and is a region where light emitted from pixels provided in a pixel portion 484 described later can be seen.

Figure 17B:
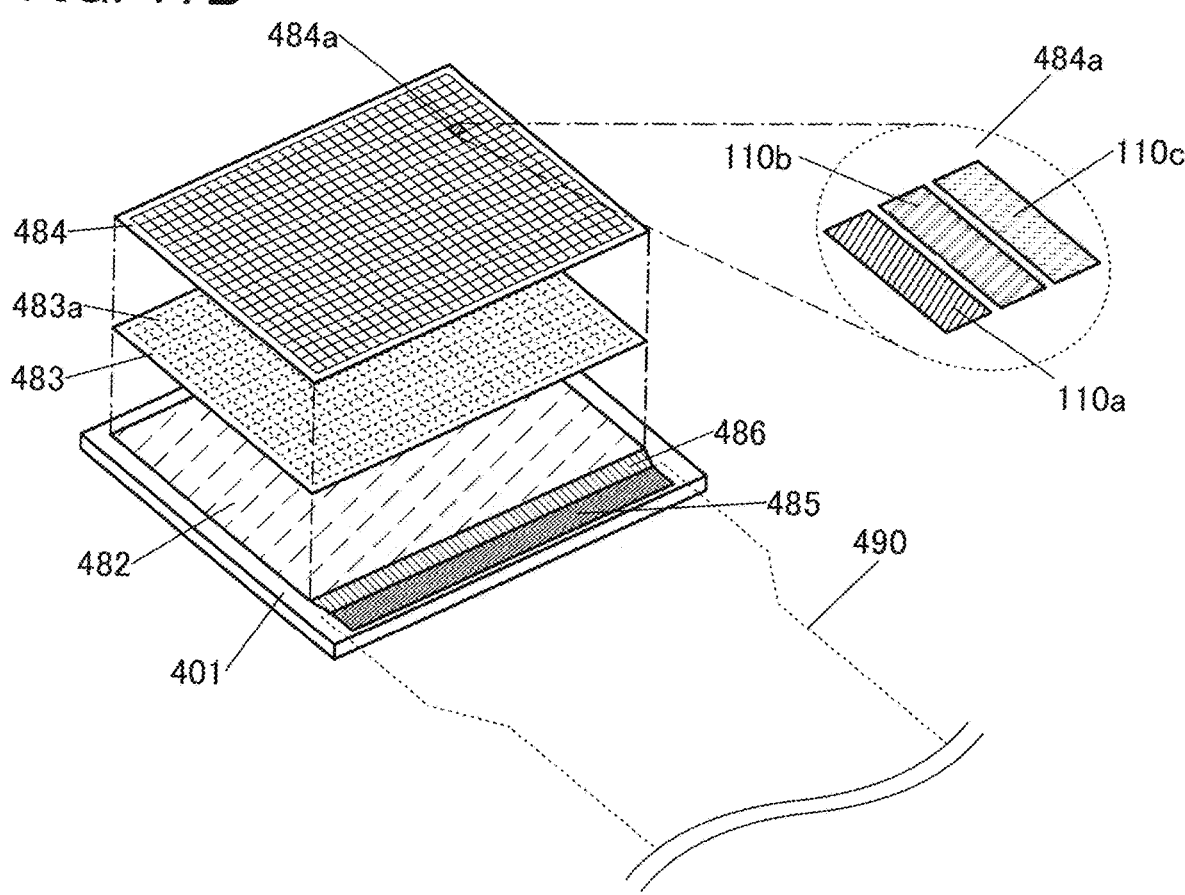

FIG. 17B illustrates a perspective view schematically illustrating a structure on the substrate 401 side. The substrate 401 has a structure in which a circuit portion 482, a pixel circuit portion 483 over the circuit portion 482, and the pixel portion 484 over the pixel circuit portion 483 are stacked. In addition, a terminal portion 485 for connection to the FPC 490 is included in a portion that is not overlapped with the pixel portion 484 over the substrate 401. Furthermore, the terminal portion 485 and the circuit portion 482 are electrically connected to each other through a wiring portion 486 formed of a plurality of wirings.

The pixel portion 484 includes a plurality of pixels 484*a* arranged periodically. An enlarged view of one pixel 484*a* is illustrated on the right side of FIG. 17B. The pixel 484*a* includes the subpixel 110*a*, the subpixel 110*b*, and the subpixel 110*c*. The foregoing embodiment can be referred to for the structures of the subpixel 110*a*, the subpixel 110*b*, and the subpixel 110*c* and their surroundings.

The pixel circuit portion 483 includes a plurality of pixel circuits 483*a* arranged periodically. The plurality of pixels 484*a* and the plurality of pixel circuits 483*a* may be arranged in a stripe arrangement as illustrated in FIG. 17B. Note that the plurality of pixels 484*a* and the plurality of pixel circuits 483*a* may be arranged in a delta arrangement or the like without limitation to the stripe arrangement.

One pixel circuit 483*a* is a circuit that controls light emission of three light-emitting elements included in one pixel 484*a*. One pixel circuit 483*a* may be provided with three circuits for controlling light emission of one light-emitting element. For example, the pixel circuit 483*a* for one light-emitting element can include at least one selection transistor, one current control transistor (driving transistor), and a capacitor. In this case, a gate signal is input to a gate of the selection transistor, and a source signal is input to one of a source and a drain of the selection transistor. With such a structure, an active-matrix display device is achieved.

The circuit portion 482 includes a circuit for driving the pixel circuits 483*a* in the pixel circuit portion 483. For example, a gate line driver circuit, a source line driver circuit, or the like is preferably included. In addition, an arithmetic circuit, a memory circuit, a power supply circuit, or the like may be included.

The FPC 490 functions as a wiring for supplying a video signal, a power supply potential, or the like to the circuit portion 482 from the outside. In addition, an IC may be mounted on the FPC 490.

The display module 480 can have a structure in which the pixel circuit portion 483, the circuit portion 482, and the like are stacked below the pixel portion 484; thus, the aperture ratio (the effective display area ratio) of the display portion 481 can be significantly high. For example, the aperture ratio of the display portion 481 can be higher than or equal to 40% and lower than 100%, preferably higher than or equal to 50% and lower than or equal to 95%, further preferably higher than or equal to 60% and lower than or equal to 95%. Furthermore, the pixels 484*a* can be arranged extremely densely and thus the display portion 481 can have extremely high resolution. For example, the pixels 484*a* are preferably arranged in the display portion 481 with a resolution higher than or equal to 2000 ppi, preferably higher than or equal to 3000 ppi, further preferably higher than or equal to 5000 ppi, still further preferably higher than or equal to 6000 ppi, and lower than or equal to 20000 ppi or lower than or equal to 30000 ppi.

Such a display module 480 has extremely high resolution, and thus can be suitably used for a device for VR, such as a head-mounted display, or a glasses-type device for AR. For example, even in the case of a structure in which the display portion of the display module 480 is seen through a lens, pixels of the extremely-high-resolution display portion 481 included in the display module 480 are not seen even when the display portion is enlarged by the lens, so that display providing a strong sense of immersion can be performed. Without limitation to the above, the display module 480 can also be suitably used for an electronic device having a comparatively small display portion. For example, the display module 480 can also be suitably used for a display portion of a wearable electronic device, such as a wrist-watch.

Structures of display devices (a display device 400A to a display device 400C) that can be employed for the above display device 400 are described below.

Structure Example 1

Figure 18:
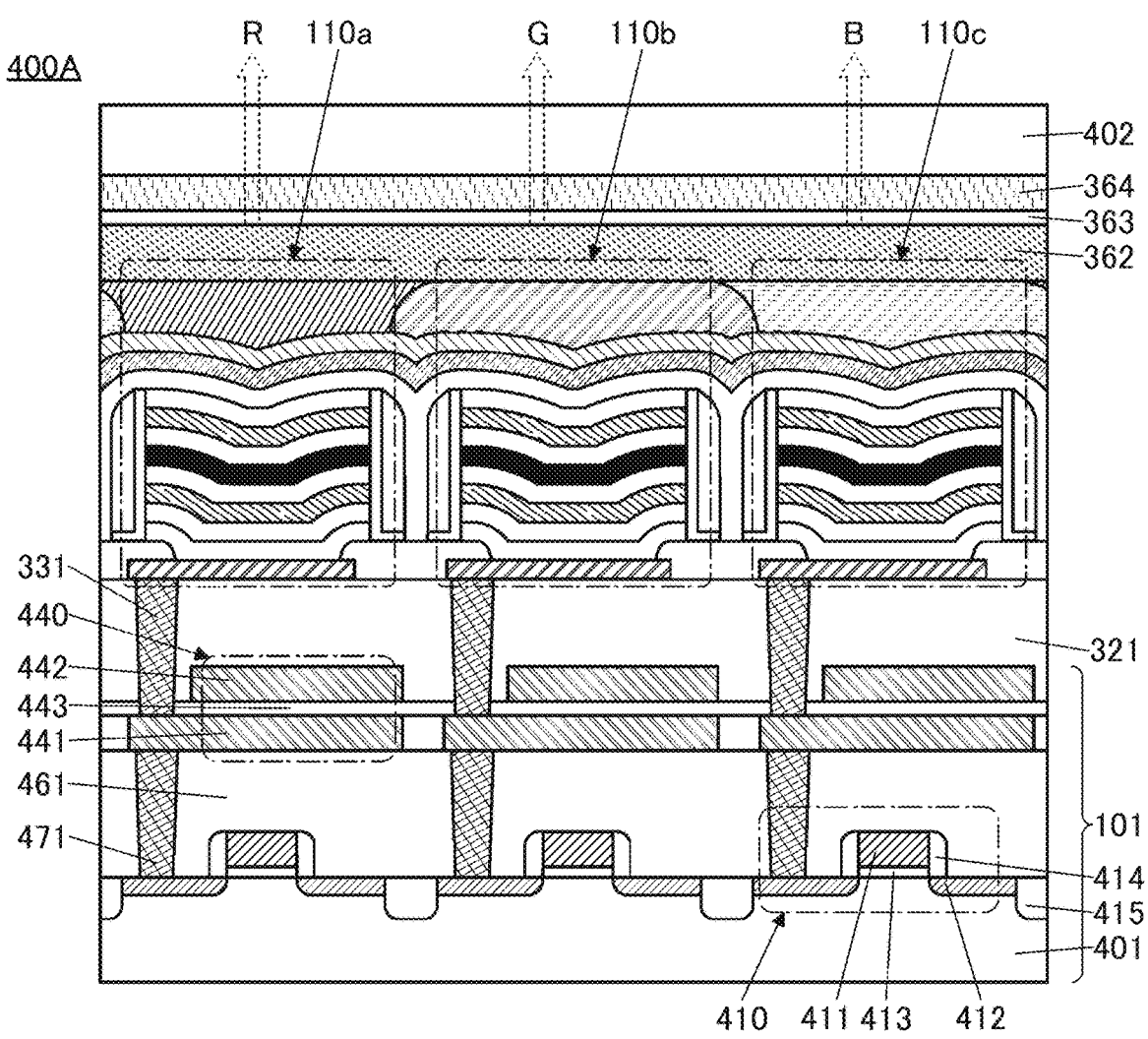
FIG. 18 is a diagram illustrating a structure example of a display device.

FIG. 18A is a schematic cross-sectional view of the display device 400A.

The display device 400A includes the substrate 401, the subpixel 110*a*, the subpixel 110*b*, the subpixel 110*c*, a capacitor 440, a transistor 410, and the like.

A stacked-layer structure including the substrate 401 and the components thereover up to the capacitor 440 corresponds to the layer 101 including transistors in Embodiment 1.

The transistor 410 is a transistor whose channel formation region is formed in the substrate 401. As the substrate 401, a semiconductor substrate such as a single crystal silicon substrate can be used, for example. The transistor 410 includes part of the substrate 401, a conductive layer 411, a low-resistance region 412, an insulating layer 413, an insulating layer 414, and the like. The conductive layer 411 functions as a gate electrode. The insulating layer 413 is positioned between the substrate 401 and the conductive layer 411 and functions as a gate insulating layer. The low-resistance region 412 is a region where the substrate 401 is doped with an impurity, and functions as one of a source and a drain. The insulating layer 414 is provided to cover a side surface of the conductive layer 411.

In addition, an element isolation layer 415 is provided between two adjacent transistors 410 to be embedded in the substrate 401.

Furthermore, an insulating layer 461 is provided to cover the transistor 410, and the capacitor 440 is provided over the insulating layer 461.

The capacitor 440 includes a conductive layer 441, a conductive layer 442, and an insulating layer 443 positioned therebetween. The conductive layer 441 functions as one electrode of the capacitor 440. The conductive layer 442 functions as the other electrode of the capacitor 440. The insulating layer 443 functions as a dielectric of the capacitor 440.

The conductive layer 441 is provided over the insulating layer 461 and is electrically connected to one of a source and a drain of the transistor 410 through a plug 471 embedded in the insulating layer 461. The insulating layer 443 is provided to cover the conductive layer 441. The conductive layer 442 is provided in a region that is overlapped with the conductive layer 441 with the insulating layer 443 therebetween.

An insulating layer 321 is provided to cover the capacitor 440. The subpixel 110a, the subpixel 110b, the subpixel 110c, and the like are provided over the insulating layer 321. The pixel electrodes of the subpixel 110a, the subpixel 110b, and the subpixel 110c are electrically connected to the conductive layer 441 through a plug 331 embedded in the insulating layer 321 and the insulating layer 443. Here, an example where the structure illustrated in FIG. 1B is used as the structure of the subpixel 110a, the subpixel 110b, the subpixel 110c, or the like; however, the structure is not limited thereto and a variety of structures illustrated above can be employed.

In the display device 400A, the protective layer 131, an insulating layer 362, and an insulating layer 363 are provided in this order to cover the common electrode 115 of the light-emitting elements of the subpixel 110a, the subpixel 110b, and the subpixel 110c. These three insulating layers each function as a protective layer that prevents diffusion of impurities such as water into the light-emitting elements of the subpixel 110a, the subpixel 110b, and the subpixel 110c. For the insulating layer 363, it is preferable to use an inorganic insulating film with low moisture permeability, such as a silicon oxide film, a silicon nitride film, or an aluminum oxide film. In addition, for the insulating layer 362, an organic insulating film having a high light-transmitting property can be used. Using an organic insulating film for the insulating layer 362 can reduce the influence of an uneven shape below the insulating layer 362, so that the formation surface of the insulating layer 363 can be a smooth surface. Accordingly, a defect such as a pinhole is less likely to be generated in the insulating layer 363, which leads to higher moisture permeability of the protective layer. Note that the structure of the protective layer covering the light-emitting elements of the subpixel 110a, the subpixel 110b, and the subpixel 110c is not limited thereto, and a single layer or a two-layer structure may be employed or a stacked-layer structure of four or more layers may be employed.

The display device 400A includes the substrate 402 on the viewing side. The substrate 402 and the substrate 401 are bonded to each other with a light-transmitting adhesive layer 364. As the substrate 402, a light-transmitting substrate, such as a glass substrate, a quartz substrate, a sapphire substrate, or a plastic substrate, can be used.

With such a structure, a display device with extremely high resolution and high display quality can be achieved.

Structure Example 2

Figure 19:
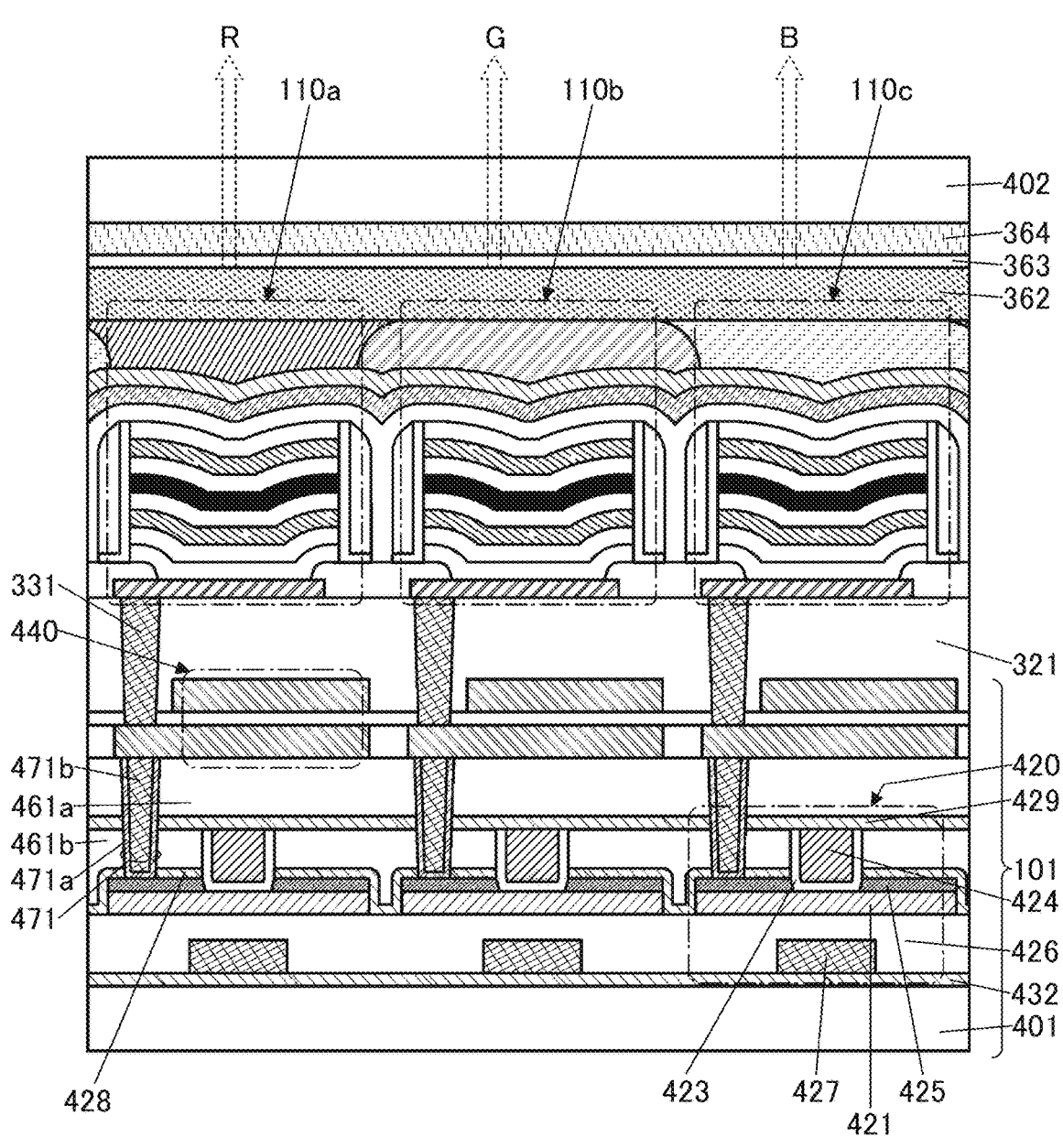
FIG. 19 is a diagram illustrating a structure example of a display device.

FIG. 19 is a schematic cross-sectional view of the display device 400B. The display device 400B differs from the display device 400A mainly in a transistor structure.

A transistor 420 is a transistor in which a metal oxide (also referred to as an oxide semiconductor) is used in a semiconductor layer where a channel is formed.

The transistor 420 includes a semiconductor layer 421, an insulating layer 423, a conductive layer 424, a pair of conductive layers 425, an insulating layer 426, a conductive layer 427, and the like.

As the substrate 401 over which the transistor 420 is provided, the above insulating substrate or semiconductor substrate can be used.

An insulating layer 432 is provided over the substrate 401. The insulating layer 432 functions as a barrier layer that prevents diffusion of impurities such as water or hydrogen from the substrate 401 into the transistor 420 and release of oxygen from the semiconductor layer 421 to the insulating layer 432 side. For the insulating layer 432, a film in which hydrogen or oxygen is less likely to be diffused than in a silicon oxide film such as an aluminum oxide film, a hafnium oxide film, or a silicon nitride film can be used, for example.

The conductive layer 427 is provided over the insulating layer 432, and the insulating layer 426 is provided to cover the conductive layer 427. The conductive layer 427 functions as a first gate electrode of the transistor 420, and part of the insulating layer 426 functions as a first gate insulating layer. For the insulating layer 426 at least in a portion in contact with the semiconductor layer 421, an oxide insulating film such as a silicon oxide film is preferably used. In addition, a top surface of the insulating layer 426 is preferably planarized.

The semiconductor layer 421 is provided over the insulating layer 426. The semiconductor layer 421 preferably includes a film of a metal oxide having semiconductor characteristics (also referred to as an oxide semiconductor). The material that can be suitably used for the semiconductor layer 421 is described in detail later.

The pair of conductive layers 425 is provided over and in contact with the semiconductor layer 421, and functions as a source electrode and a drain electrode.

In addition, an insulating layer 428 is provided to cover top surfaces and side surfaces of the pair of conductive layers 425, side surfaces of the semiconductor layer 421, and the like, and an insulating layer 461b is provided over the insulating layer 428. The insulating layer 428 functions as a barrier insulating film that prevents diffusion of impurities such as water or hydrogen from the insulating layer 461b or the like into the semiconductor layer 421 and release of oxygen from the semiconductor layer 421. For the insulating layer 428, an insulating film similar to the insulating layer 432 can be used.

An opening reaching the semiconductor layer 421 is provided in the insulating layer 428 and the insulating layer 461b. The insulating layer 423 that is in contact with the side surfaces of the insulating layer 461b, the insulating layer 428, and the conductive layer 425 and a top surface of the semiconductor layer 421, and the conductive layer 424 are embedded in the opening. The conductive layer 424 functions as a second gate electrode, and the insulating layer 423 functions as a second gate insulating layer.

A top surface of the conductive layer 424, a top surface of the insulating layer 423, and a top surface of the insulating layer 461b are subjected to planarization treatment so that they are substantially level with each other, and an insulating layer 429 and an insulating layer 461a are provided to cover these layers.

The insulating layer 461a and the insulating layer 461b function as an interlayer insulating layer. In addition, the insulating layer 429 functions as a barrier insulating film that prevents diffusion of impurities such as water or hydrogen from the insulating layer 461a or the like to the transistor 420. As the insulating layer 429, an insulating film similar to the above insulating layer 428 and the insulating layer 432 can be used.

The plug 471 electrically connected to one of the pair of conductive layers 425 is provided to be embedded in the insulating layer 461a, the insulating layer 429, and the insulating layer 461b. Here, the plug 471 preferably includes a conductive layer 471a covering side surfaces of the opening in the insulating layer 461a, the insulating layer 461b, the insulating layer 429, and the insulating layer 428, and part of a top surface of the conductive layer 425, and a conductive layer 471b in contact with a top surface of the conductive layer 471a. In this case, a conductive material in which hydrogen and oxygen are less likely to be diffused is preferably used for the conductive layer 471a.

Structure Example 3

Figure 20:
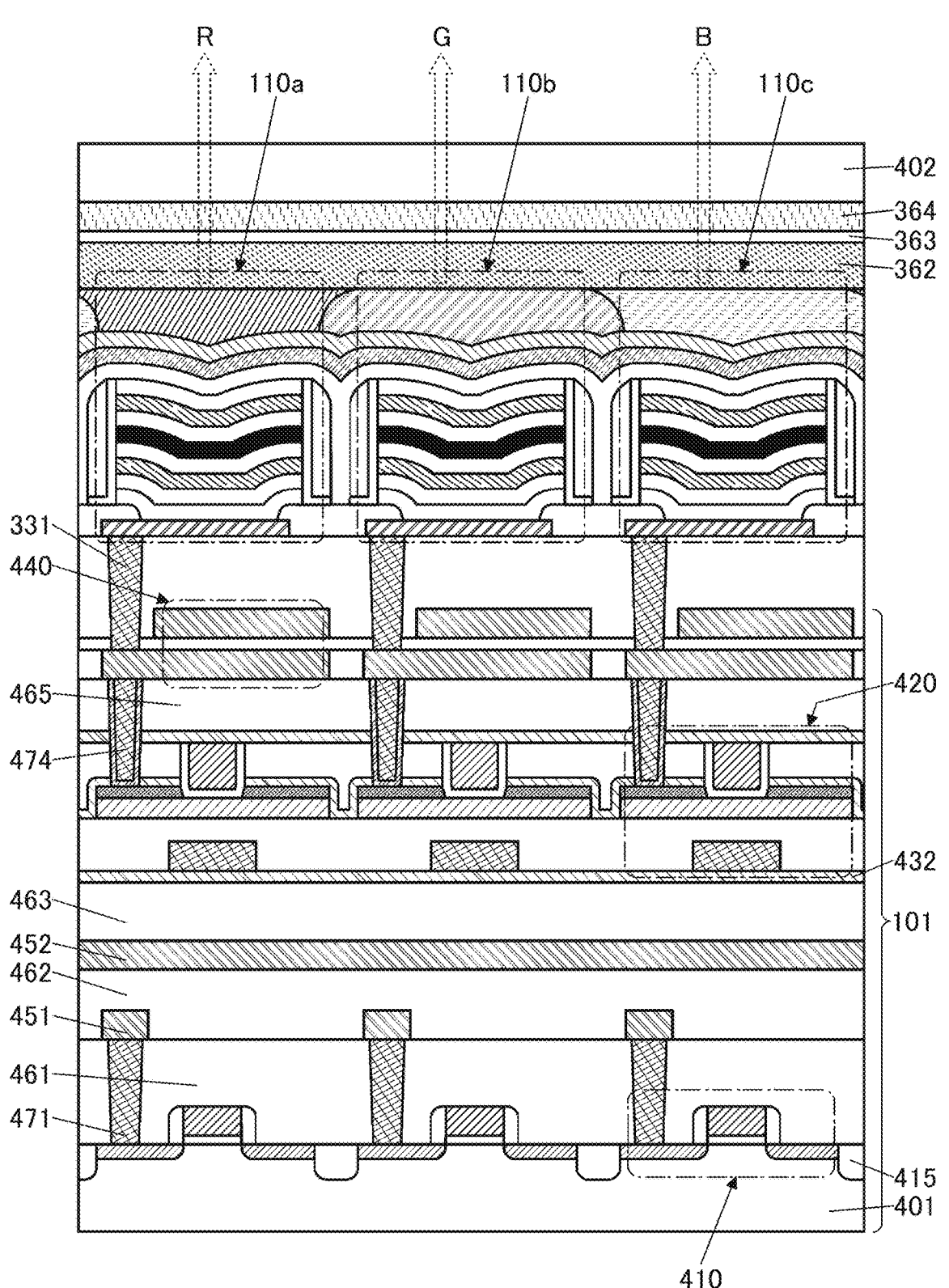
FIG. 20 is a diagram illustrating a structure example of a display device.

FIG. 20 is a schematic cross-sectional view of the display device 400C. The display device 400C has a structure in which the transistor 410 whose channel is formed in the substrate 401 and the transistor 420 including a metal oxide in the semiconductor layer where the channel is formed are stacked.

The insulating layer 461 is provided to cover the transistor 410, and a conductive layer 451 is provided over the insulating layer 461. In addition, an insulating layer 462 is provided to cover the conductive layer 451, and a conductive layer 452 is provided over the insulating layer 462. The conductive layer 451 and the conductive layer 452 each function as a wiring. In addition, an insulating layer 463 and the insulating layer 432 are provided to cover the conductive layer 452, and the transistor 420 is provided over the insulating layer 432. Furthermore, an insulating layer 465 is provided to cover the transistor 420, and the capacitor 440 is provided over the insulating layer 465. The capacitor 440 and the transistor 420 are electrically connected to each other through a plug 474.

The transistor 420 can be used as a transistor included in a pixel circuit. In addition, the transistor 410 can be used as a transistor included in a pixel circuit or a transistor included in a driver circuit (a gate line driver circuit or a source line driver circuit) for driving the pixel circuit. Furthermore, the transistor 410 and the transistor 420 can be used as transistors included in a variety of circuits such as an arithmetic circuit or a memory circuit.

With such a structure, not only the pixel circuit but also the driver circuit or the like can be formed directly under the light-emitting unit; thus, the display device can be downsized as compared with the case where the driver circuit is provided around a display region.

Components such as a transistor that can be employed in the display device will be described below.

[Transistor]

The transistors each include a conductive layer functioning as a gate electrode, a semiconductor layer, a conductive layer functioning as a source electrode, a conductive layer functioning as a drain electrode, and an insulating layer functioning as a gate insulating layer.

Note that there is no particular limitation on the structure of the transistor included in the display device according to one embodiment of the present invention. For example, a planar transistor, a staggered transistor, or an inverted staggered transistor may be used. In addition, a top-gate or bottom-gate transistor structure may be employed. Alternatively, gate electrodes may be provided above and below a channel.

There is no particular limitation on the crystallinity of a semiconductor material used for the transistors, and any of an amorphous semiconductor and a crystalline semiconductor (a microcrystalline semiconductor, a polycrystalline semiconductor, a single-crystal semiconductor, or a semiconductor partly including crystal regions) may be used. It is preferable that a crystalline semiconductor be used because deterioration of the transistor characteristics can be inhibited.

In particular, a transistor that uses a metal oxide film for a semiconductor layer where a channel is formed (an OS transistor) will be described below.

As a semiconductor material used for the transistors, a metal oxide whose energy gap is greater than or equal to 2 eV, preferably greater than or equal to 2.5 eV, further preferably greater than or equal to 3 eV can be used. A typical example is a metal oxide containing indium, and a CAC-OS described later can be used, for example.

A transistor in which a metal oxide having a wider band gap and a lower carrier density than silicon is used has low off-state current; thus, charge accumulated in a capacitor that is connected in series with the transistor can be retained for a long period.

The semiconductor layer can be, for example, a film represented by an In-M-Zn-based oxide that contains indium, zinc, and M (M is a metal such as aluminum, titanium, gallium, germanium, yttrium, zirconium, lanthanum, cerium, tin, neodymium, or hafnium).

In the case where the metal oxide contained in the semiconductor layer is an In-M-Zn-based oxide, it is preferable that the atomic ratio of metal elements in a sputtering target used for depositing the In-M-Zn-based oxide satisfy In≥M and Zn≥M. The atomic ratio of metal elements in such a sputtering target is preferably, for example, In:M:Zn=1:1: 1, In:M:Zn=1:1:1.2, In:M:Zn=3:1:2, In:M:Zn=4:2:3, In:M: Zn=4:2:4.1, In:M:Zn=5:1:6, In:M:Zn=5:1:7, In:M:Zn=5:1: 8, or the like. Note that the atomic ratio in the deposited semiconductor layer varies from the atomic ratio of metal elements of the sputtering target in a range of ±40%.

[Conductive Layer]

Examples of materials that can be used for conductive layers of a variety of wirings and electrodes and the like included in the display device in addition to a gate, a source, and a drain of a transistor include metals such as aluminum, titanium, chromium, nickel, copper, yttrium, zirconium, molybdenum, silver, tantalum, and tungsten and an alloy containing such a metal as its main component. Alternatively, a single layer or a stacked-layer structure including a film containing these materials can be used. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which an aluminum film or a copper film is stacked over a titanium film or a titanium nitride film and a titanium film or a titanium nitride film is formed thereover, a three-layer structure in which an aluminum film or a copper film is stacked over a molybdenum film or a molybdenum nitride film and a molybdenum film or a molybdenum nitride film is formed thereover, and the like can be given. Note that an oxide such as indium oxide, tin oxide, or zinc oxide may be used. In addition, copper containing manganese is preferably used because controllability of a shape by etching is increased.

[Insulating Layer]

Examples of an insulating material that can be used for each insulating layer include, in addition to a resin such as acrylic resin or an epoxy resin and a resin having a siloxane bond, such as silicone, an inorganic insulating material such as silicon oxide, silicon oxynitride, silicon nitride oxide, silicon nitride, or aluminum oxide.

In addition, the light-emitting element is preferably provided between a pair of insulating films (barrier insulating films) with low water permeability. In that case, impurities such as water can be inhibited from entering the light-emitting element, and a decrease in the reliability of the device can be inhibited.

Examples of the insulating film with low water permeability include a film containing nitrogen and silicon, such as a silicon nitride film and a silicon nitride oxide film, and a film containing nitrogen and aluminum, such as an aluminum nitride film. Alternatively, a silicon oxide film, a silicon oxynitride film, an aluminum oxide film, or the like may be used.

For example, the moisture vapor transmission rate of the insulating film with low water permeability is lower than or equal to $1 \times 10^{-5}$ [g/(m$^2$·day)], preferably lower than or equal to $1 \times 10^{-6}$ [g/(m$^2$·day)], further preferably lower than or equal to $1 \times 10^{-17}$ [g/(m$^2$·day)], still further preferably lower than or equal to $1 \times 10^{-8}$ [g/(m$^2$·day)].

At least part of this embodiment can be implemented in combination with the other embodiments described in this specification as appropriate.

Embodiment 4

In this embodiment, a metal oxide (also referred to as an oxide semiconductor) that can be used in the OS transistor described in the above embodiment is described.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

The metal oxide can be formed by a sputtering method, a chemical vapor deposition (CVD) method such as a metal organic chemical vapor deposition (MOCVD) method, an atomic layer deposition (ALD) method, or the like.

<Classification of Crystal Structure>

Amorphous (including completely amorphous), CAAC (c-axis-aligned crystalline), nc (nanocrystalline), CAC (cloud-aligned composite), single-crystal, and polycrystalline (poly crystal) structures can be given as examples of a crystal structure of an oxide semiconductor.

Note that a crystal structure of a film or a substrate can be evaluated with an X-ray diffraction (XRD) spectrum. For example, evaluation is possible using an XRD spectrum which is obtained by GIXD (Grazing-Incidence XRD) measurement. Note that a GIXD method is also referred to as a thin film method or a Seemann-Bohlin method.

For example, the XRD spectrum of the quartz glass substrate shows a peak with a substantially bilaterally symmetrical shape. On the other hand, the peak of the XRD spectrum of the IGZO film having a crystal structure has a bilaterally asymmetrical shape. The asymmetrical peak of the XRD spectrum clearly shows the existence of crystal in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction (NBED) method (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the IGZO film deposited at room temperature. Thus, it is suggested that the IGZO film deposited at room temperature is in an intermediate state, which is neither a crystal state nor an amorphous state, and it cannot be concluded that the IGZO film is in an amorphous state.

<<Structure of Oxide Semiconductor>>

Oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM (Transmission Electron Microscope) image, for example.

When the CAAC-OS film is subjected to structural analysis by Out-of-plane XRD measurement with an XRD apparatus using $\theta/2\theta$ scanning, for example, a peak indicating c-axis alignment is detected at $2\theta$ of 31° or around 31°. Note that the position of the peak indicating c-axis alignment (the value of 20) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear crystal grain boundary is observed is what is called polycrystal. It is highly probable that the crystal grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by Out-of-plane XRD measurement with an XRD apparatus using $\theta/2\theta$ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in a nanobeam electron diffraction pattern of the nc-OS film obtained using an electron beam with a probe diameter nearly equal to or smaller than the diameter of a nanocrystal (e.g., larger than or equal to 1 nm and smaller than or equal to 30 nm).

[A-Like OS]

The a-like OS is an oxide semiconductor having a structure between those of the nc-OS and the amorphous oxide semiconductor. The a-like OS contains a void or a low-density region. That is, the a-like OS has lower crystallinity than the nc-OS and the CAAC-OS. Moreover, the a-like OS has higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. For example, the first region has higher [In] and lower [Ga] than the second region. Moreover, the second region has higher [Ga] and lower [In] than the first region.

Specifically, the first region contains indium oxide, indium zinc oxide, or the like as its main component. The second region contains gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly present to form a mosaic pattern. Thus, it is suggested that the CAC-OS has a structure in which metal elements are unevenly distributed.

The CAC-OS can be formed by a sputtering method under a condition where a substrate is not heated, for example. Moreover, in the case of forming the CAC-OS by a sputtering method, any one or more selected from an inert gas (typically, argon), an oxygen gas, and a nitrogen gas are used as a deposition gas. The ratio of the flow rate of an oxygen gas to the total flow rate of the deposition gas at the time of deposition is preferably as low as possible, and for example, the ratio of the flow rate of an oxygen gas to the total flow rate of the deposition gas at the time of deposition is preferably higher than or equal to 0% and lower than 30%, further preferably higher than or equal to 0% and lower than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has a higher conductivity than the second region. In other words, when carriers flow through the first region, the conductivity of a metal oxide is exhibited. Accordingly, when the first regions are distributed in a metal oxide like a cloud, high field-effect mobility ($\mu$) can be achieved.

The second region has a higher insulating property than the first region. In other words, when the second regions are distributed in a metal oxide, leakage current can be inhibited.

Thus, in the case where a CAC-OS is used for a transistor, by the complementary action of the conductivity due to the first region and the insulating property due to the second region, the CAC-OS can have a switching function (On/Off function). That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility ($\mu$) and excellent switching operation can be achieved.

A transistor using the CAC-OS has high reliability. Thus, the CAC-OS is most suitable for a variety of semiconductor devices such as display devices.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor having a low carrier concentration is preferably used in a transistor. For example, the carrier concentration of an oxide semiconductor is lower than or equal to $1 \times 10^{17}$ cm$^{-3}$, preferably lower than or equal to $1 \times 10^{15}$ cm$^{-3}$, further preferably lower than or equal to $1 \times 10^{13}$ cm$^{-3}$, still further preferably lower than or equal to $1 \times 10^{11}$ cm$^{-3}$, yet further preferably lower than $1 \times 10^{10}$ cm$^{-3}$, and higher than or equal to $1 \times 10^{-9}$ cm$^{-3}$. In order to reduce the carrier concentration in an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2 \times 10^{18}$ atoms/$cm^3$, preferably lower than or equal to $2 \times 10^{17}$ atoms/$cm^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is set lower than or equal to $1 \times 10^{18}$ atoms/$cm^3$, preferably lower than or equal to $2 \times 10^{16}$ atoms/$cm^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, trap states are sometimes formed. This might make the electrical characteristics of the transistor unstable. Therefore, the concentration of nitrogen in the oxide semiconductor, which is obtained by SIMS, is set lower than $5 \times 10^{19}$ atoms/$cm^3$, preferably lower than or equal to $5 \times 10^{18}$ atoms/$cm^3$, further preferably lower than or equal to $1 \times 10^{18}$ atoms/$cm^3$, still further preferably lower than or equal to $5 \times 10^{17}$ atoms/$cm^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1 \times 10^{20}$ atoms/$cm^3$, preferably lower than $1 \times 10^{19}$ atoms/$cm^3$, further preferably lower than $5 \times 10^{18}$ atoms/$cm^3$, still further preferably lower than $1 \times 10^{18}$ atoms/$cm^3$.

When an oxide semiconductor with sufficiently reduced impurities is used for the channel formation region of the transistor, stable electrical characteristics can be given.

This embodiment can be combined with the other embodiments as appropriate.

Embodiment 5

In this embodiment, electronic devices of one embodiment of the present invention are described with reference to FIG. 21 to FIG. 23.

An electronic device of this embodiment is provided with the display device of one embodiment of the present invention in a display portion. The display device of one embodiment of the present invention can be easily increased in resolution and definition. Thus, the display device of one embodiment of the present invention can be used for a display portion of a variety of electronic devices.

Examples of electronic devices include a digital camera, a digital video camera, a digital photo frame, a mobile phone, a portable game console, a portable information terminal, and an audio reproducing device in addition to electronic devices with a relatively large screen, such as a television device, a desktop or laptop personal computer, a monitor of a computer or the like, digital signage, and a large game machine like a pachinko machine.

In particular, a display device of one embodiment of the present invention can have a high resolution, and thus can be favorably used for an electronic device having a relatively small display portion. Examples of such an electronic device include a watch-type or a bracelet-type information terminal device (wearable device), and a wearable device worn on a head, such as a device for VR such as a head-mounted display, a glasses-type device for AR, and a device for MR.

The definition of the display device of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320). In particular, the definition is preferably 4K, 8K, or higher. Furthermore, the pixel density (resolution) of the display device of one embodiment of the present invention is preferably higher than or equal to 100 ppi, higher than or equal to 300 ppi, further preferably higher than or equal to 500 ppi, still further preferably higher than or equal to 1000 ppi, still further preferably higher than or equal to 2000 ppi, still further preferably higher than or equal to 3000 ppi, still further preferably higher than or equal to 5000 ppi, and yet further preferably higher than or equal to 7000 ppi. With the use of such a display device with high definition and high resolution, the electronic device can have stronger realistic sensation, sense of depth, and the like in personal use such as portable use and home use. There is no particular limitation on the screen ratio (aspect ratio) of the display device of one embodiment of the present invention. For example, the display device is compatible with a variety of screen ratios such as 1:1 (a square), 4:3, 16:9, and 16:10.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 21A:
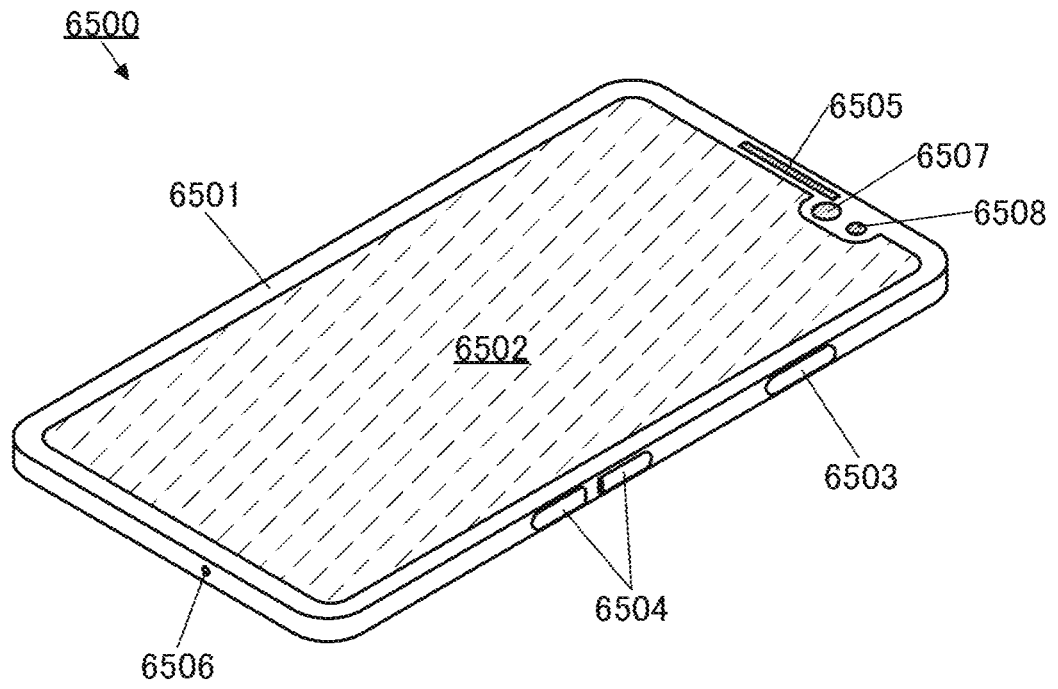
FIG. 21A and FIG. 21B are diagrams illustrating an example of an electronic device.

An electronic device 6500 illustrated in FIG. 21A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

Figure 21B:
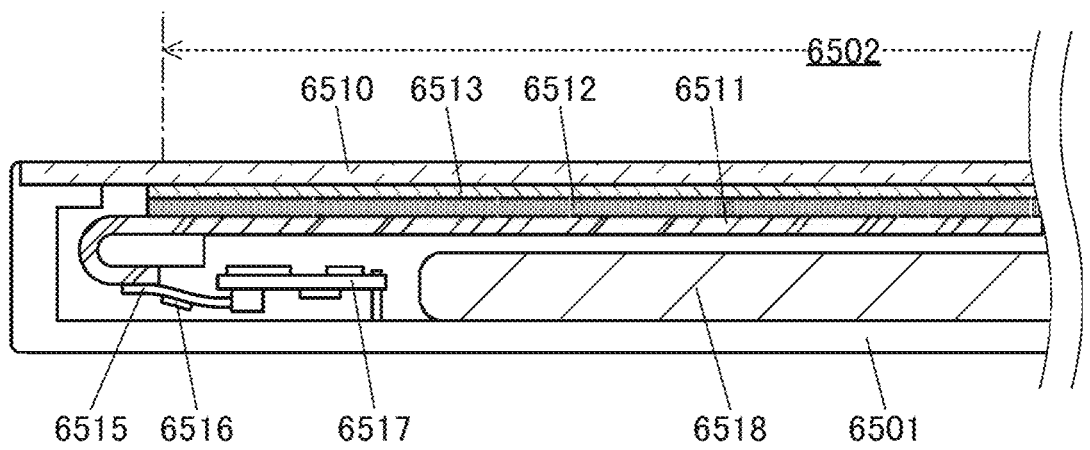

FIG. 21B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted while the thickness of the electronic device is reduced. Moreover, part of the display panel 6511 is folded back so that a connection portion with the FPC 6515 is provided on the back side of the pixel portion, whereby an electronic device with a narrow bezel can be achieved.

FIG. 22A illustrates an example of a television device. In a television device 7100, a display portion 7000 is incorporated in a housing 7101. Here, the housing 7101 is supported by a stand 7103.

The display device of one embodiment of the present invention can be used for the display portion 7000.

Operation of the television device 7100 illustrated in FIG. 22A can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

FIG. 22B illustrates an example of a laptop personal computer. The laptop personal computer 7200 includes a housing 7211, a keyboard 7212, a pointing device 7213, an external connection port 7214, and the like. In the housing 7211, the display portion 7000 is incorporated.

The display device of one embodiment of the present invention can be used for the display portion 7000.

FIG. 22C and FIG. 22D illustrate examples of digital signage.

Digital signage 7300 illustrated in FIG. 22C includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 22D is digital signage 7400 attached to a cylindrical pillar 7401. The digital signage 7400 includes the display portion 7000 provided along a curved surface of the pillar 7401.

The display device of one embodiment of the present invention can be used for the display portion 7000 in FIG. 22C and FIG. 22D.

A larger area of the display portion 7000 can increase the amount of data that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 22C and FIG. 22D, it is preferable that the digital signage 7300 or the digital signage 7400 can work with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Electronic devices illustrated in FIG. 23A to FIG. 23F each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 23A to FIG. 23F have a variety of functions. For example, the electronic devices can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may each include a plurality of display portions. The electronic devices may each be provided with a camera or the like and have a function of taking a still image or a moving image, a function of storing the taken image in a storage medium (an external storage medium or a storage medium incorporated in the camera), a function of displaying the taken image on the display portion, or the like.

The electronic devices illustrated in FIG. 23A to FIG. 23F are described in detail below.

Figure 23A:
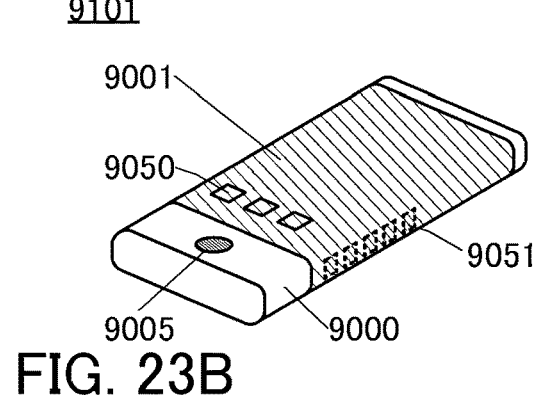
FIG. 23A to FIG. 23F are diagrams illustrating examples of electronic devices.

FIG. 23A is a perspective view illustrating a portable information terminal 9101. For example, the portable information terminal 9101 can be used as a smartphone. Note that the portable information terminal 9101 may include the speaker 9003, the connection terminal 9006, the sensor 9007, or the like. The portable information terminal 9101 can display characters and image information on its plurality of surfaces. FIG. 23A illustrates an example in which three icons 9050 are displayed. Furthermore, information 9051 indicated by dashed rectangles can be displayed on another surface of the display portion 9001. Examples of the information 9051 include notification of reception of an e-mail, an SNS, or an incoming call, the title and sender of an e-mail, an SNS, or the like, the date, the time, remaining battery, and the radio field intensity. Alternatively, the icon 9050 or the like may be displayed at the position where the information 9051 is displayed.

Figure 23B:
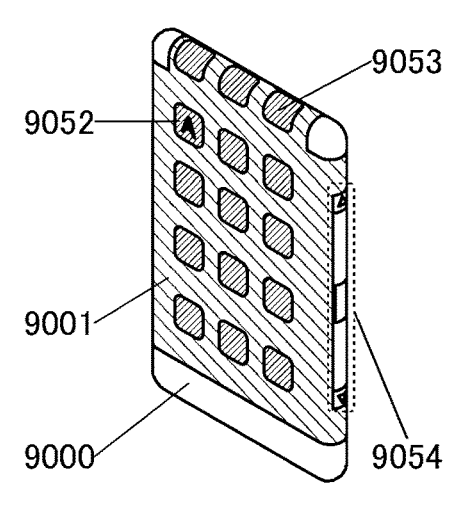

FIG. 23B is a perspective view illustrating a portable information terminal 9102. The portable information terminal 9102 has a function of displaying information on three or more surfaces of the display portion 9001. Shown here is an example in which information 9052, information 9053, and information 9054 are displayed on different surfaces. For example, a user of the portable information terminal 9102 can check the information 9053 displayed such that it can be seen from above the portable information terminal 9102, with the portable information terminal 9102 put in a breast pocket of his/her clothes. The user can see the display without taking out the portable information terminal 9102 from the pocket and decide whether to answer the call, for example.

Figure 23C:
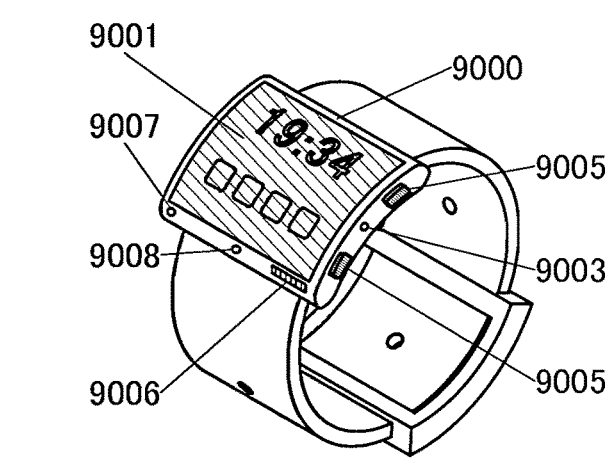

FIG. 23C is a perspective view illustrating a watch-type portable information terminal 9200. For example, the portable information terminal 9200 can be used as a Smartwatch (registered trademark). The display surface of the display portion 9001 is curved, and display can be performed along the curved display surface. Furthermore, intercommunication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 23D:
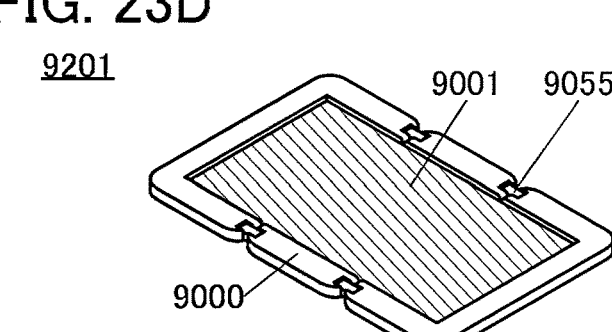
Figure 23E:
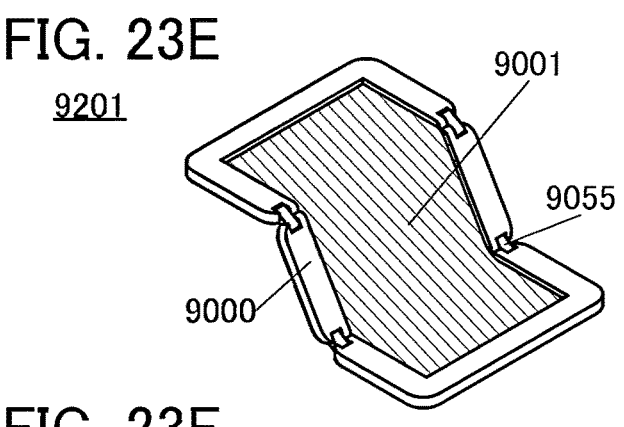
Figure 23F:
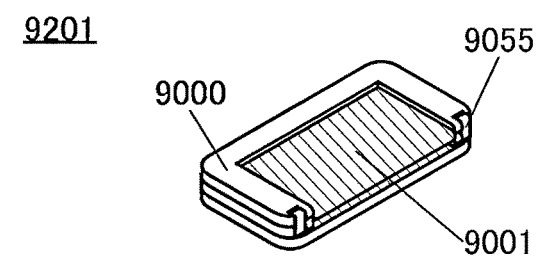

FIG. 23D to FIG. 23F are perspective views illustrating a foldable portable information terminal 9201. FIG. 23D is a perspective view of an opened state of the portable information terminal 9201, FIG. 23F is a perspective view of a folded state thereof, and FIG. 23E is a perspective view of a state in the middle of change from one of FIG. 23D and FIG. 23F to the other. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. The display portion 9001 can be folded with a radius of curvature of greater than or equal to 0.1 mm and less than or equal to 150 mm, for example.

This embodiment can be combined with the other embodiments as appropriate.

REFERENCE NUMERALS

100: display device, 100A: display device, 100B: display device, 101: layer, 110: pixel, 110a: subpixel, 110b: subpixel, 110c: subpixel, 110d: subpixel, 110d1: subpixel, 110d2: subpixel, 110d3: subpixel, 111: pixel electrode, 111a: pixel electrode, 111b: pixel electrode, 111c: pixel electrode, 111d: pixel electrode, 112: conductive layer, 112a: conductive layer, 112b: conductive layer, 112c: conductive layer, 113: layer, 114: layer, 115: common electrode, 118: sacrificial layer, 118A: sacrificial layer, 119: sacrificial layer, 119A: sacrificial layer, 120: substrate, 121: insulator, 122: resin layer, 123: conductive layer, 123a: conductive layer, 123b: conductive layer, 124: insulator, 124a: insulator, 124A: insulating film, 124b: insulator, 124B: insulating film, 125: coloring layer, 125a: coloring layer, 125b: coloring layer, 125c: coloring layer, 126: insulating layer, 128a: pixel, 128b: pixel, 130: light-emitting device, 130a: light-emitting device, 130b: light-emitting device, 130c: light-emitting device, 130d: light-emitting device, 131: protective layer, 133: space, 140: connection portion, 142: bonding layer, 148: light-blocking layer, 151: substrate, 152: substrate, 162: display portion, 164: circuit, 165: wiring, 166: conductive layer, 172: FPC, 173: IC, 181a: hole-injection layer, 181A: hole-injection layer, 182a: hole-transport layer, 182A: hole-transport layer, 182b: hole-transport layer, 182B: hole-transport layer, 183a: light-emitting layer, 183A: light-emitting layer, 183b: light-emitting layer, 183B: light-emitting layer, 184a: electron-transport layer, 184A: electron-transport layer, 184b: electron-transport layer, 184B: electron-transport layer, 190: resist mask, 191: intermediate layer, 191A: intermediate layer, 192: light-emitting unit, 194: light-emitting unit, 201: transistor, 204: connection portion, 205: transistor, 209: transistor, 210: transistor, 211: insulating layer, 213: insulating layer, 214: insulating layer, 215: insulating layer, 218: insulating layer, 221: conductive layer, 222a: conductive layer, 222b: conductive layer, 223: conductive layer, 225: insulating layer, 228: region, 231: semiconductor layer, 231i: channel formation region, 231n: low-resistance region, 242: connection layer, 321: insulating layer, 331: plug, 362: insulating layer, 363: insulating layer, 364: bonding layer, 400: display device, 400A: display device, 400B: display device, 400C: display device, 401: substrate, 402: substrate, 410: transistor, 411: conductive layer, 412: low-resistance region, 413: insulating layer, 414: insulating layer, 415: element isolation layer, 420: transistor, 421: semiconductor layer, 423: insulating layer, 424: conductive layer, 425: conductive layer, 426: insulating layer, 427: conductive layer, 428: insulating layer, 429: insulating layer, 432: insulating layer, 440: capacitor, 441: conductive layer, 442: conductive layer, 443: insulating layer, 451: conductive layer, 452: conductive layer, 461: insulating layer, 461a: insulating layer, 461b: insulating layer, 462: insulating layer, 463: insulating layer, 465: insulating layer, 471: plug, 471a: conductive layer, 471b: conductive layer, 474: plug, 480: display module, 481: display portion, 482: circuit portion, 483: pixel circuit portion, 483a: pixel circuit, 484: pixel portion, 484a: pixel, 485: terminal portion, 486: wiring portion, 490: FPC, 500: display device, 501: electrode, 502: electrode, 512Q_1: light-emitting unit, 512Q_2: light-emitting unit, 512Q_3: light-emitting unit, 521: layer, 522: layer, 523Q_1: light-emitting layer, 523Q_2: light-emitting layer, 523Q_3: light-emitting layer, 524: layer, 525: layer, 531: intermediate layer, 540: protective layer, 545B: coloring layer, 545G: coloring layer, 545R: coloring layer, 550W: light-emitting device, 6500: electronic device, 6501: housing, 6502: display portion, 6503: power button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9200: portable information terminal, 9201: portable information terminal

The invention claimed is:

1. A display device comprising:
a first light-emitting device, a second light-emitting device, a first coloring layer, a second coloring layer, a first insulator, a second insulator, and a third insulator,
wherein the first coloring layer is positioned to overlap with the first light-emitting device,
wherein the second coloring layer is positioned to overlap with the second light-emitting device,
wherein the first light-emitting device and the second light-emitting device are configured to emit white light,
wherein the first coloring layer and the second coloring layer are configured to transmit visible light of different colors,
wherein the first light-emitting device comprises a first conductive layer and a first light-emitting layer over the first conductive layer,
wherein the second light-emitting device comprises a second conductive layer and a second light-emitting layer over the second conductive layer,
wherein the first insulator is in contact with at least part of a side surface of the first light-emitting device,
wherein the second insulator is in contact with at least part of a side surface of the second light-emitting device,
wherein the first insulator and the second insulator are positioned over the third insulator,
wherein the first insulator and the second insulator each comprise a first layer and a second layer over the first layer, and
wherein in the first insulator,
a side surface of the first layer is in contact with at least part of the side surface of the first light-emitting device,
a bottom surface of the first layer is in contact with at least part of the third insulator, and
a side surface and a bottom surface of the second layer are in contact with at least part of the first layer, and wherein in the second insulator,
a side surface of the first layer is in contact with at least part of the side surface of the second light-emitting device,
a bottom surface of the first layer is in contact with at least part of the third insulator, and
a side surface and a bottom surface of the second layer are in contact with at least part of the first layer,
wherein the third insulator is positioned to cover an end portion of the first conductive layer and an end portion of the second conductive layer.

2. The display device according to claim 1,
wherein the first light-emitting layer comprises the same material as the second light-emitting layer.

3. The display device according to claim 1,
wherein the first light-emitting device comprises a first light-emitting unit comprising the first light-emitting layer, a first charge-generation layer over the first light-emitting unit, and a second light-emitting unit over the first charge-generation layer,
wherein the second light-emitting unit comprises a third light-emitting layer,
wherein the second light-emitting device comprises a third light-emitting unit comprising the second light-emitting layer, a second charge-generation layer over the third light-emitting unit, and a fourth light-emitting unit over the second charge-generation layer, and
wherein the fourth light-emitting unit comprises a fourth light-emitting layer.

4. The display device according to claim 3,
wherein the first light-emitting unit comprises the same material as the third light-emitting unit,
wherein the first charge-generation layer comprises the same material as the second charge-generation layer, and
wherein the second light-emitting unit comprises the same material as the fourth light-emitting unit.

5. The display device according to claim 3,
wherein the first light-emitting unit comprises a first hole-injection layer, a first hole-transport layer, and a first electron-transport layer,
wherein the second light-emitting unit comprises a second hole-transport layer and a second electron-transport layer,
wherein the third light-emitting unit comprises a second hole-injection layer, a third hole-transport layer, and a third electron-transport layer,
wherein the fourth light-emitting unit comprises a fourth hole-transport layer and a fourth electron-transport layer,
wherein the first insulator is in contact with a side surface of the first hole-injection layer, a side surface of the first hole-transport layer, a side surface of the first light-emitting layer, a side surface of the first electron-transport layer, a side surface of the first charge-generation layer, a side surface of the second hole-transport layer, a side surface of the third light-emitting layer, and a side surface of the second electron-transport layer, and
wherein the second insulator is in contact with a side surface of the second hole-injection layer, a side surface of the third hole-transport layer, a side surface of the second light-emitting layer, a side surface of the third electron-transport layer, a side surface of the second charge-generation layer, a side surface of the fourth hole-transport layer, the side surface of the second light-emitting layer, and a side surface of the fourth electron-transport layer.

6. The display device according to claim 1, wherein the first layer comprises aluminum oxide, and wherein the second layer comprises silicon nitride.

7. The display device according to claim 1, wherein the side surface of the first light-emitting layer 5 and the side surface of the second light-emitting layer face each other, and wherein a distance between the side surface of the first light-emitting layer and the side surface of the second light-emitting layer is less than or equal to 8 μm. 10

8. A display module comprising:

the display device according to claim 1; and at least one of a connector or an integrated circuit.

9. An electronic device comprising:

the display module according to claim 8; and 15 at least one of a housing, a battery, a camera, a speaker, or a microphone.

10. The display device according to claim 1, wherein the first conductive layer and the second conductive layer are each a pixel electrode. 20

11. The display device according to claim 3, wherein the first light-emitting device comprises a common layer over the second light-emitting unit and a common electrode over the common layer, and wherein the second light-emitting device comprises the 25 common layer over the fourth light-emitting unit and the common electrode over the common layer.

\* \* \* \* \*